US009970704B2

(12) United States Patent
Joo et al.

(10) Patent No.: US 9,970,704 B2
(45) Date of Patent: May 15, 2018

(54) STRUCTURE OF A REFRIGERATOR BODY

(71) Applicant: Samsung Electronics Co., Ltd., Suwon-Si, Gyeonggi-Do (KR)

(72) Inventors: Yong Woo Joo, Busan (KR); Byoung-jae Cho, Gwangju (KR); Hyun-Cheol Kim, Gwangju (KR); Bong-Keun Lim, Gwangju (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 110 days.

(21) Appl. No.: 14/590,454

(22) Filed: Jan. 6, 2015

(65) Prior Publication Data

US 2015/0192355 A1      Jul. 9, 2015

(30) Foreign Application Priority Data

Jan. 7, 2014   (KR) .................. 10-2014-0002010
Jul. 16, 2014  (KR) .................. 10-2014-0089539

(51) Int. Cl.
*H05K 5/00*       (2006.01)
*F25D 29/00*      (2006.01)
(Continued)

(52) U.S. Cl.
CPC .......... *F25D 29/005* (2013.01); *F25D 23/065* (2013.01); *F25D 23/067* (2013.01);
(Continued)

(58) Field of Classification Search
CPC .. F25D 29/005; F25D 23/065; F25D 2400/40; F25D 23/067; H01R 13/506;
(Continued)

(56) References Cited

U.S. PATENT DOCUMENTS

| | | | | | |
|---|---|---|---|---|---|
| 2,669,603 | A | * | 2/1954 | Prache ................... | H01B 11/14 174/116 |
| 5,691,878 | A | * | 11/1997 | Ahn ...................... | H05K 5/0013 174/DIG. 2 |
| 8,162,421 | B2 | * | 4/2012 | Lim .................... | E05D 11/0054 312/401 |
| 2001/0025497 | A1 | * | 10/2001 | Roh ........................ | F25D 23/00 62/125 |
| 2008/0113529 | A1 | * | 5/2008 | Kim ...................... | F25D 29/005 439/76.1 |

FOREIGN PATENT DOCUMENTS

| JP | 5-87443 | | 4/1993 |
|---|---|---|---|
| JP | 05-087443 | * | 6/1993 |

(Continued)

OTHER PUBLICATIONS

Extended European Search Report dated May 20, 2015 in corresponding European Patent Application No. 15150186.3.
(Continued)

*Primary Examiner* — James Wu
(74) *Attorney, Agent, or Firm* — Staas & Halsey LLP

(57) ABSTRACT

Provided is a refrigerator which is capable of reducing a quantity of deformation of a body by improving rigidity of the body that is lowered due to a thickness of insulation reduced to increase an internal capacity of the body, using a reinforcement structure, and in which an electric apparatus box in which electric apparatus components for controlling an operation of the refrigerator are accommodated, is disposed in a hinge cover disposed in the front of an upper portion of a body so that spatial utility can be improved and when a fire breaks out in components inside the electric apparatus box, a reinforcement plate formed of a steel material is disposed in the electric apparatus box so as to prevent the fire from being spread toward an outside of the electric apparatus box.

13 Claims, 49 Drawing Sheets

(51) Int. Cl.
  *F25D 23/06* (2006.01)
  *H01R 13/74* (2006.01)
  *H01R 9/16* (2006.01)
  *H05K 5/02* (2006.01)
  *H01R 13/514* (2006.01)

(52) U.S. Cl.
  CPC ............ *F25D 2400/40* (2013.01); *H01R 9/16* (2013.01); *H01R 13/514* (2013.01); *H01R 13/74* (2013.01); *H05K 5/0247* (2013.01)

(58) Field of Classification Search
  CPC ........ H01R 13/514; H01R 13/74; H01R 9/16; H05K 5/0247
  USPC ............ 361/752, 801, 807; 62/259.1, 259.2; 439/76.1; 312/401
  See application file for complete search history.

(56) References Cited

FOREIGN PATENT DOCUMENTS

| | | |
|---|---|---|
| JP | 2004-125210 | 4/2004 |
| JP | 2009-24921 | 2/2009 |
| KR | 10-0351819 | 8/2002 |
| KR | 20-0319651 | 6/2003 |
| KR | 200319651 Y1 * | 7/2003 |
| KR | 10-2005-0119468 | 12/2005 |

OTHER PUBLICATIONS

European Communication dated Nov. 7, 2017 in European Patent Application No. 15150186.3.

* cited by examiner

STRUCTURE OF A REFRIGERATOR BODY

CROSS-REFERENCE TO RELATED APPLICATION

This application claims the benefit of Korean Patent Applications No. 10-2014-0002010, filed on Jan. 7, 2014 and No. 10-2014-0089539, filed on Jul. 16, 2014, respectively, in the Korean Intellectual Property Office, the disclosure of which is incorporated herein by reference.

BACKGROUND

1. Field

Various embodiments relate to a refrigerator capable of preventing heat from being infiltrated into a storage compartment by improving disposition of a printed circuit board in an electric apparatus box provided in the front of a body.

2. Description of the Related Art

In general, a refrigerator is a device that keeps food fresh by including a body having an inner case and an outer case, a storage compartment formed by the inner case, and a cold air supplying unit for supplying cold air to the storage compartment.

The storage compartment is maintained at a temperature in a predetermined range required to keep food fresh.

A front side of the storage compartment of the refrigerator is disposed to be open, and the open front side of the storage compartment is closed by a door so that the temperature of the storage compartment can be normally maintained.

An insulating material is foamed between the inner case and the outer case so as to prevent outflow of cold air in the storage compartment.

Since foaming of the insulating material is performed only at a predetermined temperature or higher, heat is generated while the insulating material is foamed. The body has a temperature approximately 20° C. higher than a room temperature in a state in which the insulating material is foamed between the inner case and the outer case.

After the insulating material is foamed between the inner case and the outer case, the temperature of the body is lowered to the room temperature so that the insulating material is solidified and the body thermally contracts.

Since the inner case is mainly formed of a plastic material and the outer case is mainly formed of a steel material and the plastic material has an approximately five times larger quantity of thermal contraction than that of the steel material, when the body thermally contracts, the inner case contracts greatly compared to the outer case and thus, while the temperature of the body is lowered to the room temperature, central parts of both sides of the body are deformed in a convex shape toward an outside of the body. In a state in which the temperature of the body is lowered to the room temperature, the insulating material is solidified in a state in which the central parts of both sides of the body are deformed in the convex shape toward the outside of the body.

When deformation occurs in the inner case and the outer case due to a difference in quantities of thermal contraction of the inner case and the outer case, deformation that occurs in the inner case and the outer case is reduced to a predetermined degree due to the insulating material that contacts the inner case and the outer case. By reducing the thickness of the insulating material foamed between the inner case and the outer case in order to increase an internal capacity of the body having the same exterior size, a quantity of deformation in which the central parts of both sides of the body are deformed in the convex shape toward the outside of the body, is increased by the reduced thickness of the insulating material. Even after the insulating material is foamed, when the refrigerator operates, the temperature of the body is lowered such that the quantity of thermal contraction of the inner case is further increased and a quantity of deformation of the shape is increased.

In addition, when the thickness of the insulating material is reduced, insulation performance may be lowered, and rigidity may be deteriorated such that deformation may occur in the body due to the weight of the body and a load of a material stored in the body.

In order to improve the insulation performance lowered due to the reduced thickness of the insulating material, a vacuum insulating material is disposed between the inner case and the outer case together with the insulating material. The vacuum insulating material may be disposed between the inner case and the outer case together with the insulating material so as to supplement the lowered insulation performance, but deteriorated rigidity cannot be supplemented.

SUMMARY

Therefore, it is an aspect of an embodiment to provide a refrigerator that is capable of reducing a quantity of deformation of a body by improving rigidity of the body that is lowered due to a thickness of insulation reduced to increase an internal capacity of the body, using a reinforcement structure.

It is another aspect of an embodiment to provide a refrigerator in which an electric apparatus box in which electric apparatus components for controlling an operation of the refrigerator are accommodated, is disposed in a hinge cover disposed in the front of an upper portion of a body so that spatial utility can be improved.

It is still another aspect of an embodiment to provide a refrigerator in which, when a fire breaks out in components inside the electric apparatus box, a reinforcement plate formed of a steel material is disposed in the electric apparatus box so as to prevent the fire from being spread toward an outside of the electric apparatus box.

Additional aspects of embodiments will be set forth in part in the description which follows and, in part, will be obvious from the description, or may be learned by practice of the invention.

In accordance with one aspect of an embodiment, there is provided a refrigerator including: a body and an electric apparatus box. The body may include an inner case in which a storage compartment is formed, an outer case that is coupled to an outside of the inner case and constitutes an exterior of the refrigerator, and an insulating material foamed between the inner case and the outer case. The electric apparatus box may be provided in the front of an upper portion of the body. The electric apparatus box may include a base installed while being accommodated in the upper portion of the body, a cover provided to cover an upper portion of the base such that an accommodation space is provided between the base and the cover, a printed circuit board (PCB) provided in the accommodation space and on which a plurality of electronic components are mounted, and a PCB mounting portion coupled to the cover and on whose a lower surface the PCB is mounted.

The PCB, on whose the lower surface the plurality of electronic components are mounted and whose upper surface is mounted on the PCB mounting portion, may be disposed while being spaced apart from the storage compartment in the accommodation space.

The base may include a base portion coupled to the front of the upper portion of the body and an accommodation groove accommodated in an electric apparatus box installation hole provided in the front of the upper portion of the body when the base portion is coupled to the front of the upper portion of the body.

The accommodation groove may be provided in a shape of a rectangular which is recessed downward from the base portion, and the base portion may form edges of the accommodation groove.

The accommodation groove may be recessed downward with respect to an upper surface of the body, so that a height of the accommodation space is greater than an interval between the cover and the upper surface of the body.

A plurality of fixing hooks may be provided at each of a front edge of the base portion and a rear edge of the base portion that form the edges of the accommodation groove, and a wire through hole through which wires connected to the PCB are connected to the inside of the body may be disposed in the rear of both side edges.

The plurality of fixing hooks may include a plurality of first fixing hooks disposed at the front edge of the base portion and a plurality of second fixing hooks disposed at the rear edge of the base portion.

The plurality of first fixing hooks may be inserted into and fixed to an upper reinforcement frame coupled to an upper portion of a front side of the inner case to reinforce the body, and the plurality of second fixing hooks may be inserted into and fixed to a rear edge of the electric apparatus box installation hole.

The first fixing hook and the second fixing hook may be inserted into and fixed to the upper reinforcement frame and the rear edge of the electric apparatus box installation hole, respectively, thereby preventing the base from being moved when the insulating material is foamed between the inner case and the outer case.

The cover may include a hinge cover portion covering an upper portion of an upper hinge coupled to the upper portion of the body such that the door is rotatably coupled to the body.

A connector coupling portion may be disposed at both sides of the PCB mounting portion, and a wire connector to which the wires are fixed may be coupled to the connector coupling portion.

The wires connected to the PCB may be agglomerated and fixed using the wire connector, and the wires passing through the wire through hole may be connected to the inside of the body through a hinge hole of the upper hinge.

A reinforcement plate formed of a steel material may be provided between the cover and the PCB mounting portion.

The reinforcement plate may reduce shock transferred to a plurality of the PCBs accommodated in the accommodation space when the shock is applied to the electric apparatus box.

The reinforcement plate may be provided to prevent fire from being spread toward an outside of the electric apparatus box when the fire breaks out in electronic components inside the electric apparatus box.

In accordance with another aspect of an embodiment, a refrigerator includes a body and an electric apparatus box. The body may include an inner case in which a storage compartment is formed, an outer case that is coupled to an outside of the inner case and constitutes an exterior of the refrigerator, and an insulating material foamed between the inner case and the outer case. The electric apparatus box may be installed at an electric box installation hole provided in the front of an upper portion of the body. The electric apparatus box may include: a base provided in a shape recessed in a downward direction with respect to an upper surface of the body and accommodated in the electric apparatus installation hole; a cover provided to cover an upper portion of the base; a printed circuit board (PCB) provided in the accommodation space and on which a plurality of electronic components are mounted; and a PCB mounting portion coupled to the cover and provided with a lower surface on which an upper surface of the PCB is mounted.

In accordance with another aspect of an embodiment, a refrigerator includes a body and an electric apparatus box. The body may include an inner case in which a storage compartment is formed, an outer case that is coupled to an outside of the inner case and constitutes an exterior of the refrigerator, and an insulating material foamed between the inner case and the outer case. The electric apparatus box may be provided in the front of an upper portion of the body. The electric apparatus box may include: a base installed while being accommodated in the upper portion of the body; a cover provided to cover an upper portion of the base such that an accommodation space is provided between the base and the cover; a printed circuit board (PCB) provided in the accommodation space and on which a plurality of electronic components are mounted; and a PCB mounting portion coupled to the cover and provided with a lower surface on which an upper surface of the PCB is mounted.

In accordance with another aspect of an embodiment, a refrigerator includes a body and an electric apparatus box. The body may include an inner case in which a storage compartment is formed, an outer case that is coupled to an outside of the inner case and constitutes an exterior of the refrigerator, and an insulating material foamed between the inner case and the outer case. The electric apparatus box may be installed at an electric apparatus box installation hole provided in the front of an upper portion of the body. The electric apparatus box may include: a base installed while being accommodated in the upper portion of the body; a cover provided to cover an upper portion of the base such that an accommodation space is provided between the base and the cover; a printed circuit board (PCB) provided in the accommodation space and on which a plurality of electronic components are mounted; a PCB mounting portion coupled to the cover and provided with a lower surface on which an upper surface of the PCB is mounted; and a reinforcement plate formed of a steel material.

BRIEF DESCRIPTION OF THE DRAWINGS

These and/or other aspects of embodiments will become apparent and more readily appreciated from the following description of the embodiments, taken in conjunction with the accompanying drawings of which.

DETAILED DESCRIPTION

Figure 1:
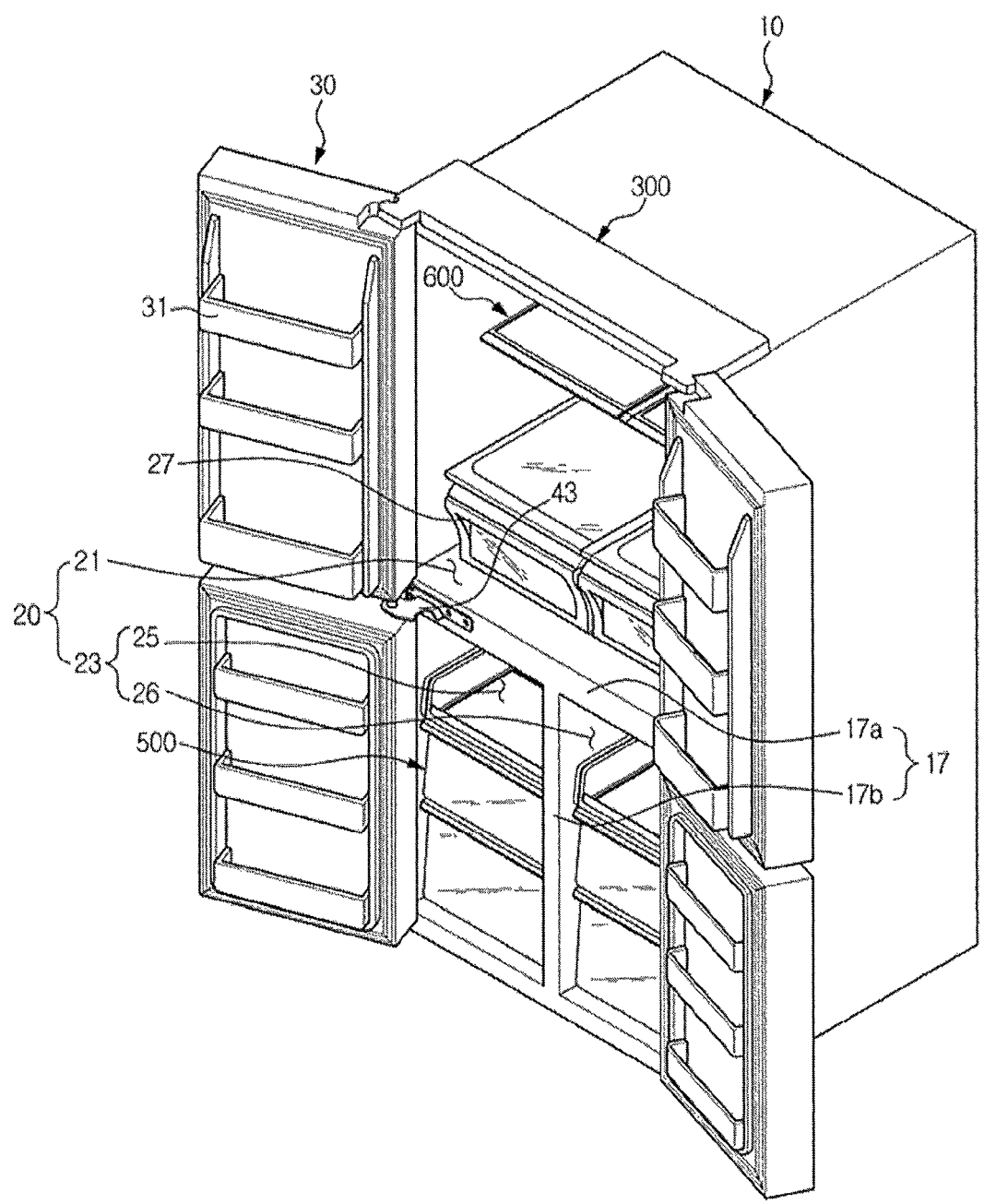
FIG. 1 is a perspective view of a refrigerator according to an embodiment.

Reference will now be made in detail to the embodiments, examples of which are illustrated in the accompanying drawings, wherein like reference numerals refer to like elements throughout.

Hereinafter, various embodiments of the present invention will be described in detail with reference to the attached drawings.

Figure 2:
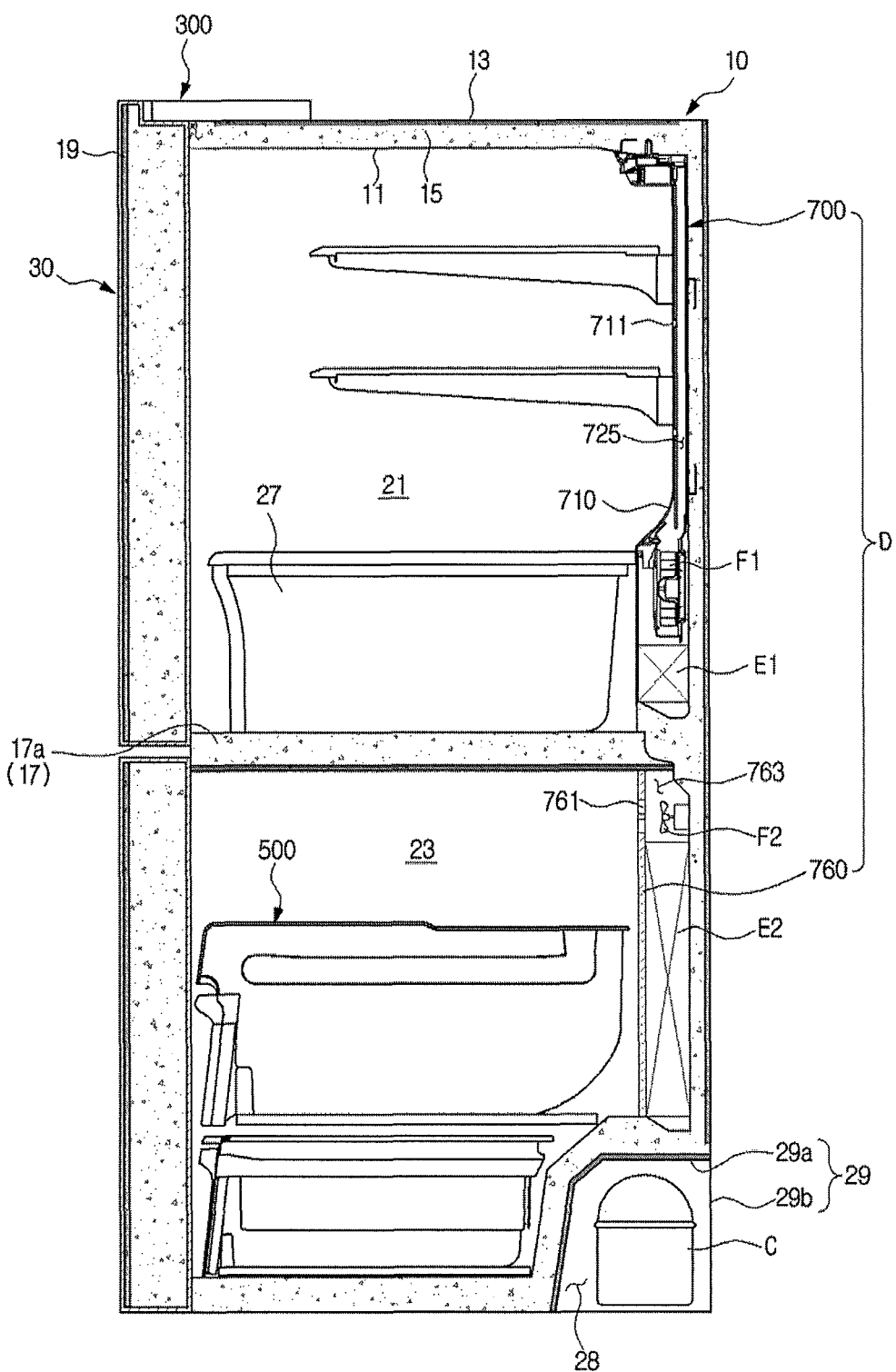
FIG. 2 is a cross-sectional view of a side of the refrigerator according to an embodiment.
Figure 3:
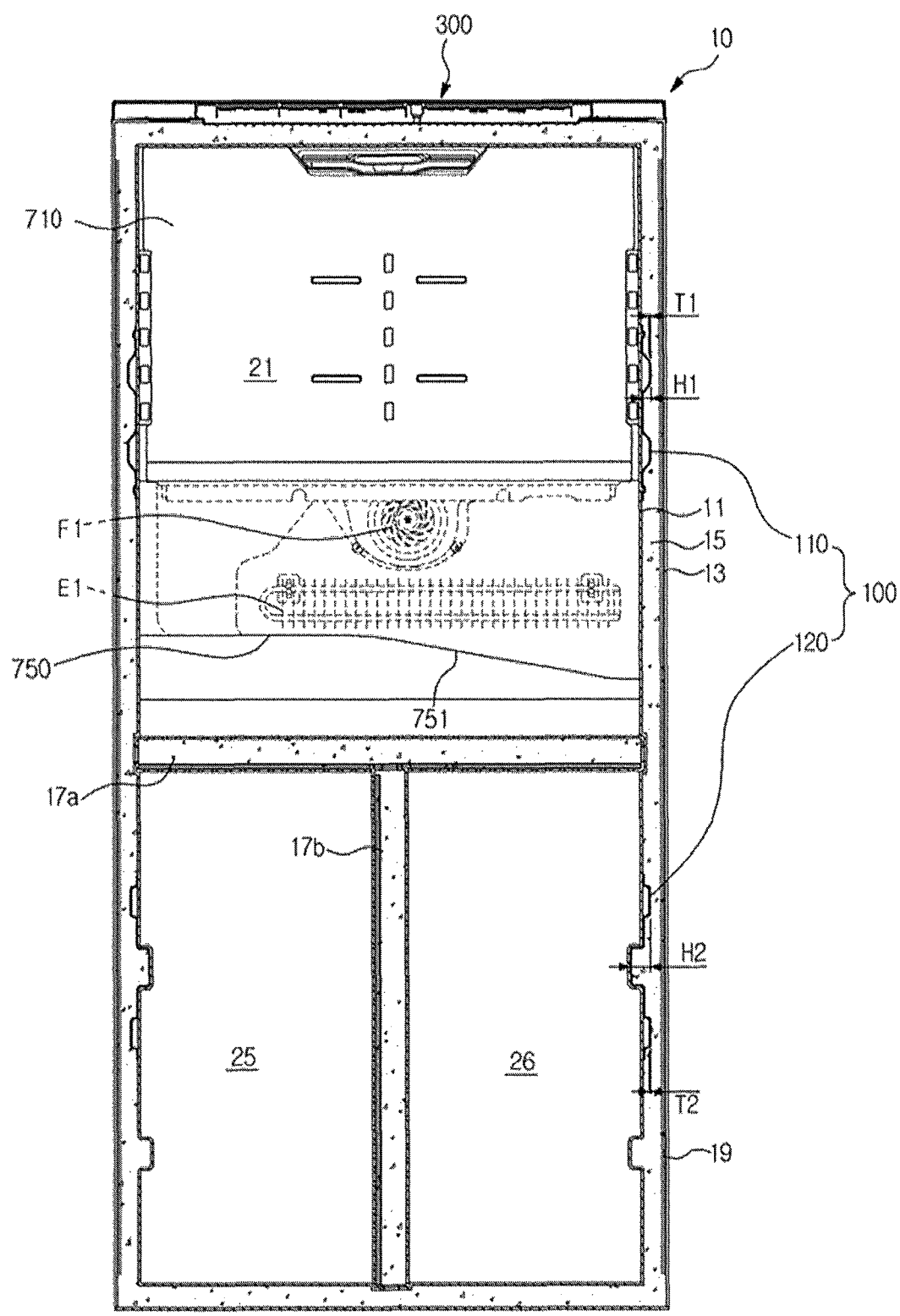
FIG. 3 is a cross-sectional view of a front side of the refrigerator according to an embodiment.

As illustrated in FIGS. 1 through 3, a refrigerator includes a body 10, a plurality of storage compartments 20 configured in the body 10 in such a way that a front side of each of the plurality of storage compartments 20 is open, a door 30 that is pivotally coupled to the body 10 so as to open/close the open front side of each of the storage compartments 20, and a hinge unit 40 that causes the door 30 to be pivotally coupled to the body 10.

The body 10 includes an inner case 11 that constitutes each storage compartment 20, an outer case 13 that constitutes an exterior, and a cold air supplying unit that supplies cold air to the storage compartment 20.

The cold air supplying unit may include a compressor C, a condenser (not shown), an expansion valve (not shown), an evaporator E (shown in the drawings as, for example, a first evaporator E1 and a second evaporator E2), a blower fan F (shown in the drawings as, for example, a first blower fan F1 and a second blower fan F2), and a cold air duct D (shown in the drawings as, for example, a first cold air duct 700 and a second cold air duct 760). An insulating material 15 is foamed between the inner case 11 and the outer case 13 of the body 10 so as to prevent outflow of the cold air of the storage compartment 20.

The compressor C, the condenser (not shown), the expansion valve (not shown), and the evaporator E may be connected to one another using a refrigerant pipe P, and a refrigerant may be guided via the refrigerant pipe P.

A machine compartment 28 in which the compressor C and the condenser (not shown) in which the refrigerant is compressed and the compressed refrigerant is condensed, are installed, is disposed at a lower side of the rear of the body 10.

The evaporator E includes a first evaporator E1 that supplies the cold air to an upper storage compartment 21 that will be described below and a second evaporator E2 that supplies the cold air to a lower storage compartment 23. The cold air generated by the first evaporator E1 may be supplied to the upper storage compartment 21 via a first blower fan F1, and the cold air generated by the second evaporator E2 may be supplied to the lower storage compartment 23 via a second blower fan F2.

The cold air duct D includes a first cold air duct 700 that is disposed at a rear side of the upper storage compartment 21 and forms a first flow path 725 on which the cold air generated by the first evaporator E1 is supplied to the upper storage compartment 21 via the first blower fan F1, and a second cold air duct 760 that is disposed at a rear side of the lower storage compartment 23 and forms a second flow path 763 on which the cold air generated by the second evaporator E2 is supplied to the lower storage compartment 23 via the second blower fan F2.

A first cold air outlet 711 is disposed at the first cold air duct 700 so that the cold air generated by the first evaporator E1 can be supplied to the upper storage compartment 21 via the first cold air outlet 711. A second cold air outlet 761 is disposed at the second cold air duct 760 so that the cold air generated by the second evaporator E2 can be supplied to the lower storage compartment 23 via the second cold air outlet 761.

The storage compartment 20 is partitioned by a partition 17 into a plurality of parts. The partition 17 includes a first partition 17a that partitions off the storage compartment 20 into the upper storage compartment 21 and the lower storage compartment 23 and a second partition 17b that partitions off the lower storage compartment 23 into a left storage compartment 25 and a right storage compartment 26.

The upper storage compartment 21 of the upper storage compartment 21 and the lower storage compartment 23 that are partitioned off by the first partition 17a, may be used as a refrigeration compartment, and the lower storage compartment 23 may be partitioned off by the second partition 17b into the left storage compartment 25 and the right storage compartment 26 so that the left storage compartment 25 can be used as a freezer compartment and the right storage compartment 26 can be used as both the freezer compartment and the refrigeration compartment.

Partitioning of the storage compartment 20 described above is merely one example. Each of the storage compartments 21, 25, and 26 may be used in a different manner from the above-described configuration.

A plurality of shelf units 600 may be disposed in the storage compartment 20 so that the storage compartment 20 can be partitioned off into a plurality of parts. A plurality of storage containers 27 in which food can be stored, may be disposed in the plurality of parts of the storage compartment 20.

The open front side of the storage compartment 20 may be open/closed by the door 30 that is pivotally coupled to the body 10, and a plurality of door guards 31 in which food can be accommodated, may be installed at a rear side of the door 30.

The hinge unit 40 that causes the door 30 to be pivotally coupled to the body 10 may include an upper hinge 41 coupled to an upper portion of the body 10, an intermediate hinge 43 coupled to the first partition 17a, and a lower hinge (not shown) coupled to a lower portion of the body 10.

As illustrated in FIGS. 1 through 3, urethane is mainly used as the insulating material 15 foamed between the inner case 11 and the outer case 13 of the body 10, and foaming of the insulating material 15 is performed only at a predetermined temperature or higher.

Since foaming of the insulating material 15 is performed only at the predetermined temperature or higher, heat is generated while the insulating material 15 is foamed. Thus, in a state in which the insulating material 15 is foamed between the inner case 11 and the outer case 13, the body 10 has a temperature approximately 20° C. higher than a room temperature.

After the insulating material 15 is foamed between the inner case 11 and the outer case 13, the temperature of the body 10 is lowered to the room temperature so that the insulating material 15 is solidified and the body 10 thermally contracts.

Since the inner case 11 is mainly formed of a plastic material, the outer case 13 is mainly formed of a steel material, and the plastic material has an approximately five times larger quantity of thermal contraction than that of the steel material, when the body 10 thermally contracts, the inner case 11 contracts more greatly than the outer case 13. Thus, while the temperature of the body 10 is lowered to the room temperature, central parts of both sides of the body 10 are deformed in a convex shape toward an outside of the body 10, and in a state in which the temperature of the body 10 is lowered to the room temperature, the insulating material 15 is solidified in a state in which the central parts of both sides of the body 10 are deformed in the convex shape toward the outside of the body 10.

Also, in order to increase an internal capacity of the body 10 having the same exterior size, the thickness of the insulating material 15 foamed between the inner case 11 and the outer case 13 need to be reduced. In order to supplement lowered insulation performance caused by the reduced thickness of the insulating material 15, a vacuum insulating material 19 is disposed between the inner case 11 and the outer case 13.

The vacuum insulating material 19 is also disposed in the insulating material 15 foamed between the inner case 11 and the outer case 13 of the body 10 but may also be disposed in the insulating material 15 foamed in the door 30, in the insulating material 15 foamed in the partition 17, or in the insulating material 15 foamed between a machine compartment cover 29 and the inner case 11.

When deformation occurs in the inner case 11 and the outer case 13 due to a difference in quantities of thermal contraction of the inner case 11 and the outer case 13, the deformation that occurs in the inner case 11 and the outer case 13 is reduced by the insulating material 15 that contacts the inner case 11 and the outer case 13 to a predetermined degree. When the thickness of the insulating material 15 is reduced, a quantity of deformation in which the central parts of both sides of the body 10 are deformed in the convex shape toward the outside of the body 10, is increased by the reduced thickness of the insulating material 15. Even after the insulating material 15 is foamed, when the refrigerator operates, the temperature of the body 10 is lowered such that the quantity of thermal contraction of the inner case 11 may be further increased and a quantity of deformation of the shape may be increased.

Figure 4:
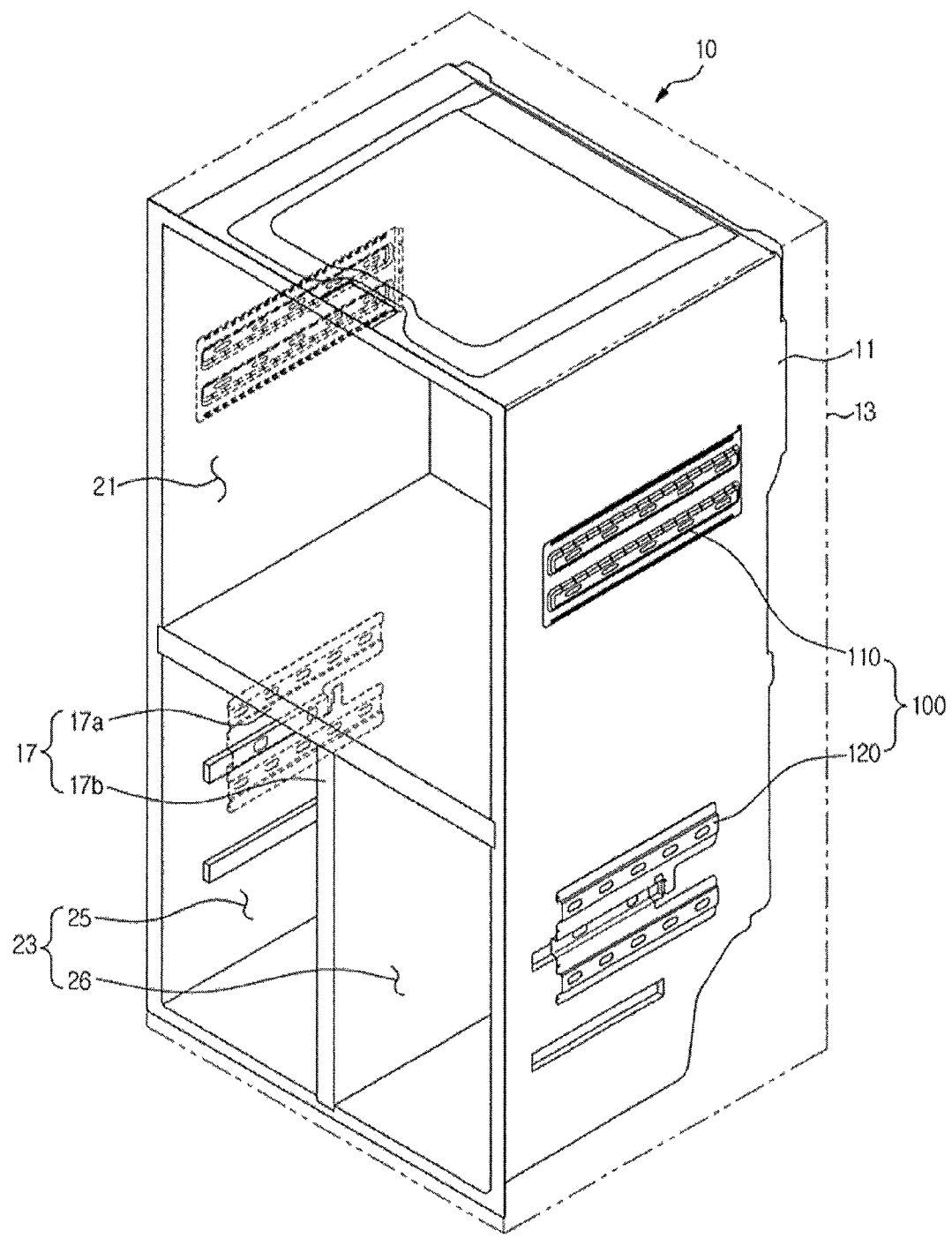
FIG. 4 is a view of a state in which a reinforcement member according to an embodiment is attached to an inner case.
Figure 5:
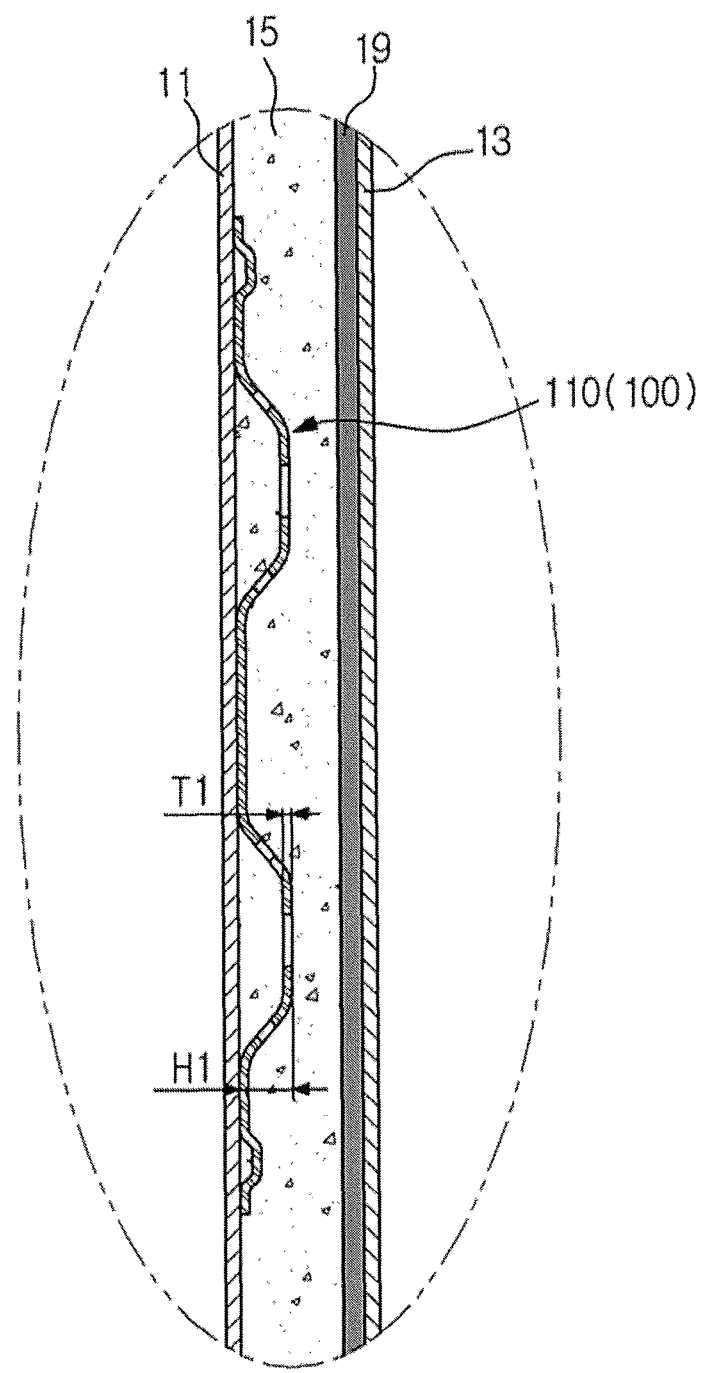
FIG. 5 is a cross-sectional view of a state in which a first reinforcement member according to an embodiment is attached to the inner case.

Thus, in order to prevent deformation of the shape that occurs due to the difference in the quantities of thermal contraction of the inner case 11 and the outer case 13 when the temperature of the body 10 is lowered to the room temperature after the insulating material 15 is foamed between the inner case 11 and the outer case 13, a reinforcement member 100 is disposed at both sides of the body 10, as illustrated in FIGS. 4 and 5.

The reinforcement member 100 may be formed of a steel material. The reinforcement member 100 is disposed in the insulating material 15 between the inner case 11 and the outer case 13 at both sides of the body 10 and prevents deformation of the shape that occurs due to the difference in the quantities of thermal contraction of the inner case 11 and the outer case 13 due to rigidity of the reinforcement member 100.

The reinforcement member 100 may be disposed at both sides of the body 10 in a widthwise direction or a lengthwise direction according to a direction in which the insulating material 15 foamed between the inner case 11 and the outer case 13 flows.

When the insulating material 15 is foamed between the inner case 11 and the outer case 13 and flows in a direction from a rear side of the body 10 to a front side of the body 10, the reinforcement member 100 is disposed at both sides of the body 10 in the widthwise direction.

When the reinforcement member 100 is disposed at both sides of the body 10 in the widthwise direction, the reinforcement member 100 may include a first reinforcement member 110 disposed at an upper portion of the first partition 17a based on the first partition 17a that partitions off the storage compartment 20 into the upper storage compartment 21 and the lower storage compartment 23 and a second reinforcement member 120 disposed at a lower portion of the first partition 17a.

Figure 6:
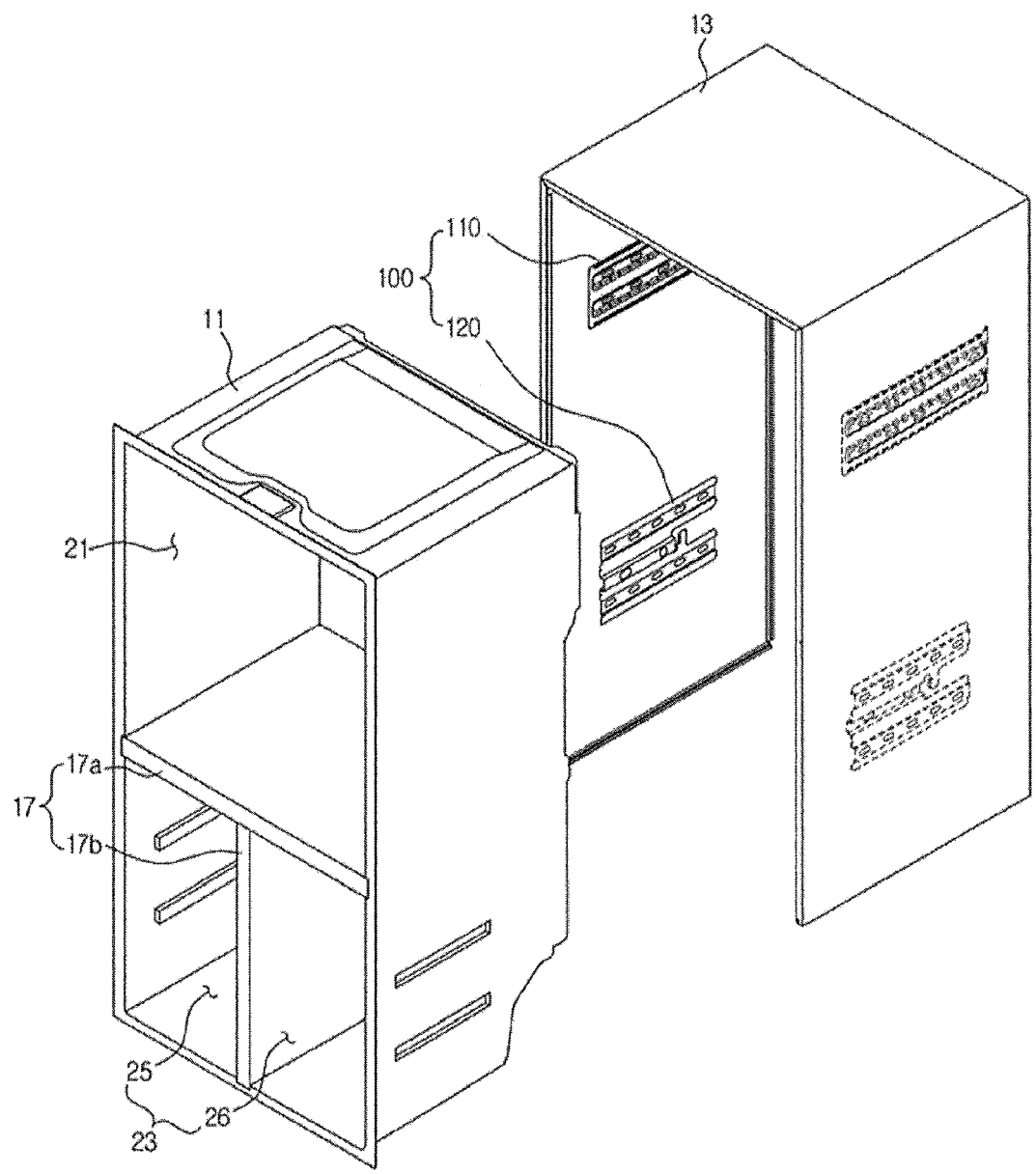
FIG. 6 is a view of a state in which the reinforcement member according to an embodiment is attached to an outer case.

The first reinforcement member 110 and the second reinforcement member 120 may be attached to the inner case 11 between the inner case 11 and the outer case 13, as illustrated in FIG. 4 and may be attached to the outer case 13, as illustrated in FIG. 6.

If the first reinforcement member 110 and the second reinforcement member 120 are disposed only in the insulating material 15 between the inner case 11 and the outer case 13, it does not matter that the first reinforcement member 110 and the second reinforcement member 120 are attached to any one of the inner case 11 and the outer case 13.

The first reinforcement member 110 disposed at the upper portion of the body 10 has a smaller length than a length of both sides of the body 10 in a forward/backward direction and may be disposed to have a thickness T1 of about 0.5 mm.

The first reinforcement member 110 may have a maximum height H1 between the inner case 11 and the outer case 13 so as to increase a cross-sectional coefficient in a direction in which shapes of the inner case 11 and the outer case 13 are deformed.

The first reinforcement member 110 may be disposed in a shape of an unevenness having a maximum height H without disturbing a flow of the insulating material 15 foamed between the inner case 11 and the outer case 13.

The first reinforcement member 110 may be attached to the inner case 11 or the outer case 13 using an adhesion unit, such as a double-sided tape. Although not shown, the first reinforcement member 110 may include a fixing unit that may fix the first reinforcement member 110 to the inner case 11 or the outer case 13 so as to prevent the first reinforcement member 110 attached to the inner case 11 or the outer case 13 from being moved when the insulating material 15 is foamed.

Like the first reinforcement member 110, the second reinforcement member 120 disposed at the lower portion of the body 10 may have a smaller length than a length of both sides of the body 10 in the forward/backward direction and may be disposed to have a thickness T2 of about 0.5 mm. The second reinforcement member 120 may have a maximum height H2 between the inner case 11 and the outer case 13 so as to increase a cross-sectional coefficient in a direction in which shapes of the inner case 11 and the outer case 13 are deformed.

Like the first reinforcement member 110, although not shown, the second reinforcement member 120 may include a fixing unit that may fix the second reinforcement member 120 to the inner case 11 or the outer case 13 so as to prevent the second reinforcement member 120 attached to the inner case 11 or the outer case 13 from being moved when the insulating material 15 is foamed.

Figure 7:
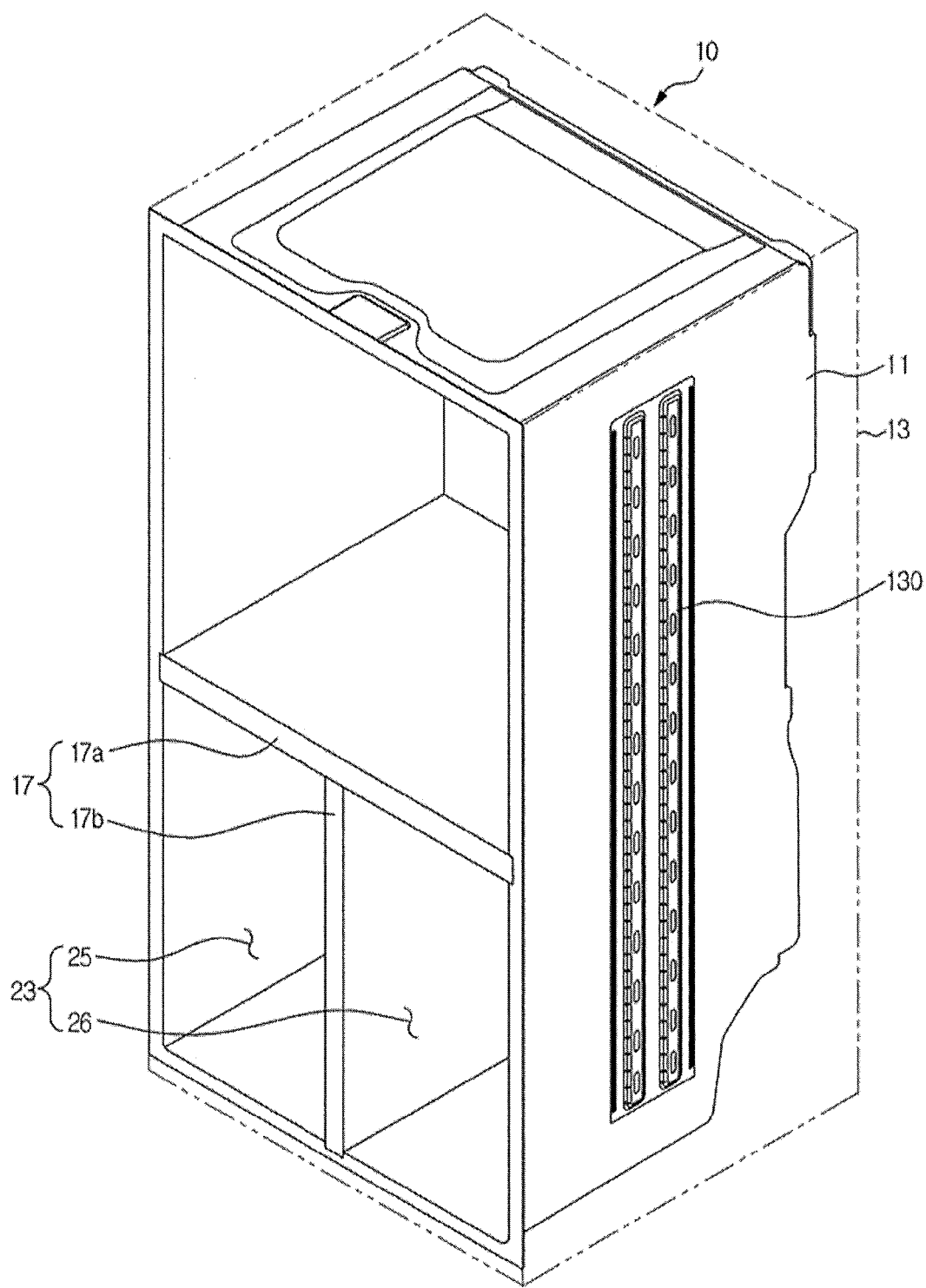
FIG. 7 is a view of a state in which the reinforcement member according to an embodiment is attached to the inner case in a lengthwise direction.

As illustrated in FIG. 7, when the insulating material 15 is foamed between the inner case 11 and the outer case 13 and flows in a direction from the upper portion of the body 10 to the lower portion of the body 10, a reinforcement member 130 is disposed at both sides of the body 10 in the lengthwise direction.

When the reinforcement member 130 is disposed at both sides of the body 10 in the lengthwise direction, the reinforcement member 130 has a smaller length than a length of both sides of the body 10 in a vertical direction and may be disposed to have a thickness of about 0.5 mm.

The reinforcement member 130 disposed at both sides of the body 10 in the lengthwise direction has the same shape as that of the first reinforcement member 110 and may be disposed in a shape in which only the length of the reinforcement member 130 is larger than that of the first reinforcement member 110.

Also, like the first reinforcement member 110 and the second reinforcement member 120, the reinforcement member 130 may be attached to the inner case 11 between the inner case 11 and the outer case 13, as illustrated in FIG. 7, and although not shown in the drawings, the reinforcement member 130 may also be attached to the outer case 13.

As described above, the reinforcement members 100 and 130 are disposed between the inner case 11 and the outer case 13 at both sides of the body 10 so that rigidity of the body 10 is reinforced and a quantity of deformation of the body 10 caused by the difference in the quantities of thermal contraction between the inner case 11 and the outer case 13 can be reduced.

As illustrated in FIGS. 1 through 3, the thickness of the insulating material 15 foamed between the inner case 11 and the outer case 13 need to be reduced so as to increase the internal capacity of the body 10 having the same exterior size. When the thickness of the insulating material 15 is reduced, insulation performance may be lowered, and rigidity is deteriorated such that deformation may occur in the body 10 due to the weight of the body 10 and a load of a material stored in the body 10.

In order to improve the insulation performance that is lowered due to the reduced thickness of the insulating material, a vacuum insulation panel (VIP) 19 may be disposed between the inner case 11 and the outer case 13 together with the insulating material 15.

The VIP 19 has approximately eight times larger insulation performance than that of the insulating material 15, and an inside of the VIP 19 is vacuum treated so as to maximize the insulation performance.

The VIP 19 may be disposed between the inner case 11 and the outer case 13 together with the insulating material 15 and may supplement the lowered insulation performance but cannot supplement deteriorated rigidity.

Figure 8:
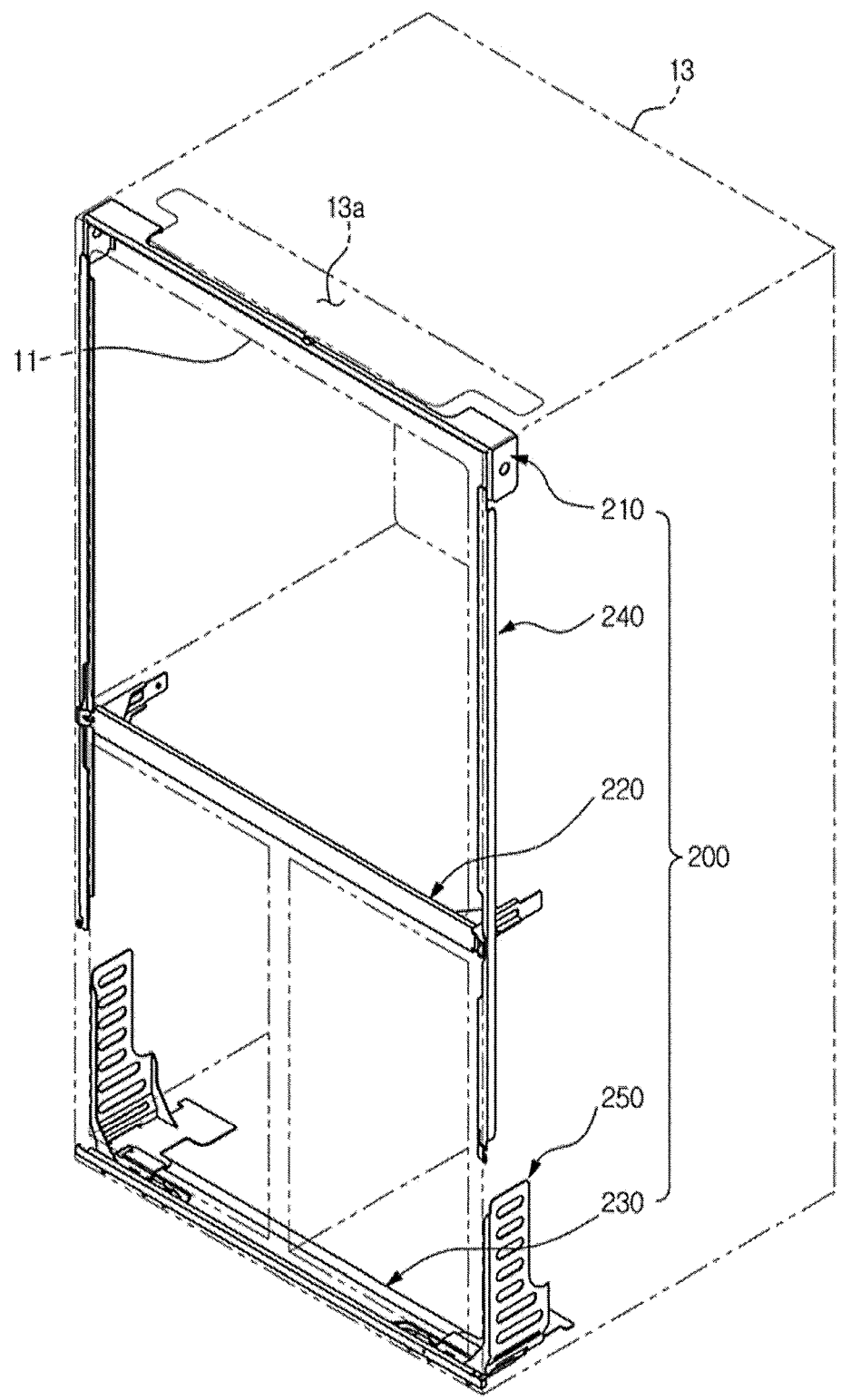
FIG. 8 is a view of a state in which a reinforcement frame according to an embodiment is coupled to a body.
Figure 9:
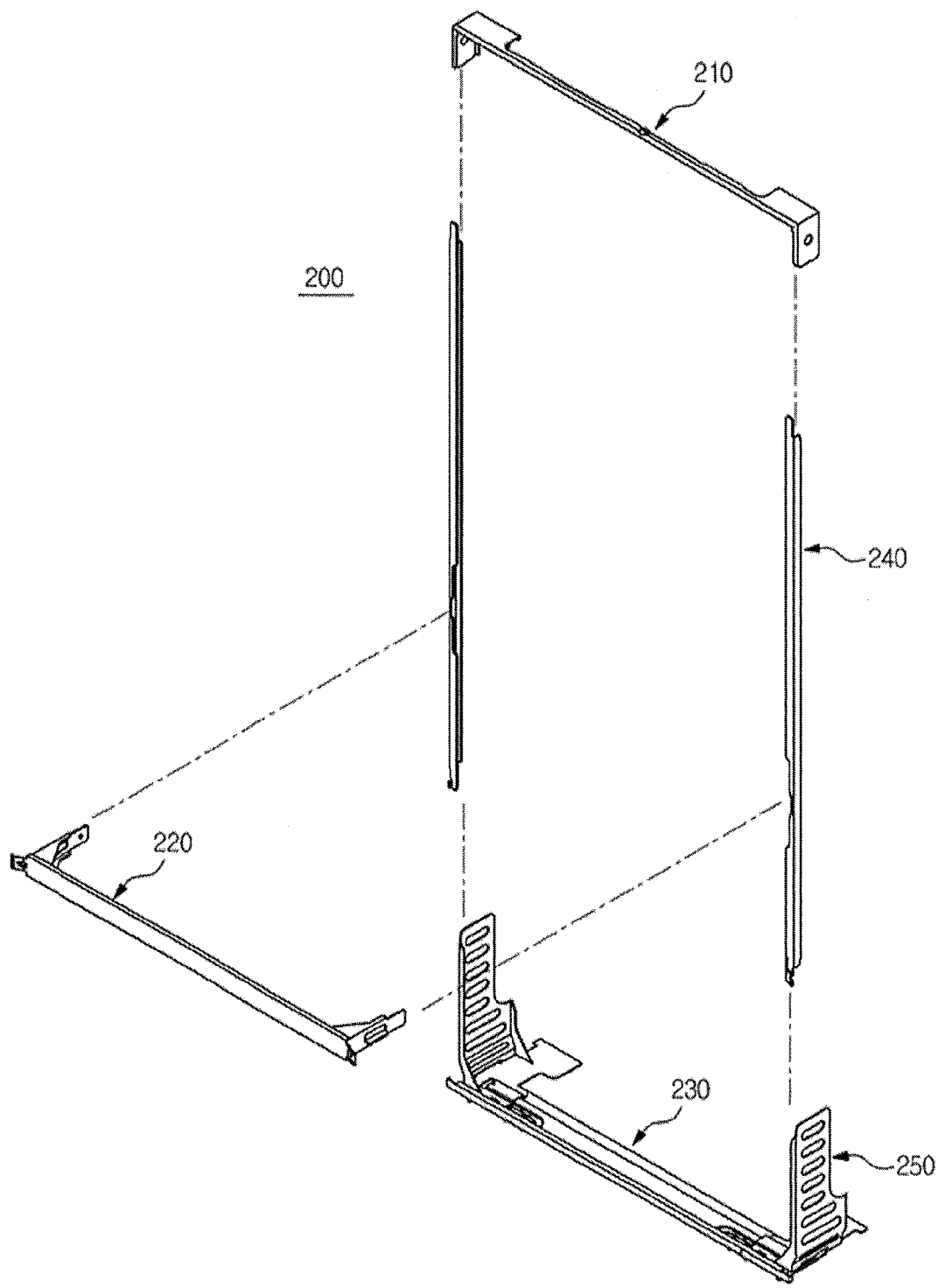
FIG. 9 is a perspective view of the reinforcement frame according to an embodiment.
Figure 10:
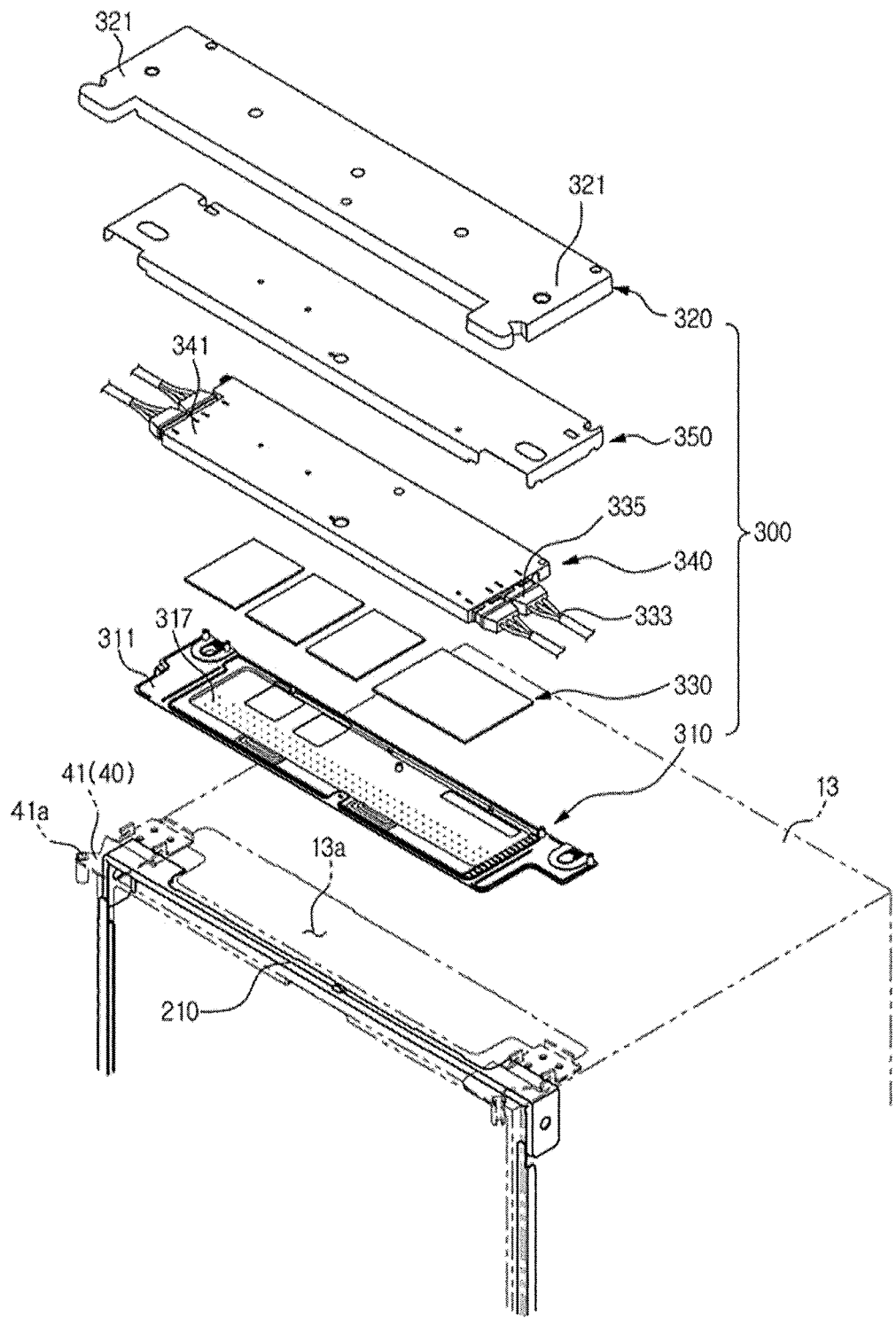
FIG. 10 is an exploded perspective view of an electric apparatus box disposed on the refrigerator according to an embodiment.
Figure 11:
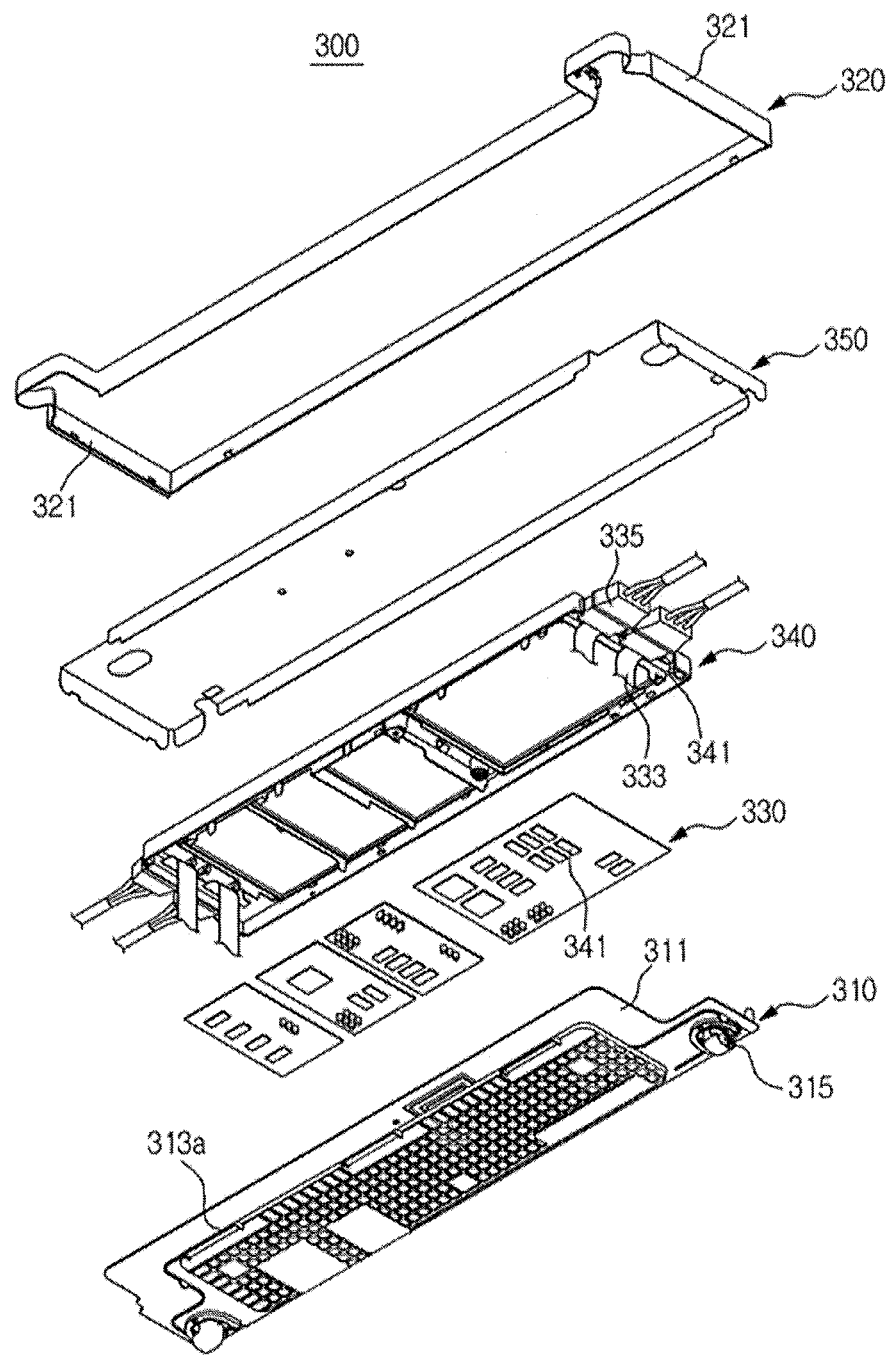
FIG. 11 is an exploded perspective view of a state in which the electric apparatus box according to an embodiment is viewed in an upward direction.
Figure 12:
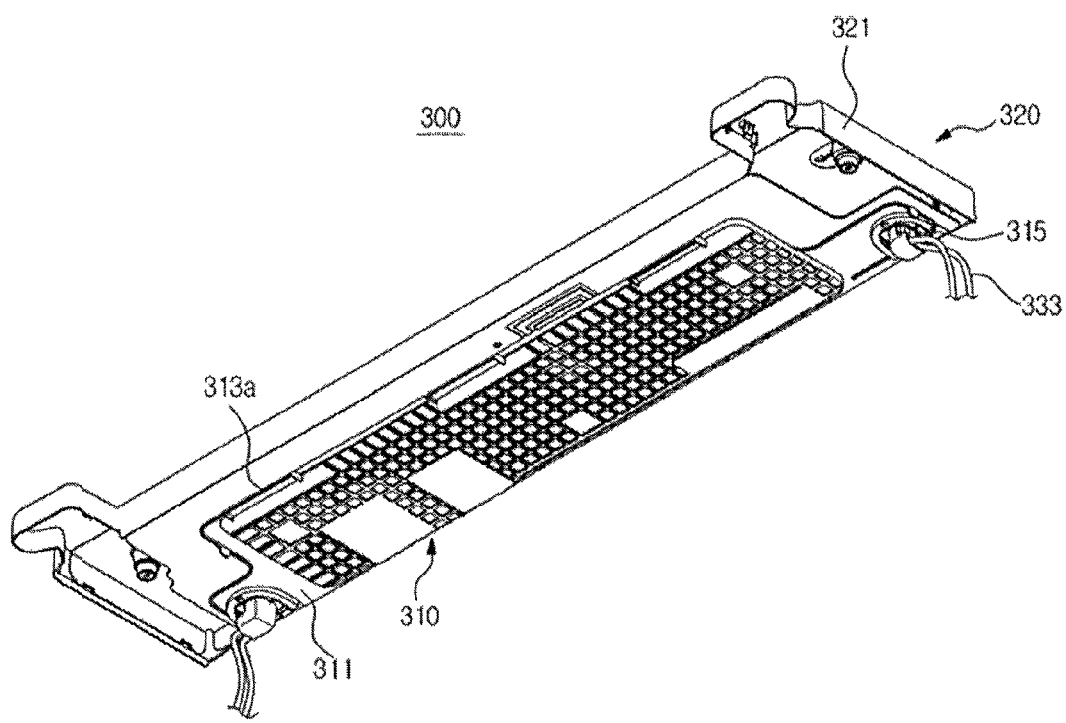
FIG. 12 is a perspective view of the electric apparatus box according to an embodiment.
Figure 13:
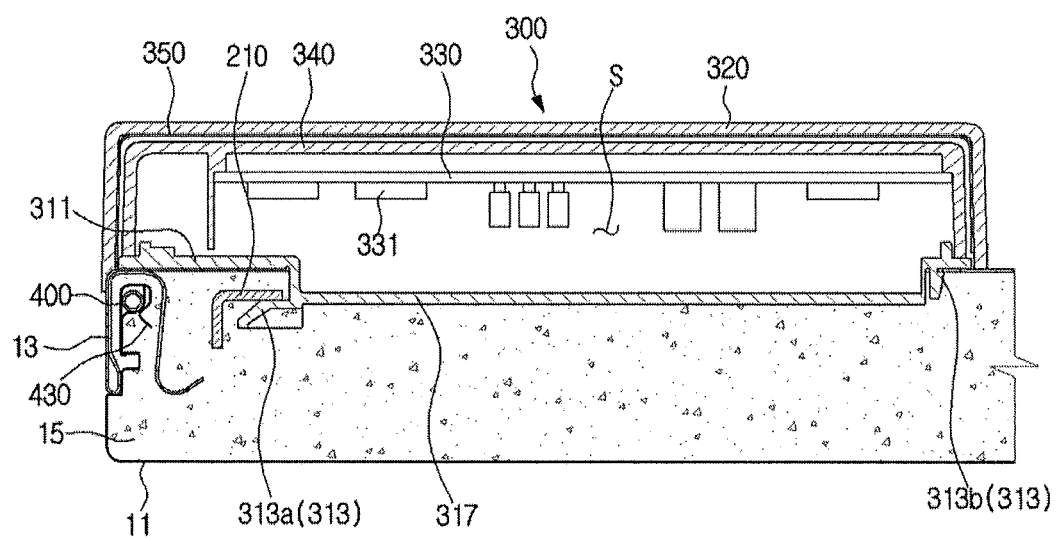
FIG. 13 is a cross-sectional view of a state in which the electric apparatus box according to an embodiment is disposed at the body.
Figure 14:
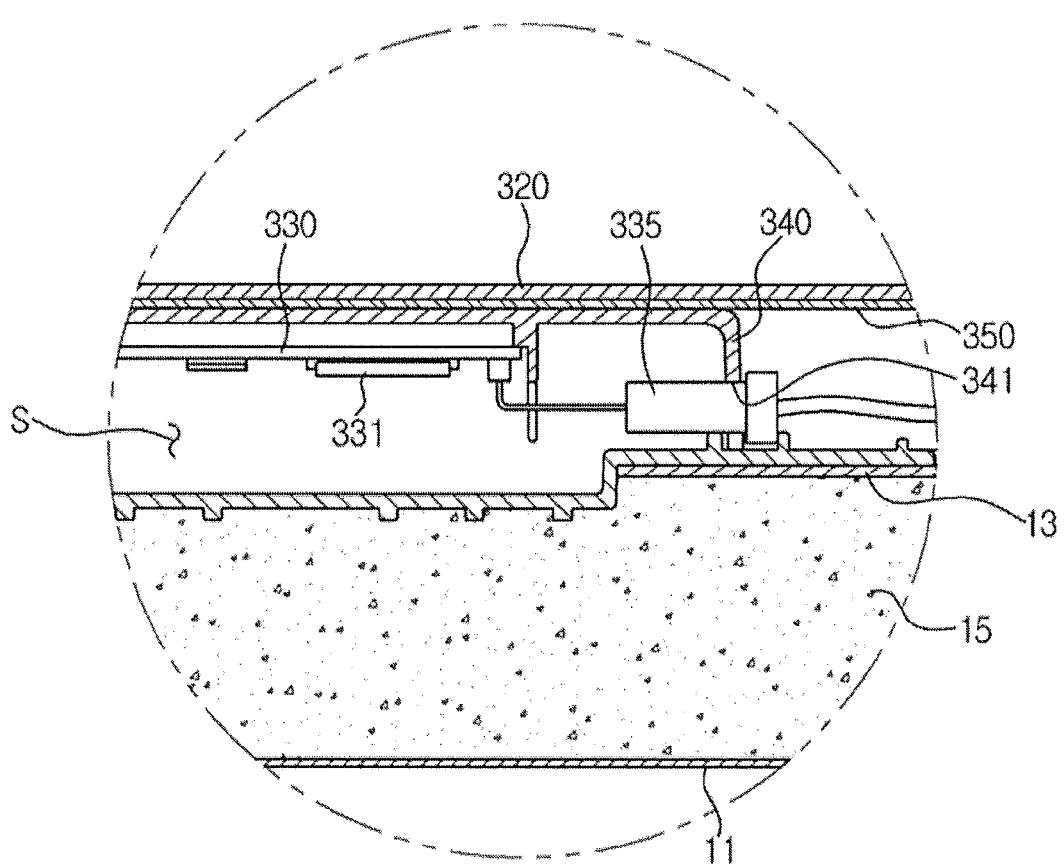
FIG. 14 is a view of wires connected to the electric apparatus box according to an embodiment.
Figure 15:
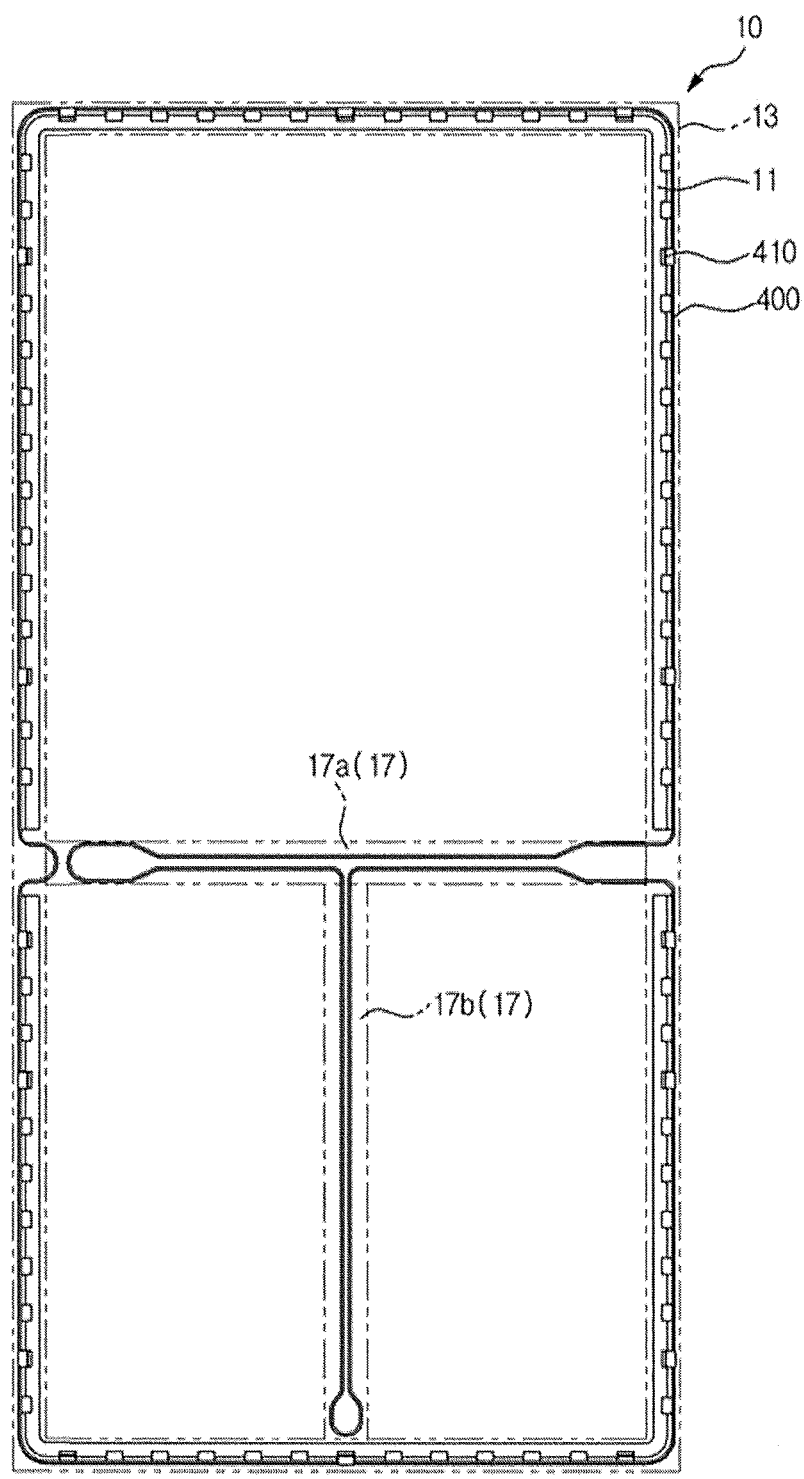
FIG. 15 is a schematic view of a state in which a heating pipe according to an embodiment is disposed at the body.
Figure 16:
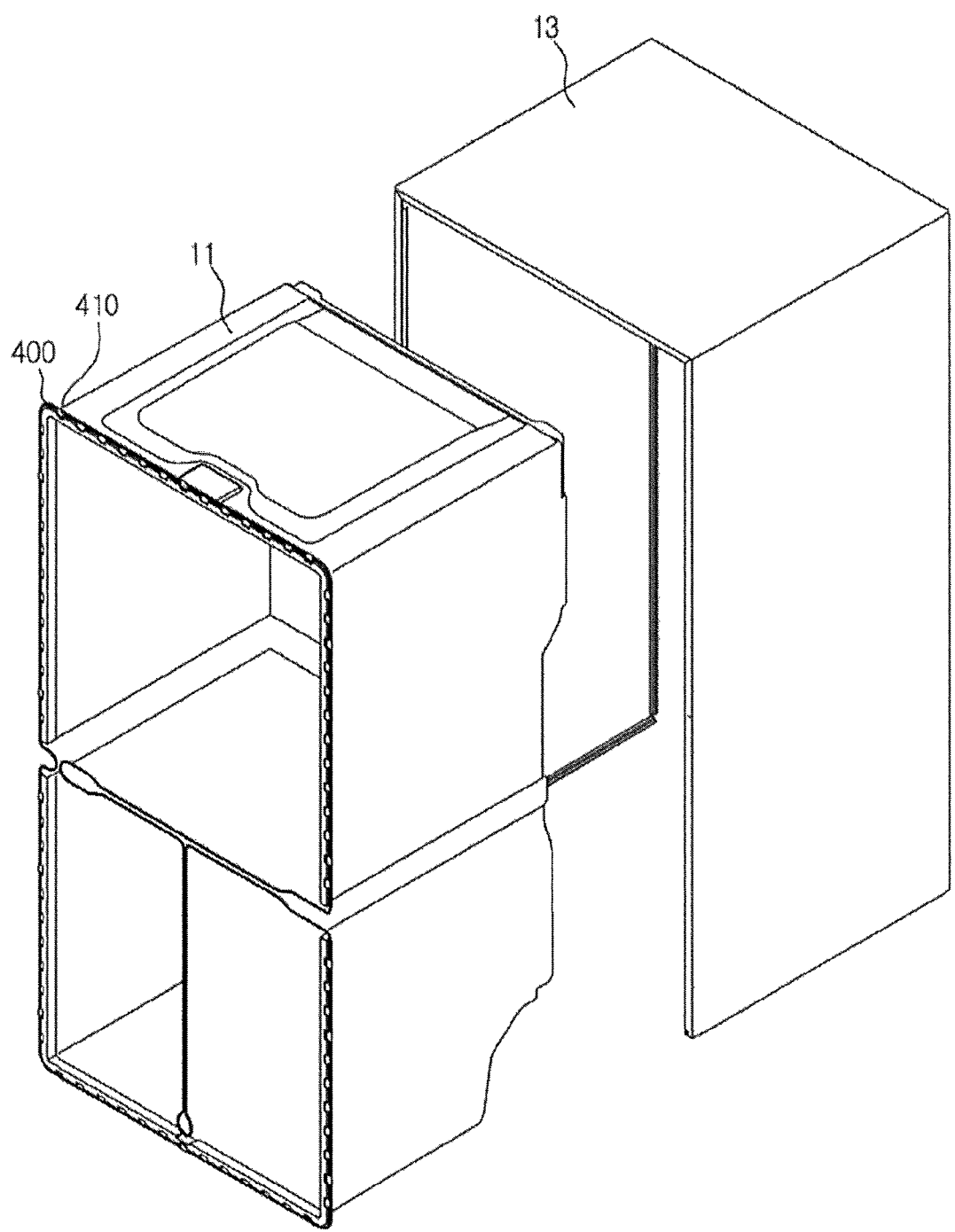
FIG. 16 is a view of the outer case and the inner case in which the heating pipe according to an embodiment is disposed.
Figure 17:
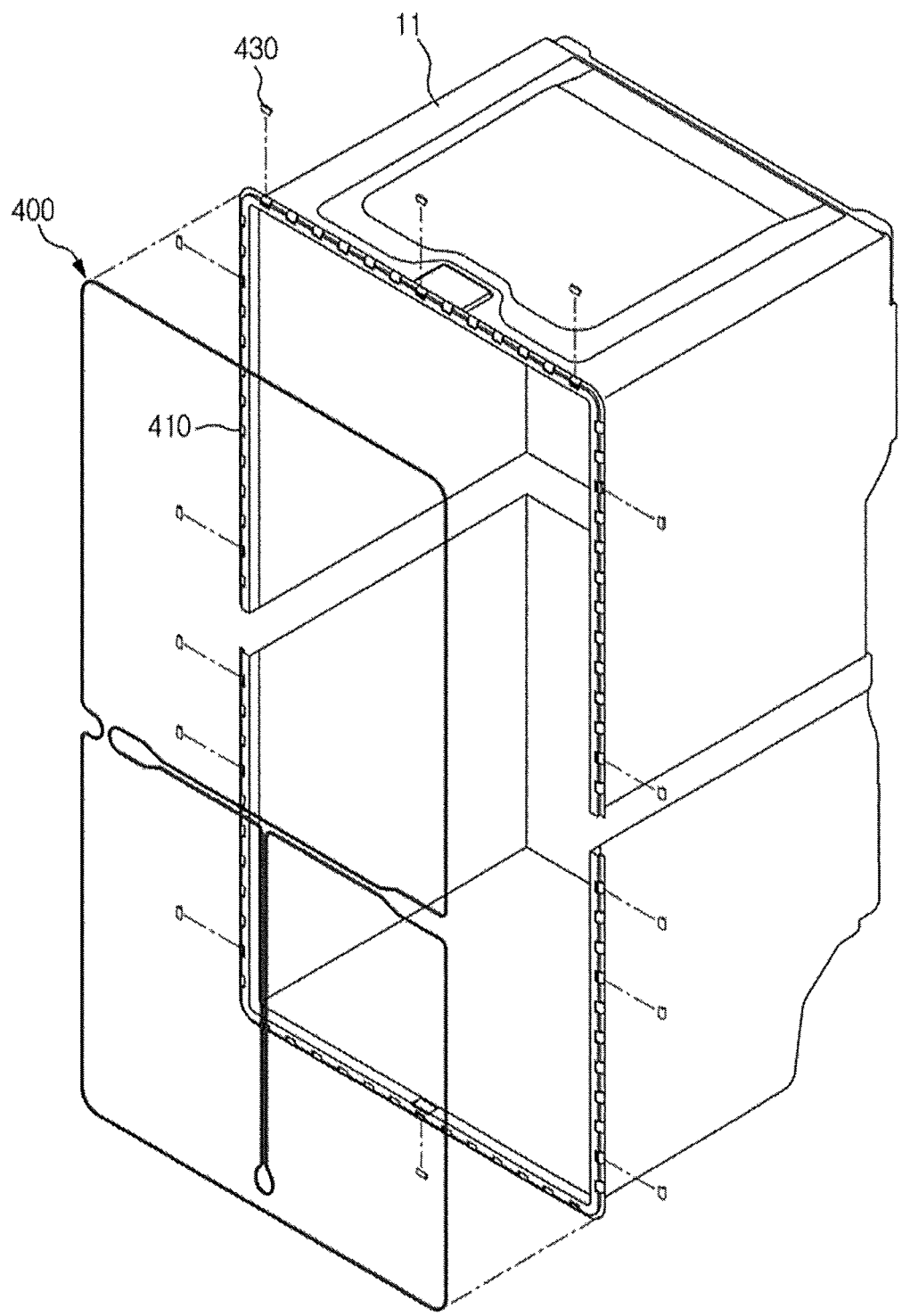
FIG. 17 is a view of a state in which the heating pipe is fixed to the inner case according to an embodiment.
Figure 18:
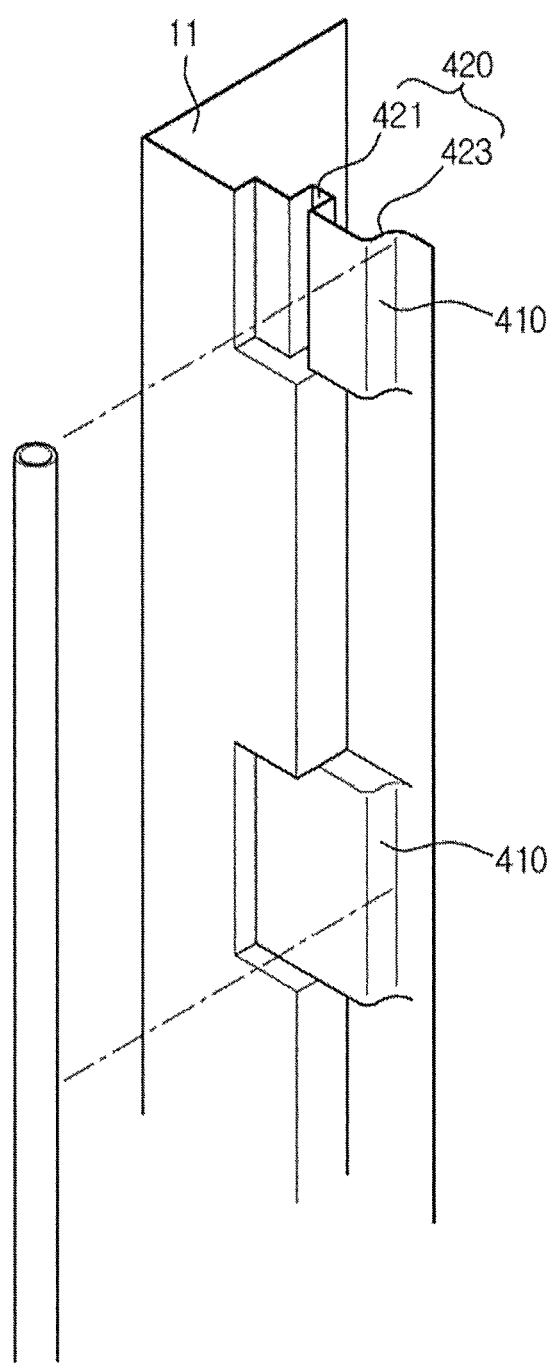
FIG. 18 is a view of a state in which a mounting portion for mounting the heating pipe and a fixing groove for fixing the heating pipe are disposed at the inner case according to an embodiment.
Figure 19:
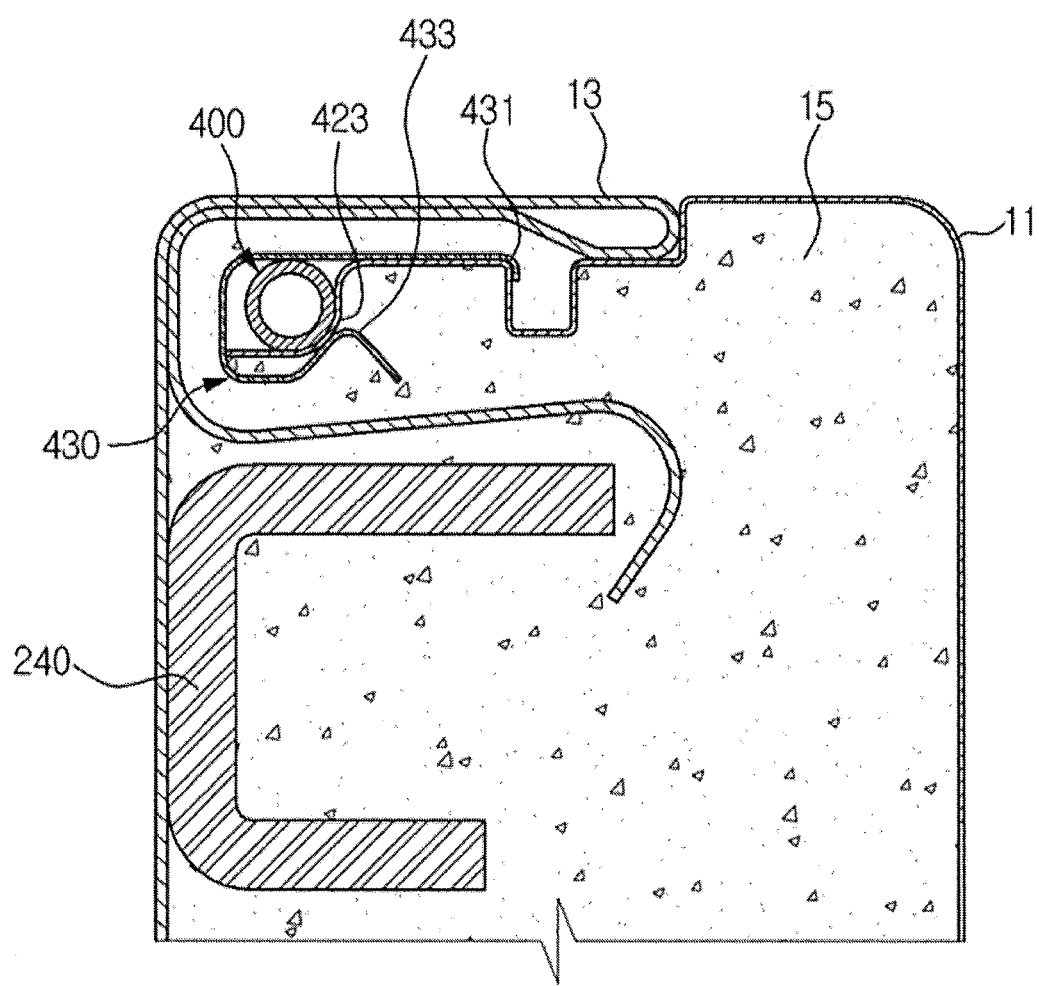
FIG. 19 is a view of a state in which the heating pipe according to an embodiment is disposed at the body.
Figure 20:
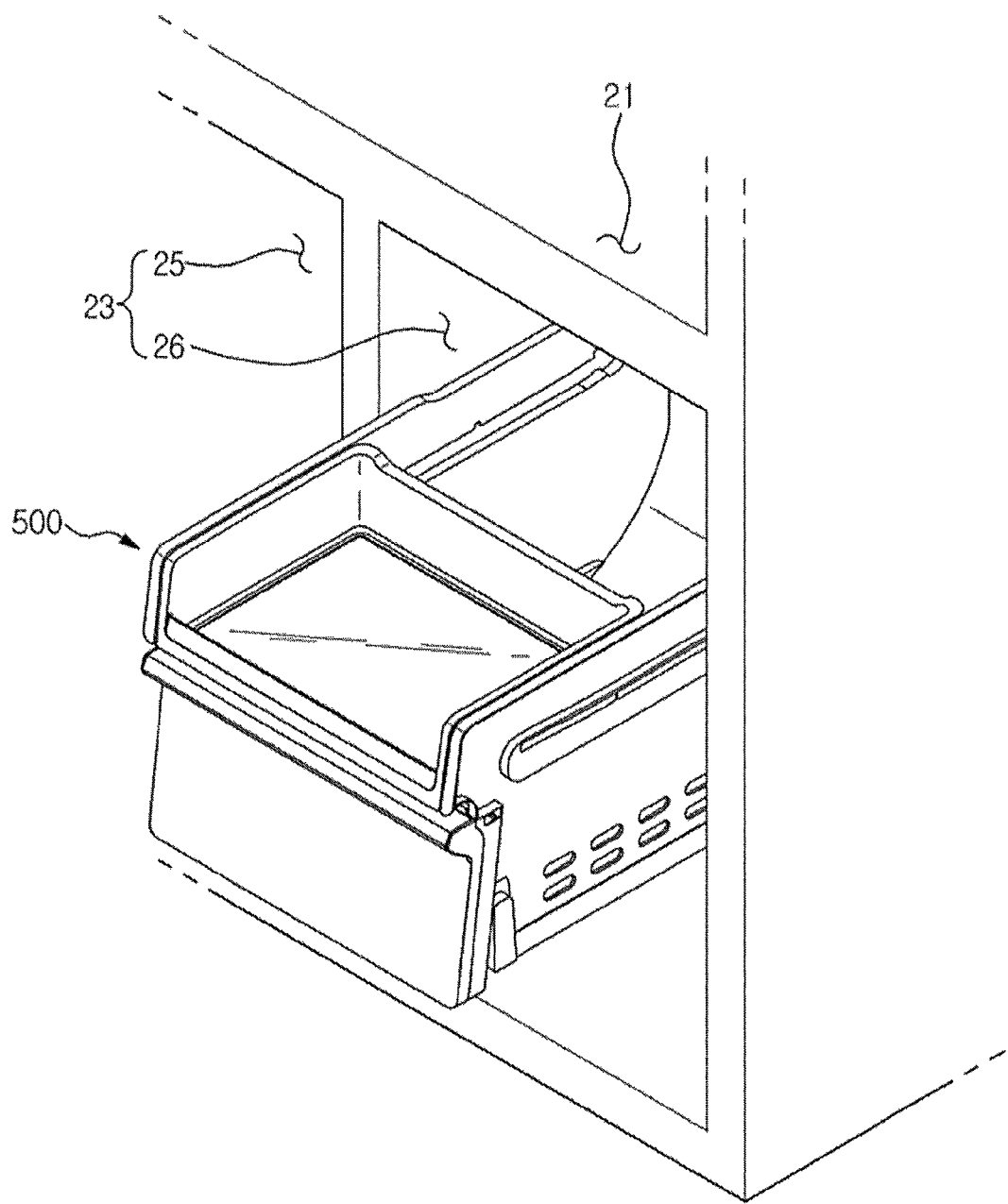
FIG. 20 is a view of a state in which a storage unit is disposed in a storage compartment according to an embodiment.
Figure 21:
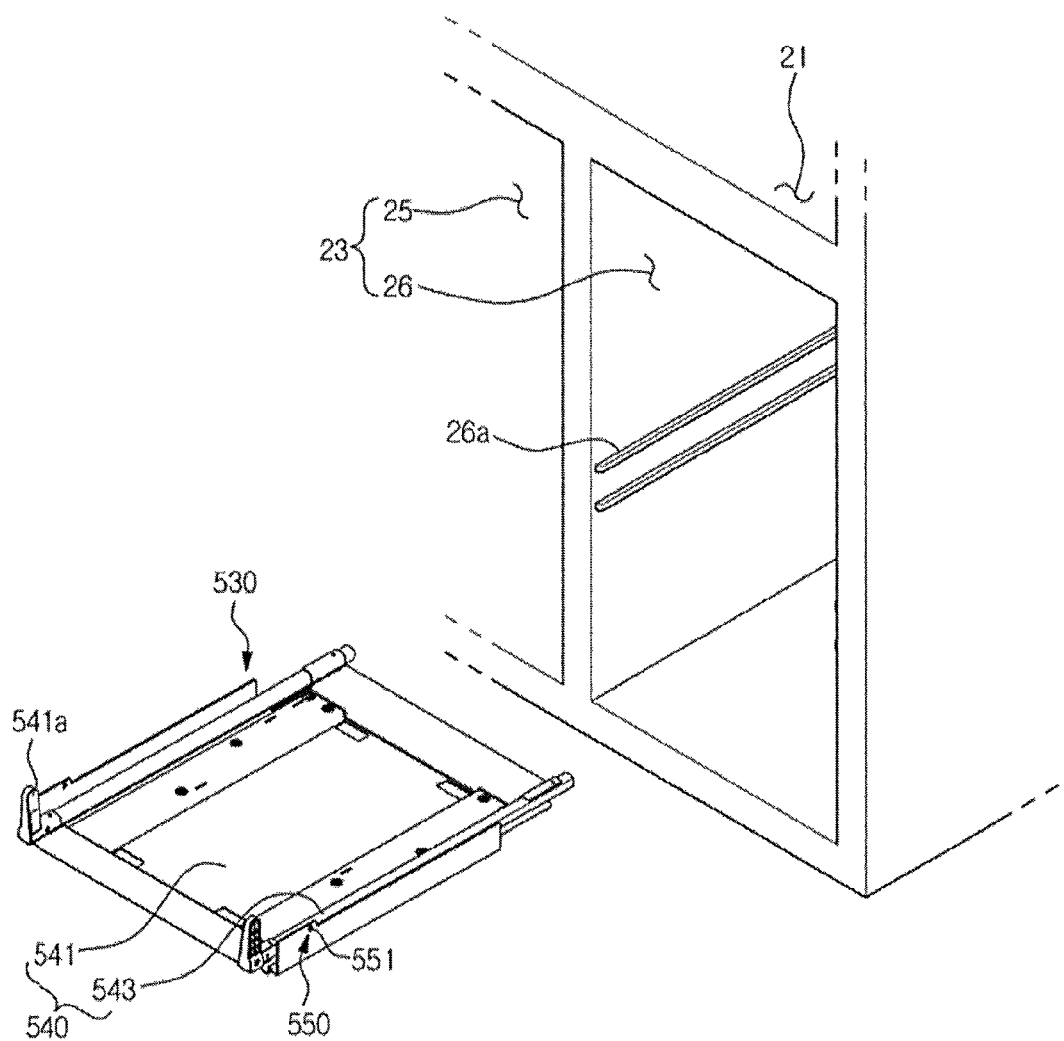
FIG. 21 is a view of a state in which a sliding shelf according to an embodiment is coupled to an inside of the storage compartment.
Figure 22:
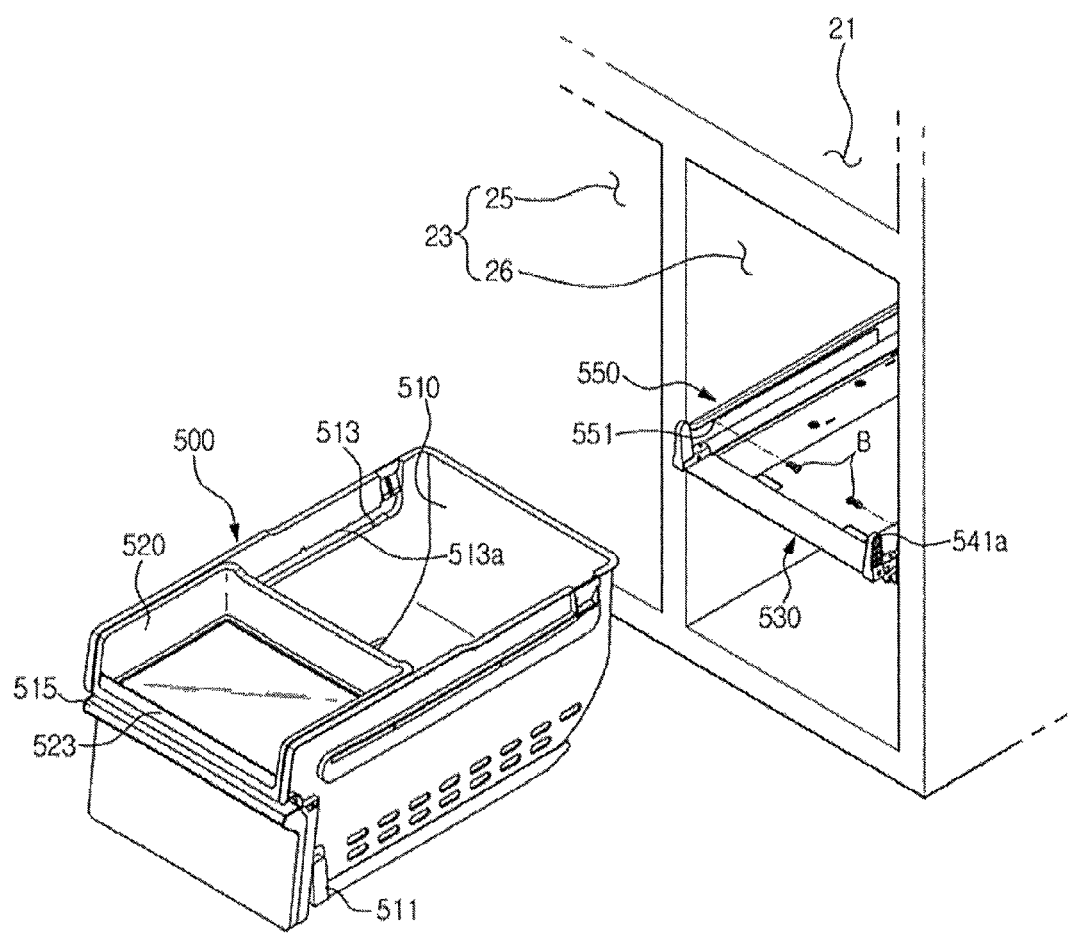
FIG. 22 is a view of a state in which the sliding shelf according to an embodiment has been coupled to the inside of the storage compartment.
Figure 23:
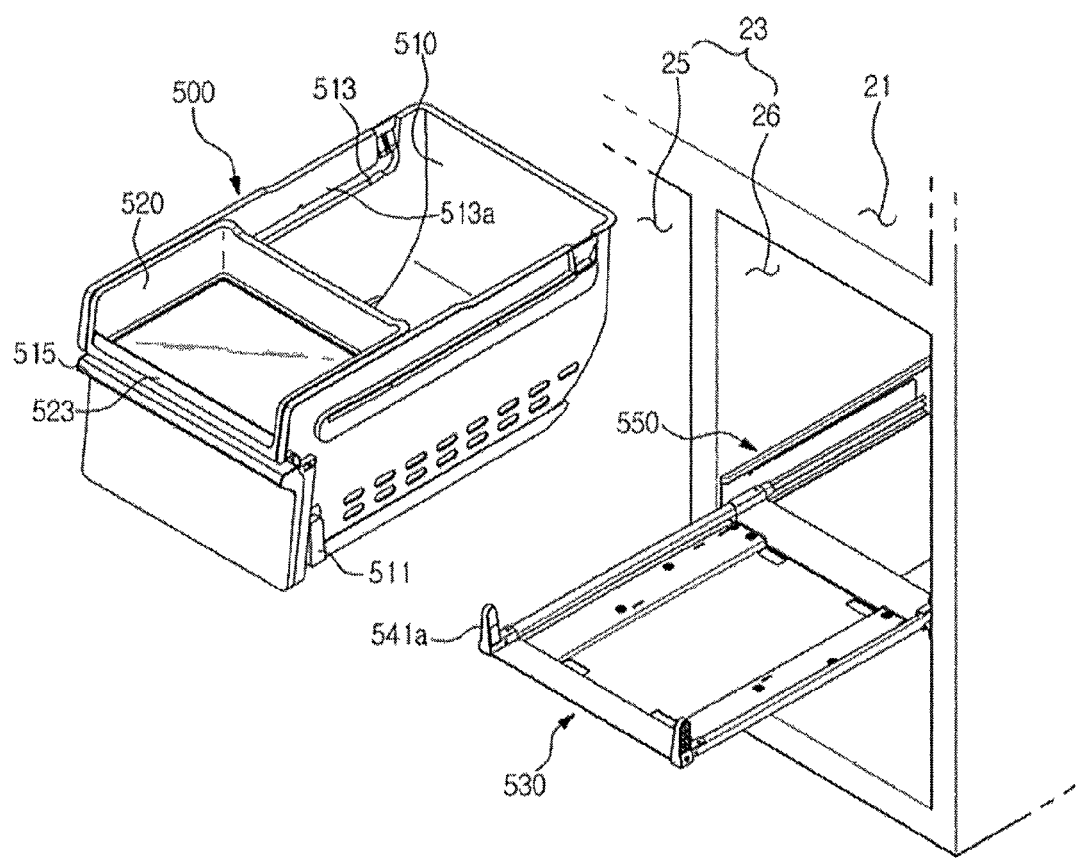
FIG. 23 is a view of a state in which a first storage box is coupled to the sliding shelf according to an embodiment.
Figure 24:
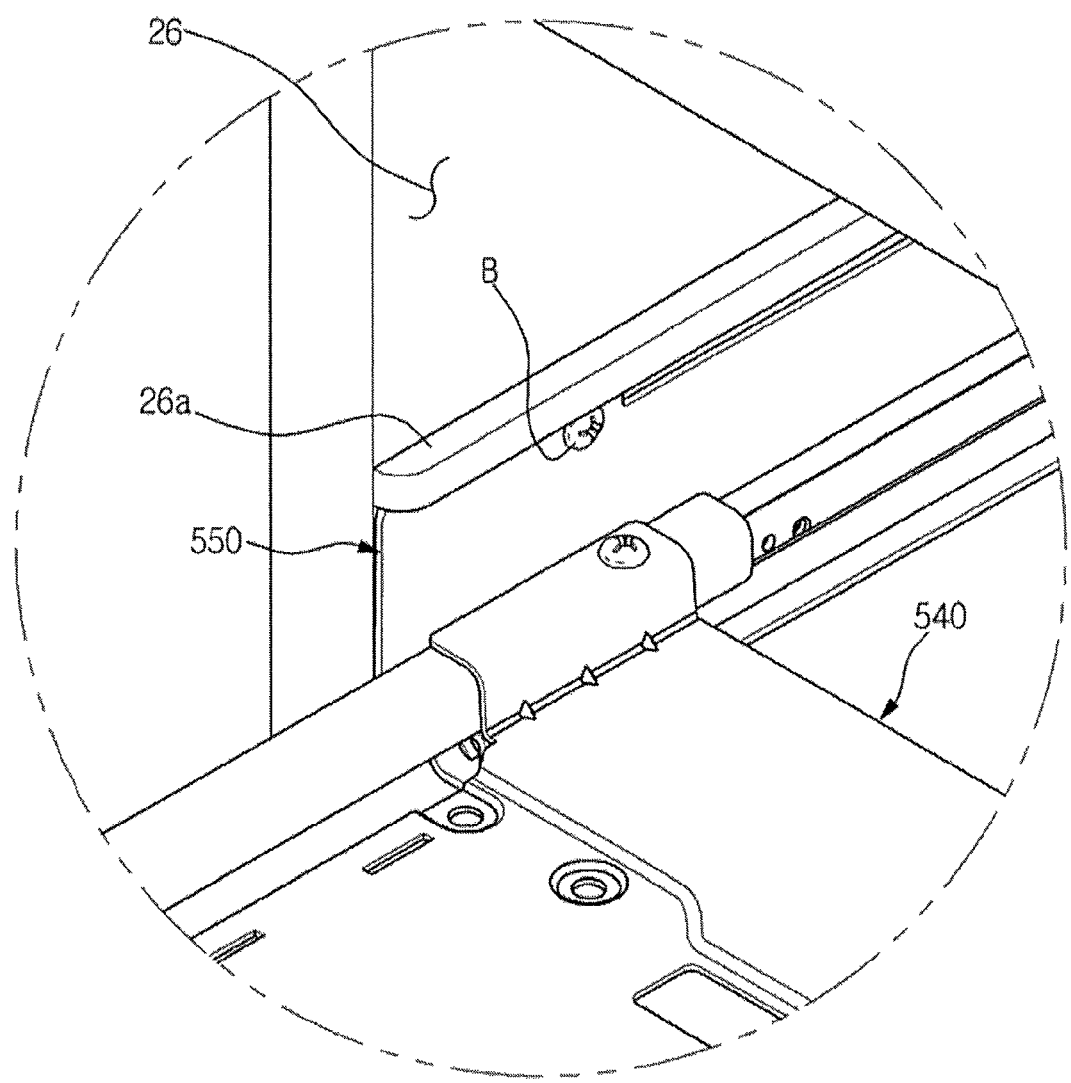
FIG. 24 is an enlarged view of a portion in which a cover rail of FIG. 23 is coupled to a coupling portion.
Figure 25:
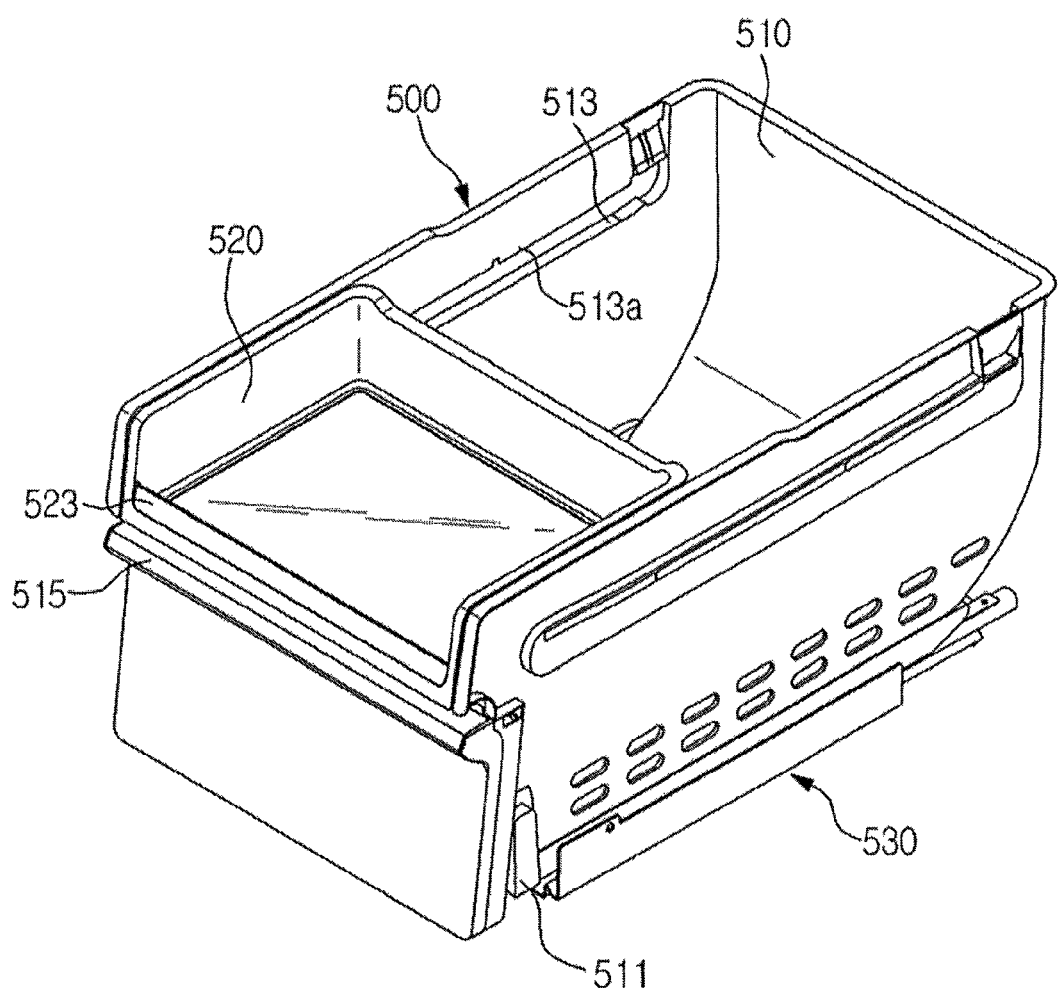
FIG. 25 is a view of a state in which the sliding shelf is coupled to the first storage box according to an embodiment.
Figure 26:
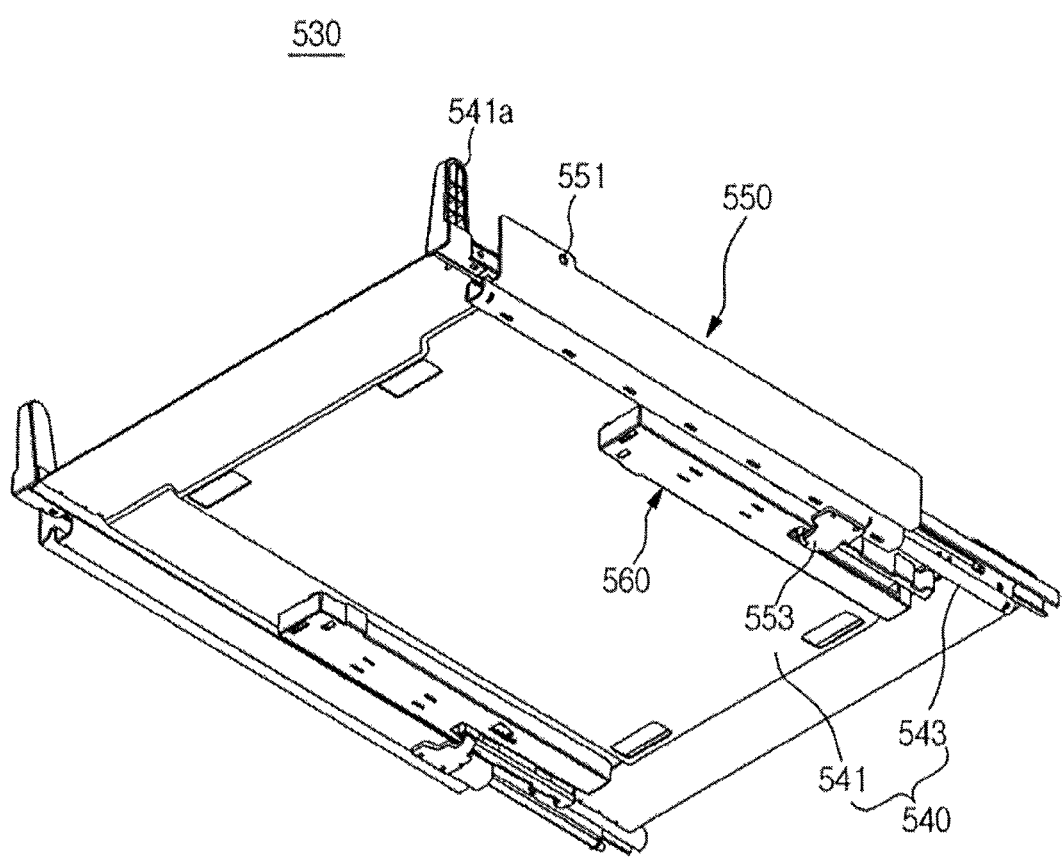
FIG. 26 is a view of a state in which the sliding shelf according to an embodiment is viewed from a bottom.
Figure 27:
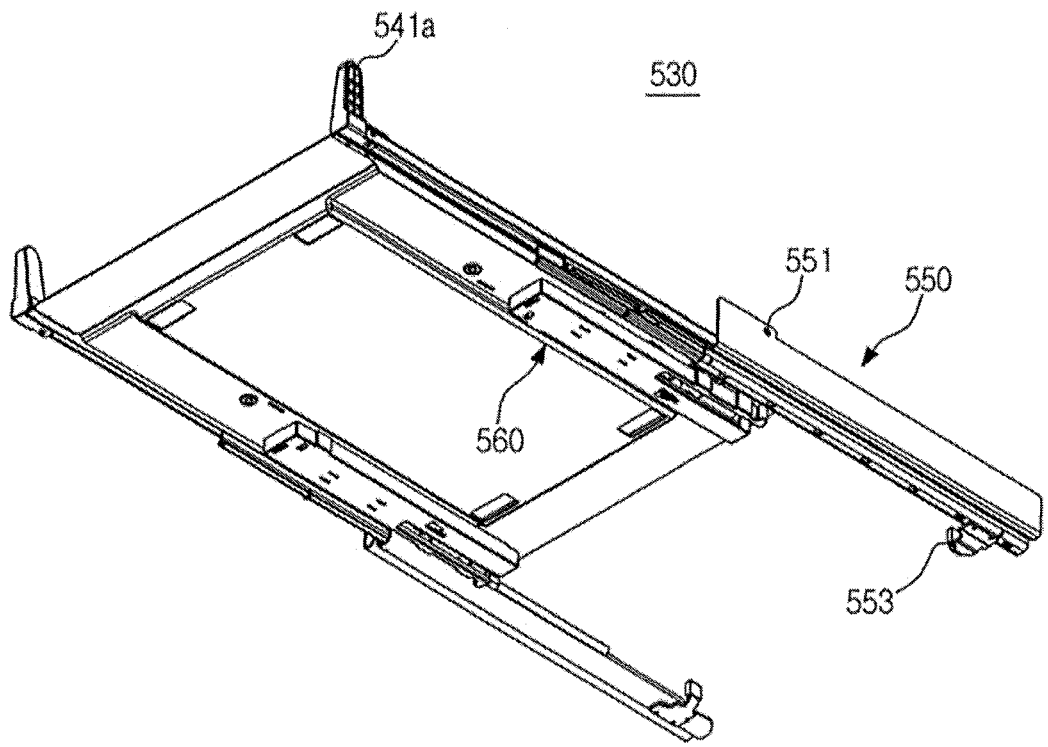
FIG. 27 is a view of a state in which a sliding portion is taken out from the sliding shelf of FIG. 26.
Figure 28:
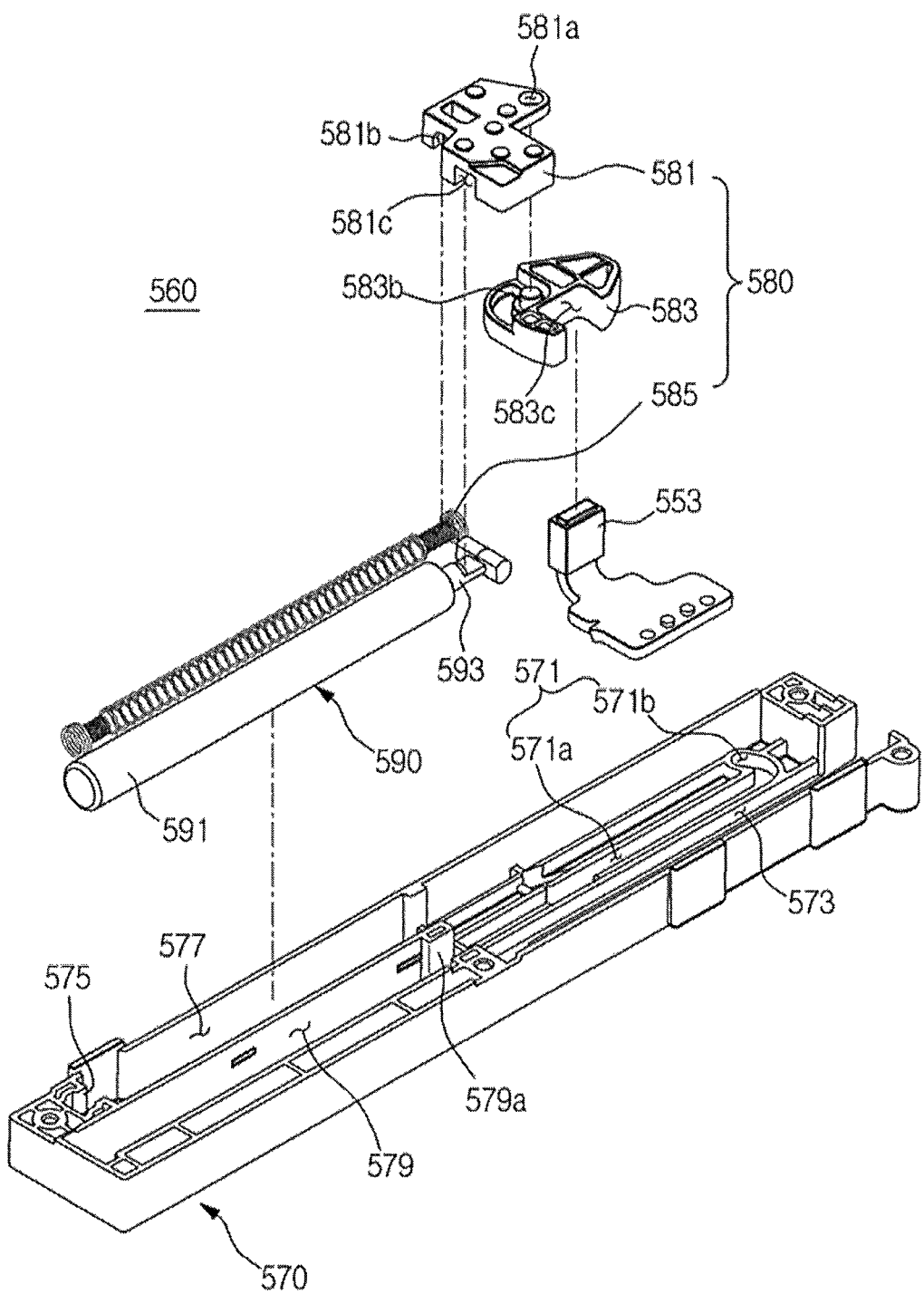
FIG. 28 is an exploded perspective view of a self closing unit according to an embodiment.
Figure 29:
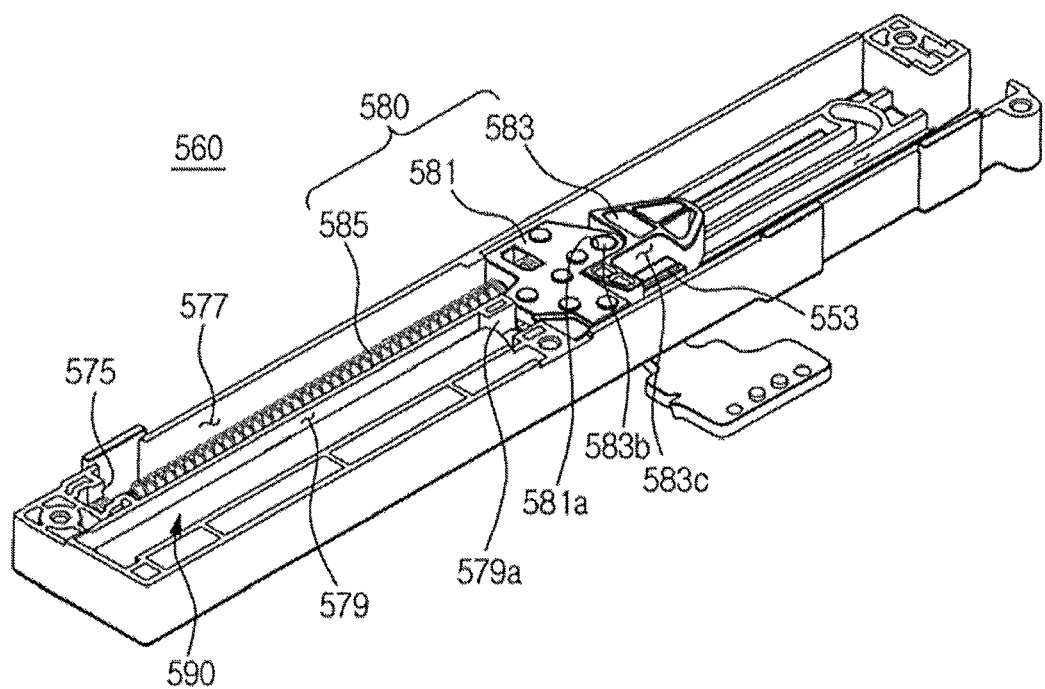
FIG. 29 is a view of the self closing unit according to an embodiment.
Figure 30:
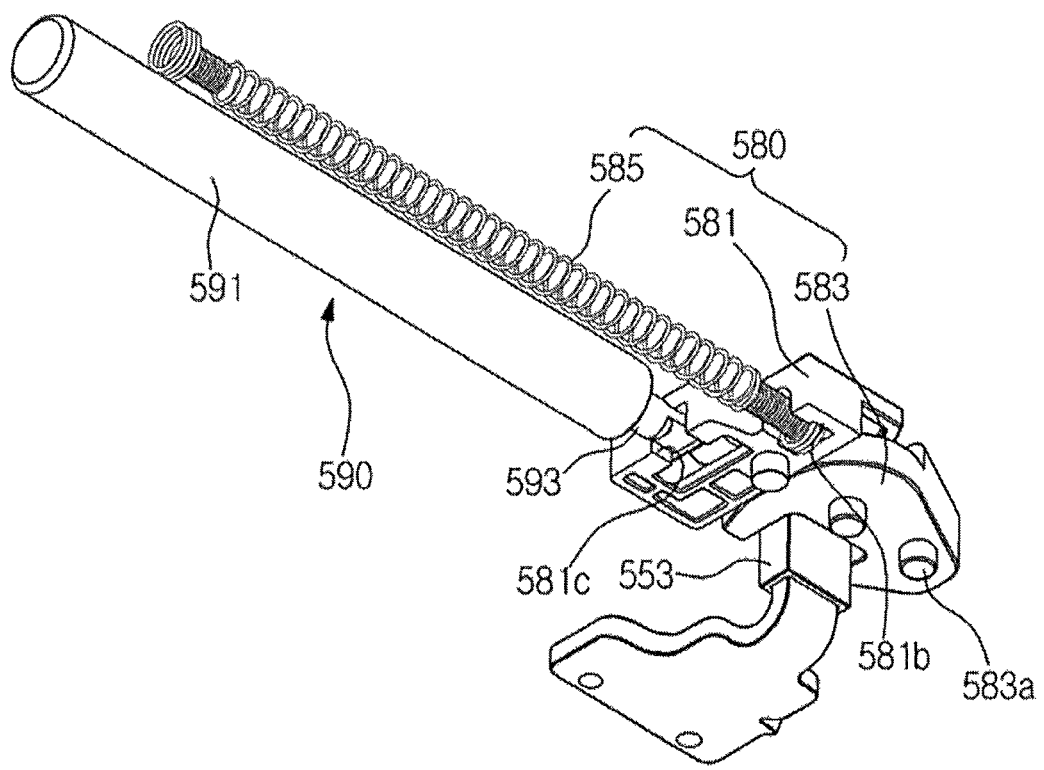
FIG. 30 is a view of a state in which a part of the self closing unit according to an embodiment is viewed from the bottom.
Figure 31:
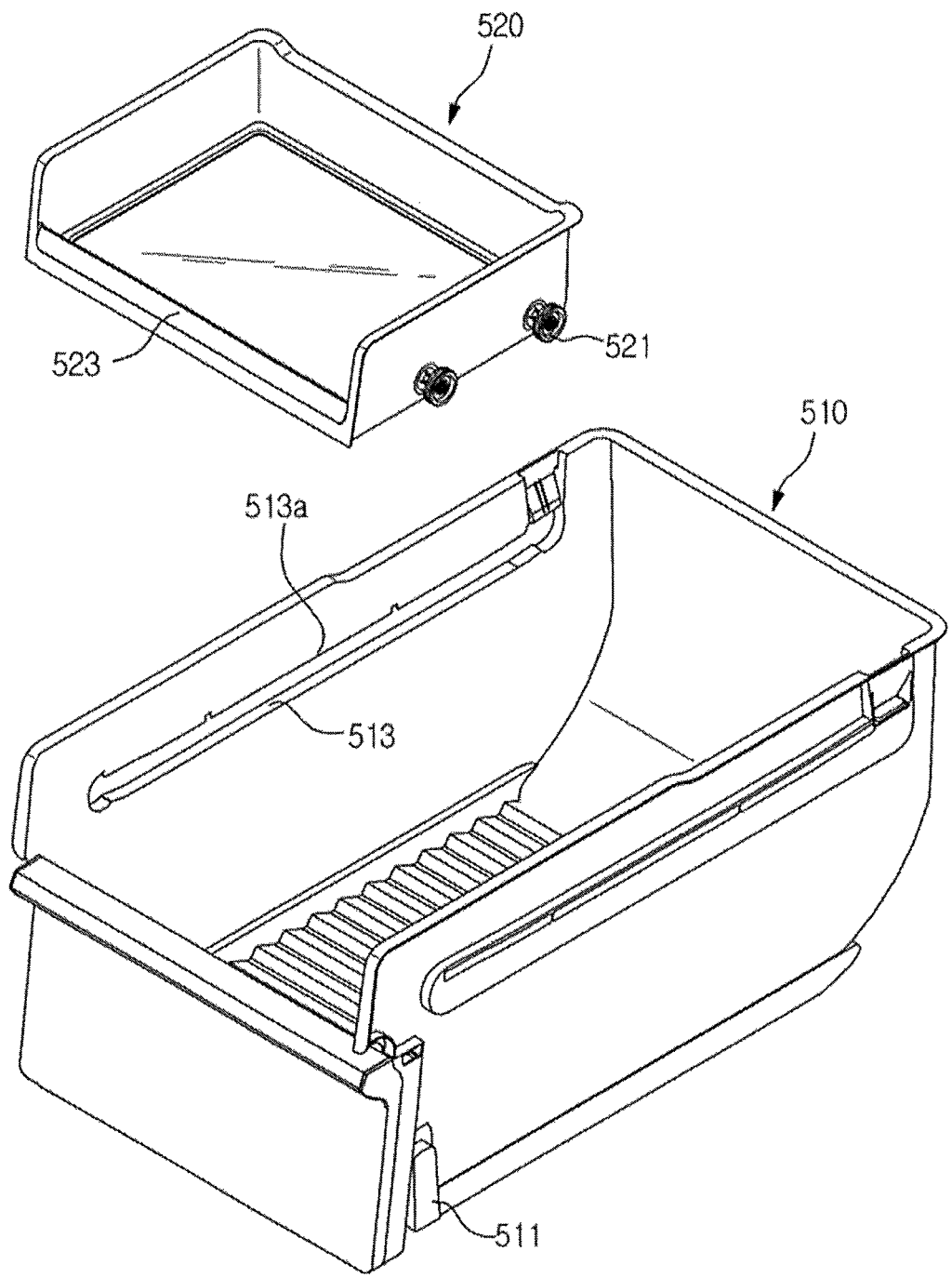
FIG. 31 is a view of a state in which a first storage box and a second storage box according to an embodiment are separated from each other.
Figure 32:
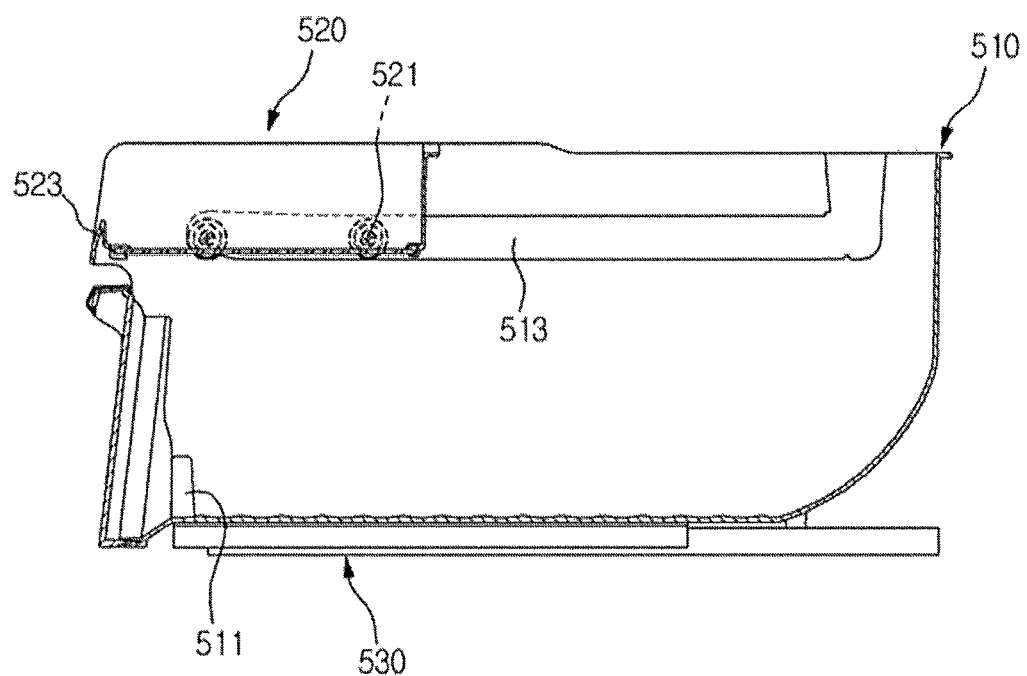
FIG. 32 is a view of a state in which a storage unit according to an embodiment is viewed from a side.
Figure 33:
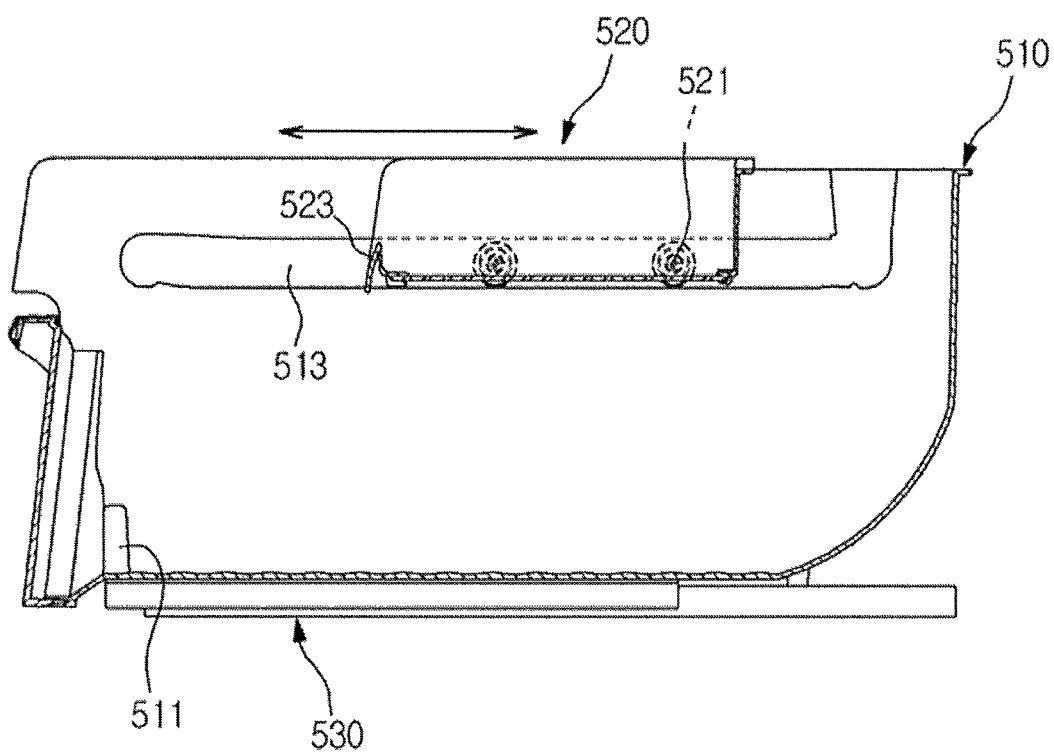
FIG. 33 is a view of a state in which the second storage box is moved in FIG. 32.
Figure 34:
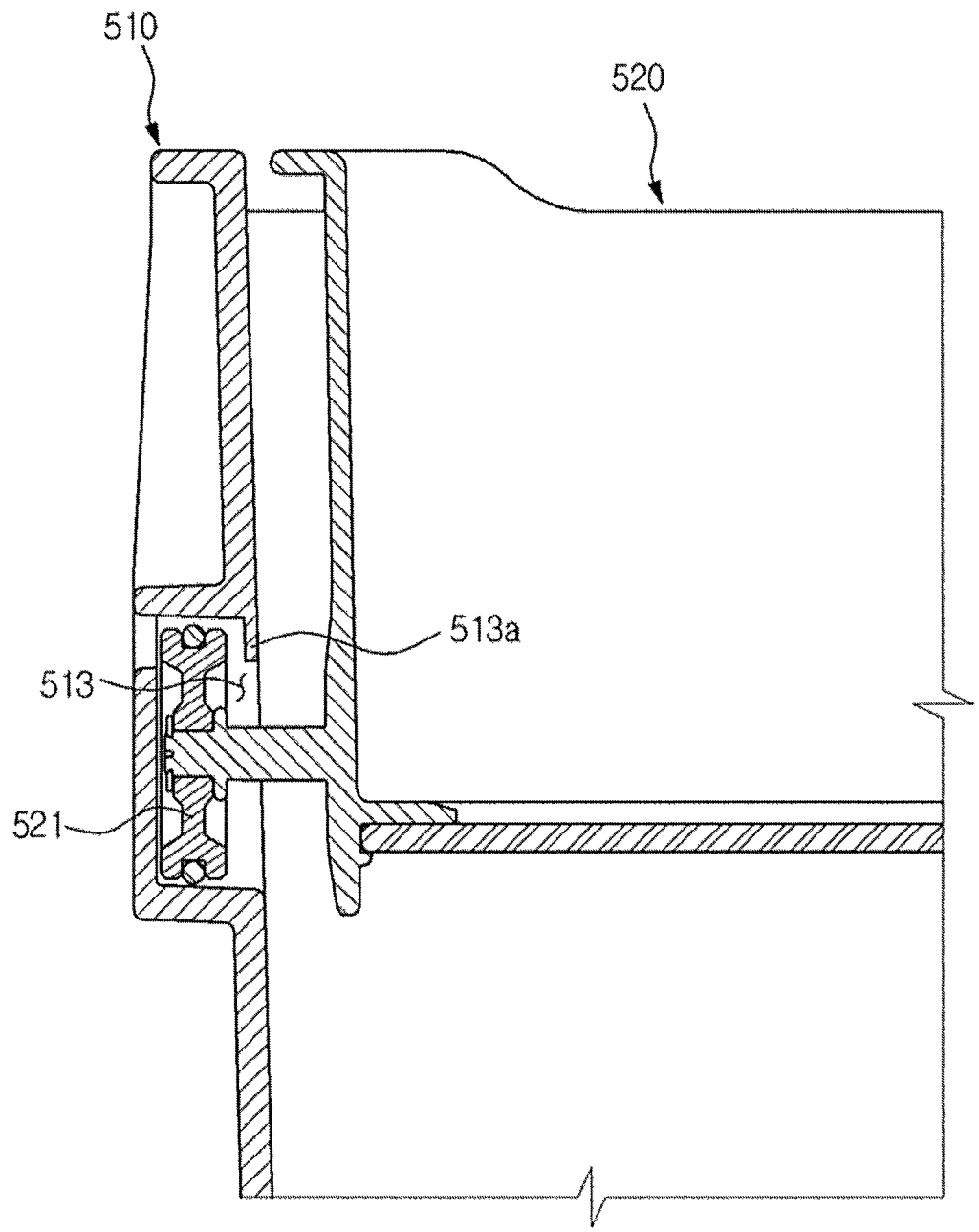
FIG. 34 is a view of a state in which the second storage box is disposed in the first storage box according to an embodiment.
Figure 35:
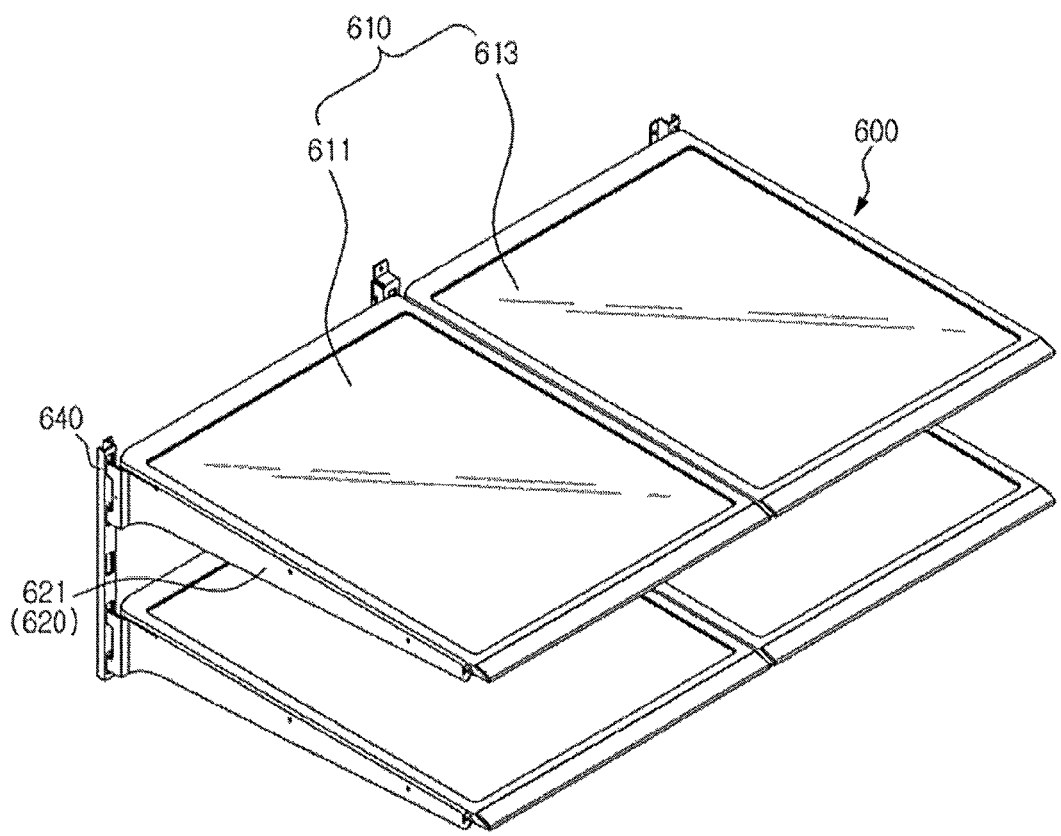
FIG. 35 is a view of a shelf unit according to an embodiment.
Figure 36:
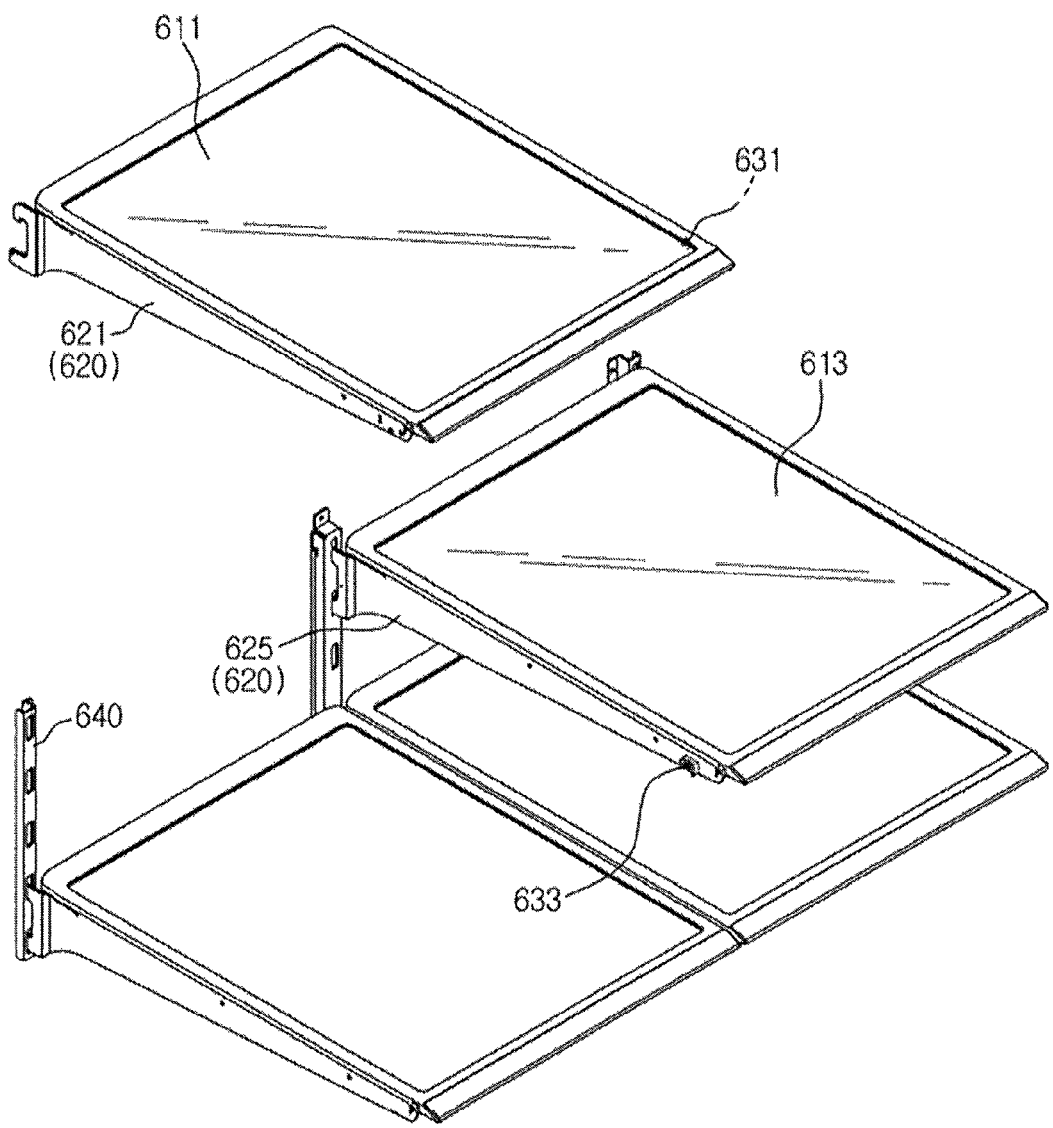
FIG. 36 is a view of a state in which a first shelf is separated from a support portion in FIG. 35.
Figure 37:
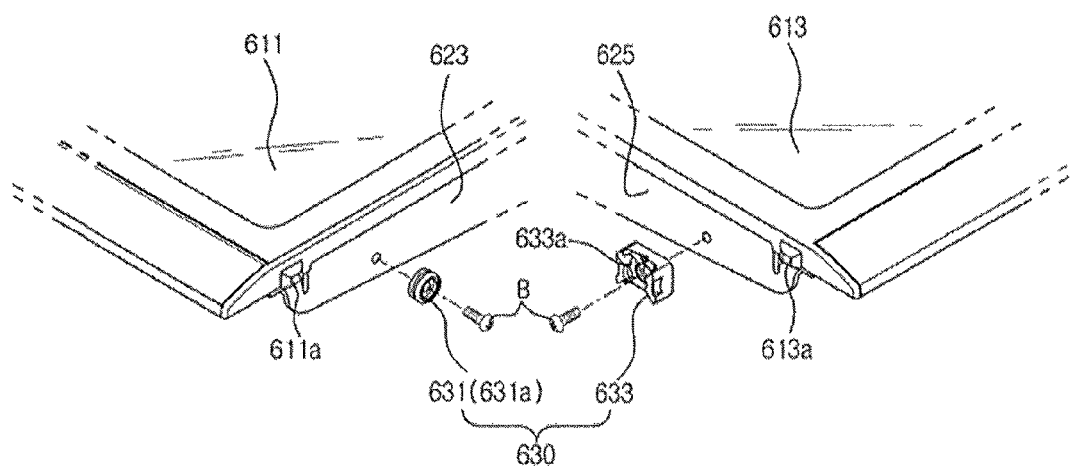
FIG. 37 is a view of a state in which a horizontal maintaining portion according to an embodiment is coupled to a bracket.
Figure 38:
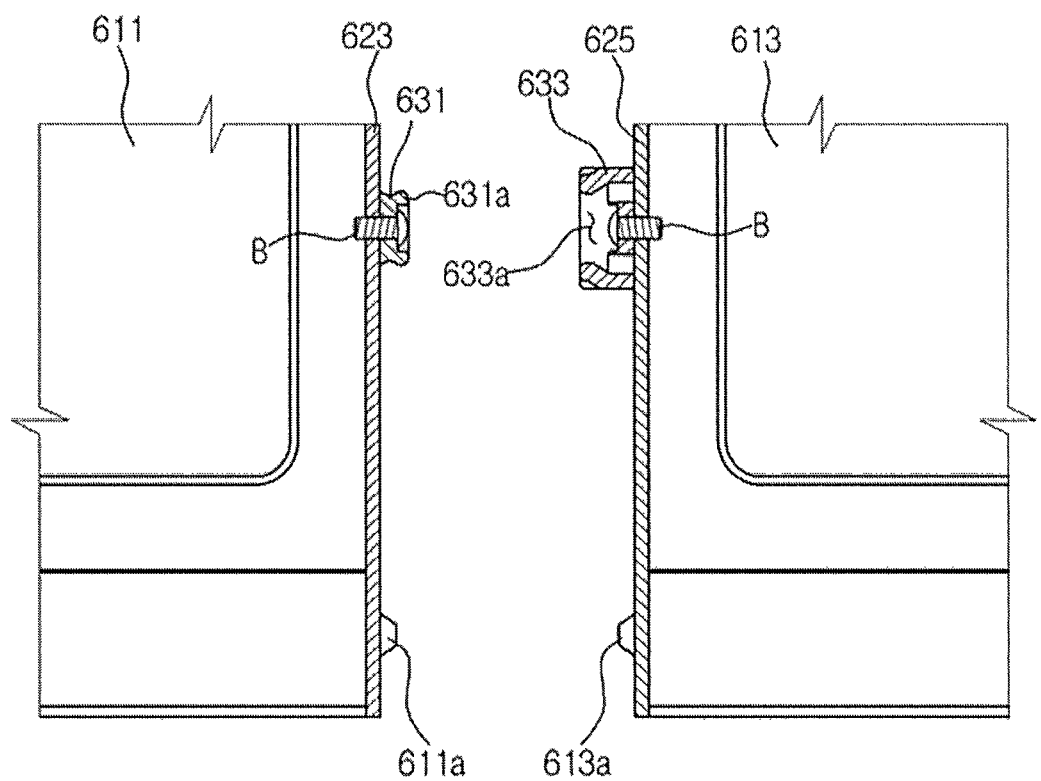
FIG. 38 is a view of a state in which the horizontal maintaining portion according to an embodiment is coupled to a shelf according to an embodiment.
Figure 39:
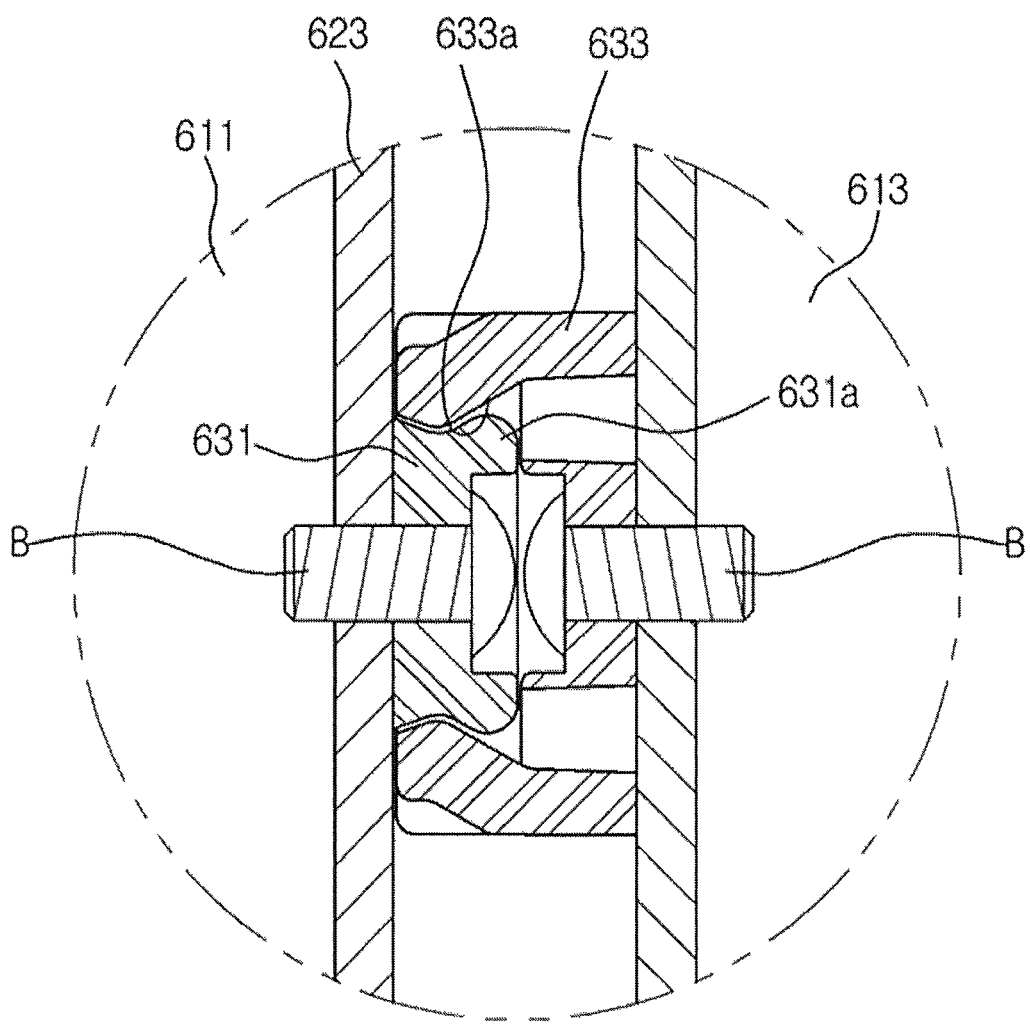
FIG. 39 is a view of a state in which a fixing protrusion according to an embodiment is inserted into a fixing groove.
Figure 40:
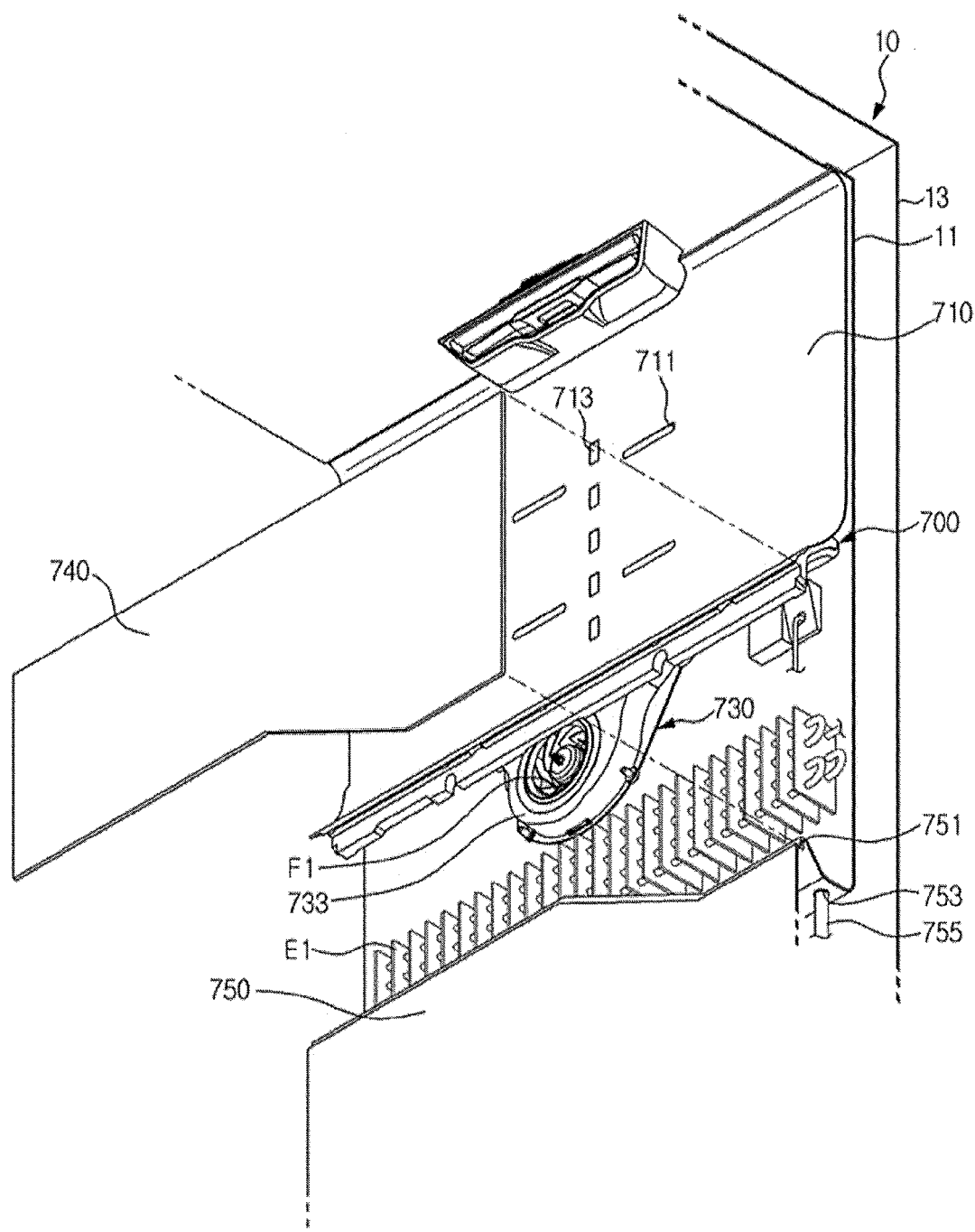
FIG. 40 is a view of an inside of an upper storage compartment according to an embodiment.
Figure 41:
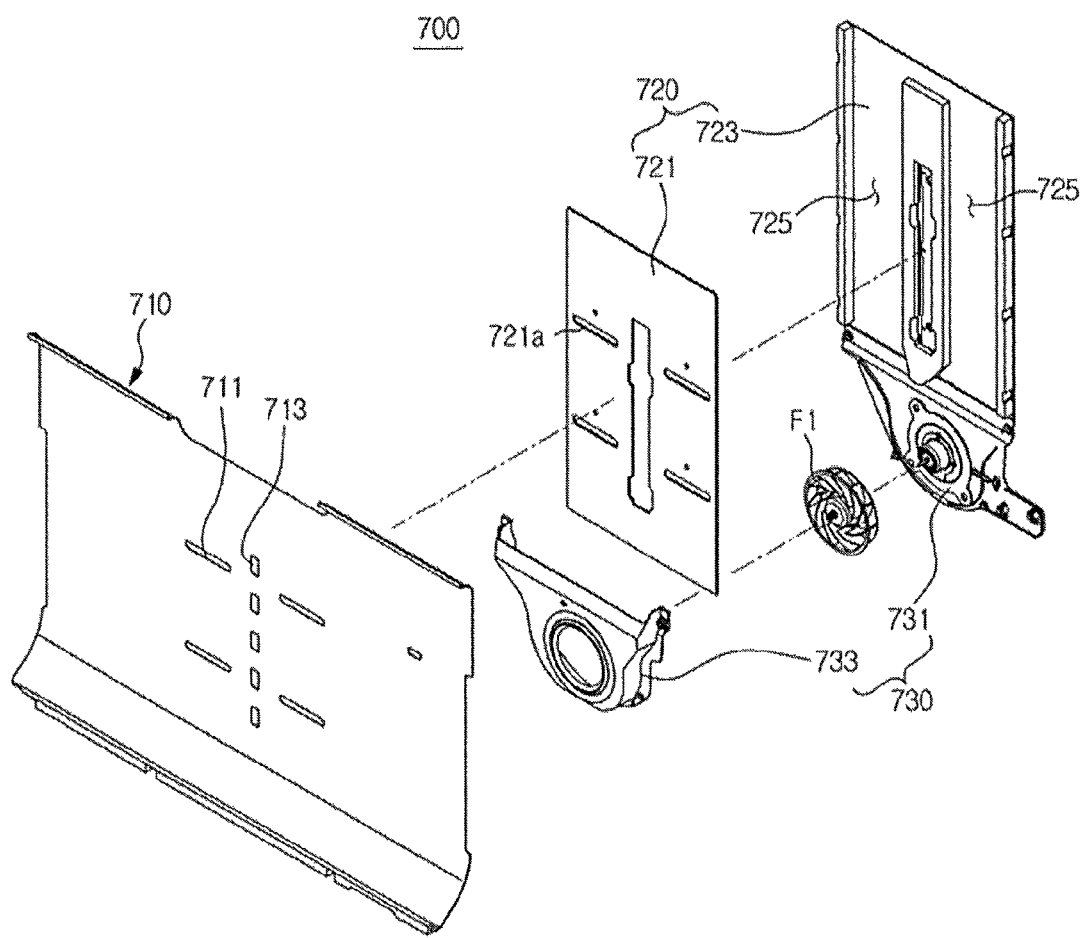
FIG. 41 is an exploded perspective view of a first cold air duct according to an embodiment.
Figure 42:
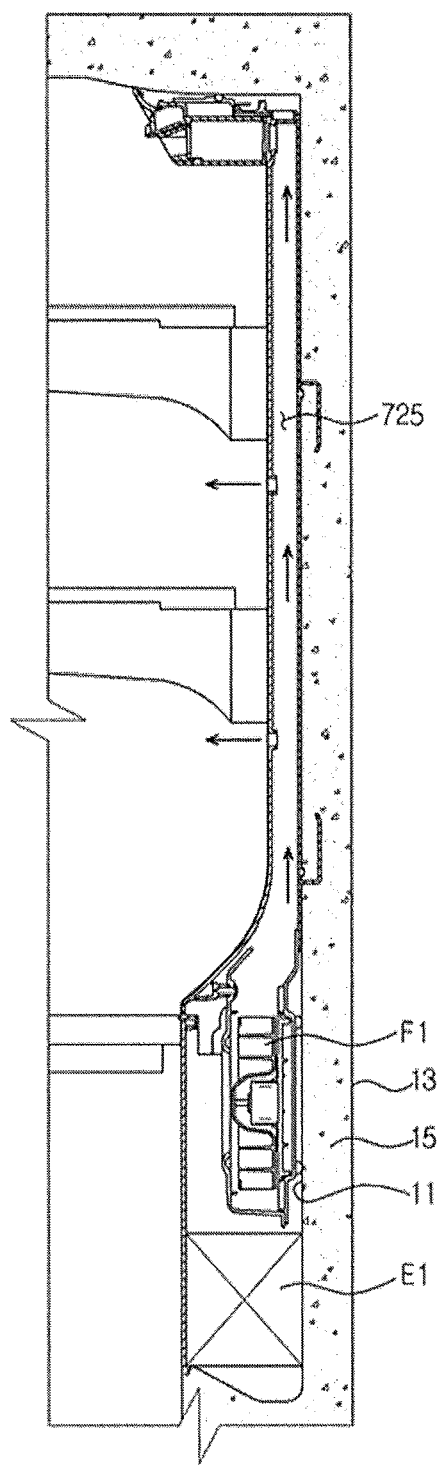
FIG. 42 is a view of a state in which the first cold air duct is disposed at the refrigerator according to an embodiment.

As illustrated in FIGS. 8 and 9, a reinforcement frame 200 is disposed at the front side of the body 10 so as to supplement the deteriorated rigidity of the body 10.

The reinforcement frame 200 is disposed at a front side of the inner case 11 and supplements rigidity of the body 10. The reinforcement frame 200 includes an upper reinforcement frame 210 coupled to an upper portion of the front side of the inner case 11, an intermediate reinforcement frame 220 coupled to a central portion of the front side of the inner case 11 to which the first partition 17a is coupled, a lower reinforcement frame 230 coupled to a lower portion of the front side of the inner case 11, and a first side reinforcement frame 240 and a second side reinforcement frame 250 coupled to both sides of the front side of the inner case 11.

The first side reinforcement frame 240 is disposed at an upper portion of both sides of the front side of the inner case 11, and a part of a top end of the first side reinforcement frame 240 is disposed to overlap the upper reinforcement frame 210, and a bottom end of the first side reinforcement frame 240 is disposed to extend from the top end of the first side reinforcement frame 240 to a space between the intermediate reinforcement frame 220 and the lower reinforcement frame 230.

The second side reinforcement frame 250 is disposed at a lower portion of both sides of the front side of the inner case 11, and a bottom end of the second side reinforcement frame 250 is coupled to the lower reinforcement frame 230, and a top end of the second side reinforcement frame 250 is disposed to extend from the bottom end of the second side reinforcement frame 250 to a position at which the top end of the second side reinforcement frame 250 is spaced a predetermined distance apart from the bottom end of the first side reinforcement frame 240.

As illustrated in FIGS. 1 through 3, an electric apparatus box 300 in which electric apparatus components for controlling an operation of the refrigerator are accommodated, is disposed in the front of the upper portion of the body 10.

As illustrated in FIGS. 10 through 14, the electric apparatus box 300 includes a base 310 installed to cover an electric apparatus box installation hole 13a disposed in the front of the upper portion of the body 10, a cover 320 that covers an upper portion of the base 310 so that an accommodation space S can be formed in the upper portion of the base 310, a printed circuit board (PCB) 330 which is disposed in the accommodation space S and on which electronic components 331 are mounted, a PCB mounting portion 340 on which the PCB 330 is mounted, and a reinforcement plate 350 disposed between the PCB mounting portion 340 and the cover 320.

The base 310 includes a base portion 311 coupled to the front of the upper portion of the body 10 and an accommodation groove 317 accommodated in the electric apparatus box installation hole 13a when the base portion 311 is coupled to the front of the upper portion of the body 10.

The base portion 311 forms edges of the accommodation groove 317 having a rectangular shape, and a plurality of fixing hooks 313 are disposed at a front edge and a rear edge of the accommodation groove 317, and a wire through hole 315 through which wires 333 connected to the PCB 330 may be connected to the inside of the body 10, is disposed in the rear of both sides of the base portion 311.

Each of the plurality of fixing hooks 313 includes a plurality of first fixing hooks 313a disposed at the front edge of the accommodation groove 317 and a plurality of second fixing hooks 313b disposed at the rear edge of the accommodation groove 317.

The plurality of first fixing hooks 313a are inserted into and fixed to the upper reinforcement frame 210 coupled to the upper portion of the front side of the inner case 11, and the plurality of second fixing hooks 313b are inserted into and fixed to a rear edge of the electric apparatus box installation hole 13a.

Since the first fixing hooks 313a and the second fixing hooks 313b disposed at the base portion 311 are fixed to the upper reinforcement frame 210 and the rear edge of the electric apparatus box installation hole 13a, respectively, the base 310 serves as an outer case when the base 310 is coupled to the front of the upper portion of the body 10, and the base 310 may be maintained in a fixed state without being moved, due to a foaming pressure when the insulating material 15 is foamed between the inner case 11 and the outer case 13.

Since the accommodation groove 317 is accommodated in the electric apparatus box installation hole 13a disposed in the front side of the upper portion of the body 10, the accommodation groove 317 has a shape in which it is recessed from the upper portion of the body 10 based on the upper portion of the body 10.

Since the accommodation groove 317 is disposed in the shape in which it is recessed from the upper portion of the body 10, a height of the accommodation space S disposed between the base 310 and the cover 320 may be increased, and a height of the electric apparatus box 300 disposed at the front side of the upper portion of the body 10 may be visually decreased.

The cover 320 is coupled to the upper portion of the base 310 so that the accommodation space S may be formed between the base 310 and the cover 320. The cover 320 includes a hinge cover portion 321 that covers an upper portion of the upper hinge 41 coupled to the upper portion of the body 10 so that the door 30 may be rotatably coupled to the body 10.

A plurality of PCBs 330 are disposed and are accommodated in the accommodation space S formed between the base 310 and the cover 320, and a plurality of electronic components 331 are mounted on a lower surface of each of the plurality of PCBs 330.

An upper surface of each of the plurality of PCBs 330 on which no electronic components 331 are mounted, is mounted on the PCB mounting portion 340, and the PCB mounting portion 340 is coupled to the cover 320.

Since the PCB mounting portion 340 on which the plurality of PCBs 330 are mounted, is coupled to the cover 320, the plurality of PCBs 330 are placed in the accommodation space S at a position that is the farthest from the upper storage compartment 21.

Since the plurality of PCBs 330 are placed in the accommodation space S at the position that is the farthest from the upper storage compartment 21, heat generated in the electronic components 331 mounted on the plurality of PCBs 330 can be prevented from being transferred to an inside of the upper storage compartment 21 as much as possible.

A connector coupling portion 341 is disposed at both sides of the PCB mounting portion 340, and a wire connector 335 to which the wires 333 connected to the PCBs 330 are fixed, is coupled to the connector coupling portion 341.

Thus, the wires 333 connected to the PCBs 330 are agglomerated and are fixed using the wire connector 335 coupled to the connector coupling portion 341, and the wires 333 agglomerated by the wire connector 335 are connected to the inside of the body 10 through the wire through hole 315 formed in the base 310.

Thus, the wires 333 connected to the PCBs 330 pass through the wire through hole 315 formed in the base 310 through both sides of the PCB mounting portion 340. The wires 333 that pass through the wire through hole 315 may be connected to the inside of the body 10 via a hinge hole 41*a* of the upper hinge 41.

The reinforcement plate 350 formed of a steel material is disposed between the PCB mounting portion 340 on which the plurality of PCBs 330 are mounted, and the cover 320.

The reinforcement plate 350 reduces shock transferred to the plurality of PCBs 330 accommodated in the accommodation space S when the shock is applied to an upper portion of the electric apparatus box 300, thereby protecting the electronic components 331.

Also, when a fire breaks out in the electronic components 331 mounted on the plurality of PCBs 330, the reinforcement plate 350 prevents the fire from being spread toward an outside of the electric apparatus box 300 so that the risk of a fire accident can be reduced.

As illustrated in FIGS. 15 through 19, a heating pipe 400 for preventing dew condensation that occurs in the outer case 13 is disposed at the front edge of the inner case 11 of the body 10.

When the refrigerator operates, cold air in the storage compartment 20 flows into the outer case 13 that constitutes the exterior of the body 10 so that dew condensation may occur in the outer surface of the outer case 13 due to a difference in temperatures of an inside and an outside of the outer case 13.

In order to prevent dew condensation that occurs in the outer surface of the outer case 13, the heating pipe 400 through which a high-temperature refrigerant flows, is fixed to the front edge of the inner case 11.

A plurality of mounting portions 410 on which the heating pipe 400 is mounted, are disposed at the front edge of the inner case 11.

The plurality of mounting portions 410 disposed at the front edge of the inner case 11 may be disposed most adjacent to the outer case 13 when the inner case 11 and the outer case 13 are coupled to each other.

Since the mounting portions 410 are disposed most adjacent to the outer case 13, the heating pipe 400 mounted on the mounting portions 410 may be disposed at a position at which the heating pipe 400 is spaced apart from the inside of the storage compartment 20 as much as possible and may be disposed most adjacent to the outer case 13.

Since the heating pipe 400 is disposed at the position at which it is spaced apart from the inside of the storage compartment 20 as much as possible, the possibility that high-temperature heat generated by the high-temperature refrigerant that flows through an inside of the heating pipe 400 will be transferred to the inside of the storage compartment 20, can be reduced.

When the high-temperature heat is transferred to the inside of the storage compartment 20, due to the high-temperature heat, the temperature of the inside of the storage compartment 20 rises and thus, energy is consumed so as to lower the temperature of the inside of the storage compartment 20.

Since the possibility that the high-temperature heat will be transferred to the inside of the storage compartment 20 is reduced by spacing the heating pipe 400 apart from the inside of the storage compartment 20 as much as possible, a rising width of the temperature of the inside of the storage compartment 20 may be reduced so that consumption of energy for lowering the temperature of the inside of the storage compartment 20 can be reduced.

Also, since the heating pipe 400 is disposed most adjacent to the outer case 13, even when the high-temperature heat generated by the high-temperature refrigerant that flows through the inside of the heating pipe 400 is well transferred to the outer case 13 and the cold air in the storage compartment 20 flows into the outer case 13, the temperature difference between the outside and the inside of the outer case 13 is reduced so that dew condensation that occurs in the outer surface of the outer case 13 can be prevented.

The heating pipe 400 mounted on the mounting portions 410 may be fixed to the mounting portions 410 using a plurality of clips 430. A fixing groove 420 to which the plurality of clips 430 are fixed, is disposed in a part of the plurality of mounting portions 410.

The fixing groove 420 includes a first fixing groove 421 and a second fixing groove 423 to which both ends of the clips 430 are inserted and fixed. The clips 430 include a first fixing portion 431 inserted into and fixed to the first fixing groove 421 and a second fixing portion 433 inserted into and fixed to the second fixing groove 423.

The clips 430 are fixed to the fixing groove 420 so that the heating pipe 400 may be accommodated in the clips 430, and the heating pipe 400 is fixed to the mounting portions 410.

Since the heating pipe 400 is fixed to the mounting portions 410 using the clips 430 in a state in which the heating pipe 400 is mounted on the mounting portions 410, the heating pipe 400 can be easily fixed to the front edge of the inner case 11.

As illustrated in FIGS. 1 and 2, a storage unit 500 is disposed in the storage compartment 20 and slides in the forward/backward direction.

The storage unit 500 may be disposed in the left storage compartment 25 or the right storage compartment 26 of the lower storage compartment 23, and for conveniences, the storage unit 500 disposed in the right storage compartment 26 will now be described.

As illustrated in FIGS. 20 through 27 and 31, the storage unit 500 includes a first storage box 510 that is supported at both sidewalls of the right storage compartment 26 and slides in the forward/backward direction, a second storage box 520 that is disposed in the first storage box 510 and slides in the forward/backward direction, and a sliding shelf 530 that causes the first storage box 510 to be inserted into the right storage compartment 26 and to be taken out from the right storage compartment 26 in a sliding manner.

The sliding shelf 530 is coupled to a lower portion of the first storage box 510 so that the first storage box 510 can be inserted into and taken out from the right storage compartment 26.

A coupling portion 26*a* for coupling a cover rail 550 may be disposed at both sidewalls of the right storage compartment 26. The coupling portion 26*a* may be integrally disposed at both sidewalls of the right storage compartment 26.

The coupling portion 26*a* is disposed in such a way that the cover rail 550 may be inserted into the coupling portion 26*a* in the sliding manner.

A procedure in which the sliding shelf 530 is installed, will now be described. First, the cover rail 550 of the sliding shelf 530 is pushed to the coupling portion 26*a* in the sliding manner, and a fastening member B is inserted into a fastening hole 551 formed in the cover rail 550 so that the cover rail 550 may be coupled to the coupling portion 26*a*.

When the cover rail 550 is coupled to the coupling portion 26*a*, a slide unit 540 is taken out from an outside of the right storage compartment 26 and then, the first storage box 510 is coupled to the slide unit 540 so that a coupling protrusion 541*a* disposed on the slide unit 540 may be inserted into a coupling groove 511 of the first storage box 510.

When the first storage box 510 is coupled to the slide unit 540, the slide unit 540 is guided along the cover rail 550 in the sliding manner so that the first storage box 510 can be inserted into and taken out from the inside of the right storage compartment 26.

Since the sliding shelf 530 is coupled to a lower portion of the first storage box 510, the first storage box 510 may be fully taken out toward the outside of the right storage compartment 26 so that food stored in the first storage box 510 can be easily taken out and used.

Also, since the sliding shelf 530 has a structure in which it is coupled to the lower portion of the first storage box 510, food can be directly kept in an upper portion of the sliding shelf 530 without coupling the first storage box 510 to the upper portion of the sliding shelf 530, and food can also be kept in the first storage box 510 by coupling the first storage box 510 to the upper portion of the sliding shelf 530.

Next, a configuration of the sliding shelf 530 will be described in detail.

As illustrated in FIGS. 20 through 27, the sliding shelf 530 includes the cover rail 550 coupled to both sidewalls of the right storage compartment 26, the slide unit 540 that slides along the cover rail 550, and a self closing unit 560 that is coupled to the slide unit 540 and transfers an elastic force in a direction in which the first storage box 510 is inserted into the right storage compartment 26, so that the first storage box 510 can be easily closed with a small force.

The slide unit 540 includes a sliding portion 541 coupled to the lower portion of the first storage box 510 and a slide rail 543 that is disposed at both sides of the sliding portion 541 and slides along the cover rail 550.

The coupling protrusion 541*a* is disposed at an upper portion of both sides of a front side of the sliding portion 541 and protrudes in an upward direction so that the first storage box 510 and the sliding portion 541 can be coupled to each other. The coupling groove 511 in which the coupling protrusion 541*a* is inserted, is disposed at a position corresponding to the coupling protrusion 541*a* in the first storage box 510.

The cover rail 550 is coupled to and fixed to the coupling portion 26*a*, as described above, and guides the first storage box 510 to be inserted into and taken out from the right storage compartment 26 in the sliding manner.

As illustrated in FIGS. 26 through 30, the self closing unit 560 includes a case 570 that is disposed at both sides of the lower portion of the sliding portion 541 and constitutes an exterior, an elastic unit 580 that is disposed in the case 570 and accumulates an elastic force when the first storage box 510 is taken out and that transfers the elastic force in a direction in which the first storage box 510 is inserted, when the first storage box 510 is inserted, and an oil damper 590 that is coupled to the elastic unit 580 and absorbs the shock that occurs when the first storage box 510 is inserted.

The elastic unit 580 includes a slider 581 that makes a straight motion in the case 570, a rotator 583 that is rotatably coupled to the slider 581, and an elastic member 585 having both ends connected to the slider 581 and the case 570.

The slider 581 includes a rotation hole 581*a* through which a rotation shaft 583*b* disposed on the rotator 583 that will be described below is rotatably coupled, a first fixing groove 581*b* to which the elastic member 585 is fixed, and a second fixing groove 581*c* to which the oil damper 590 is fixed.

The slider 581 makes a straight motion along a guide rail 571 that will be described below, together with the rotator 583. The elastic member 585 fixed to the first fixing groove 581*b* of the slider 581 is tensile through the straight motion so that the elastic member 585 can accumulate an elastic force.

The rotator 583 includes a protrusion portion 583*a* that protrudes from a lower portion of the rotator 583 in a downward direction so that the rotator 583 can be guided along the guide rail 571, a rotation shaft 583*b* that causes the rotator 583 to be rotatably coupled to the slider 581, and a hanging groove 583*c* in which a hanging member 553 disposed on the cover rail 550 is accommodated and is hung.

The protrusion portion 583*a* is disposed to protrude from the lower portion of the rotator 583 toward the guide rail 571 and is moved along the guide rail 571 so that the rotator 583 can be guided along the guide rail 571.

The rotation shaft 583*b* is disposed on the upper portion of the rotator 583 and is rotatably coupled to the rotation hole 581*a* of the slider 581.

The rotator 583 is disposed to rotate around the rotation shaft 583*b* due to the rotation shaft 583*b* and makes a straight motion in a predetermined section together with the slider 581 and rotates.

The hanging groove 583*c* is disposed in such a way that the hanging member 553 disposed on the cover rail 550 can be hung in the hanging groove 583*c* and when the first storage box 510 is inserted into and taken out from the right storage compartment 26, the rotator 583 that is moved together with the first storage box 510 can be moved along the guide rail 571.

Since the hanging member 553 disposed on the cover rail 550 fixed to the coupling portion 26*a* of the right storage compartment 26 is maintained in a fixed state, when the first storage box 510 is inserted into and taken out from the right storage compartment 26, if the hanging member 553 is hung in the hanging groove 583*c* of the rotator 583, the rotator 583 is moved along the guide rail 571.

The elastic member 585 may be disposed as a spring, and both ends of the elastic member 585 are fixed to the case 570 and the slider 581, respectively.

A portion of both ends of the elastic member 585 fixed to the case 570 is maintained in the fixed state, and a portion of both ends of the elastic member 585 fixed to the slider 581 is moved together with the slider 581 when the slider 581 makes a straight motion, is tensile, is returned to its original state, and transfers the elastic force to the first storage box 510.

The case 570 is disposed at the lower portion of the sliding portion 541 and constitutes an exterior. The elastic unit 580 and the oil damper 590 are accommodated in the case 570.

The guide rail 571 in which the protrusion portion 583*a* of the rotator 583 is accommodated and is moved, a guide portion 573 that is a path on which the hanging member 553 moved together with the rotator 583 is moved, a fixing portion 575 to which the elastic member 585 is fixed, a first accommodation portion 577 in which the elastic member 585 is accommodated, and a second accommodation portion 579 in which the oil damper 590 is accommodated, are disposed in the case 570.

The guide rail 571 is disposed in such a way that the protrusion portion 583*a* disposed on the rotator 583 can be accommodated and moved, and the rotator 583 and the slider 581 are guided on the guide rail 571, as described above.

The guide rail 571 includes a straight path 571*a* on which the rotator 583 is guided to make a straight motion in the forward/backward direction, and a hanging portion 571*b* disposed on one end of the straight path 571*a* so that the rotator 583 can rotate and can be fixed.

The guide portion 573 is disposed to be parallel to the straight path 571*a* of the guide rail 571 and guides the hanging member 553 that is hung in the hanging groove 583*c* of the rotator 583 and is moved together with the rotator 583, to make a straight motion.

The oil damper 590 includes a body portion 591 that is filled with oil and is accommodated in the second accommodation portion 579 of the case 570, and a movement portion 593 that is accommodated in the body portion 591 and has one end fixed to the second fixing groove 581*c* of the slider 581.

Since one end of the movement portion 593 is fixed to the slider 581, the movement portion 593 is moved together with the slider 581.

Since, when the first storage box 510 is inserted into and taken out from the right storage compartment 26, the slider 581 is also moved together with the first storage box 510 in the same direction as that of the first storage box 510, when the first storage box 510 is inserted into the right storage compartment 26, the movement portion 593 is inserted into the body portion 591, and when the first storage box 510 is taken out from the right storage compartment 26, the movement portion 593 is also taken out from an inside of the body portion 591 outwards.

Since, when the movement portion 593 is taken out from and is inserted into the inside of the body portion 591, the movement portion 593 absorbs shock through the oil filled in the body portion 591, a rapid movement of the elastic unit 580 that occurs when the first storage box 510 is inserted into the right storage compartment 26, can be prevented due to the elastic force of the elastic unit 580.

Thus, the shock that occurs when the first storage box 510 is rapidly inserted into the right storage compartment 26, is absorbed due to the elastic force of the elastic unit 580 so that noise can be reduced.

The body portion 591 is maintained in a state in which it is accommodated in the second accommodation portion 579 of the case 570, and only the movement portion 593 is moved together with the slider 581, and a hanging jaw 579*a* is disposed on the second accommodation portion 579 so that the movement portion 593 can be taken out from and inserted into the inside of the body portion 591 through the hanging jaw 579*a*.

The hanging jaw 579*a* is disposed in such a way that a space which the body portion 591 does not pass through and only the movement portion 593 may pass through is formed, and when the movement portion 593 is moved together with the slider 581, the body portion 591 is hung in the hanging jaw 579*a* so that movement can be prevented.

The first storage box 510 is inserted into and taken out from the right storage compartment 26 in a sliding manner by using the sliding shelf 530.

As illustrated in FIGS. 31 through 34, the first storage box 510 includes a coupling groove 511 into which the coupling protrusion 541*a* of the sliding shelf 530 is inserted and is coupled, a guide rail 513 on which the second storage box 520 is guided to slide in the forward/backward direction, and a first storage box handle 515 through which the first storage box 510 is grasped by a user and is inserted into and taken out from the right storage compartment 26.

The guide rail 513 is disposed at both sides of an inside of the first storage box 510, and the second storage box 520 is guided on the guide rail 513 so as to slide in the forward/backward direction.

The guide rail 513 may be disposed to have a shape in which it is recessed from both sides of the inside of the first storage box 510 toward an outside of the first storage box 510.

The second storage box 520 is accommodated in the first storage box 510 and slides in the forward/backward direction. The second storage box 520 includes a roller 521 that causes the second storage box 520 to be guided along the guide rail 513 disposed in the first storage box 510 and to slide in the forward/backward direction in the first storage box 510, and a second storage box handle 523 through which the second storage box 520 is grasped by the user and may be moved in the forward/backward direction in the first storage box 510.

The roller 521 may be disposed at a lower portion of both sides of an outside of the second storage box 520 and is guided along the guide rail 513 disposed in the first storage box 510, and an escape prevention jaw 513*a* may be disposed on an upper portion of the guide rail 513 so that escape of the roller 521 can be prevented.

Since the second storage box 520 is accommodated in the first storage box 510 and slides in the forward/backward direction, the guide rail 513 disposed at both sides of the inside of the first storage box 510 is disposed at a position at which the guide rail 513 is spaced apart from an upper edge surface of the first storage box 510 in the downward direction by a distance at which an upper edge surface of the second storage box 520 and the roller 521 are spaced apart from each other.

When the first storage box 510 is inserted into and taken out from the right storage compartment 26, the second storage box 520 may be inserted into and taken out from the right storage compartment 26 together with the first storage box 510. Since the second storage box 520 is disposed to slide in the forward/backward direction in the first storage box 510, an internal space of the first storage box 510 can be efficiently used.

As illustrated in FIGS. 1 and 2, the plurality of shelf units 600 may be disposed in the upper storage compartment 21 so that the upper storage compartment 21 can be partitioned off into a plurality of parts.

As illustrated in FIGS. 35 through 39, the plurality of shelf units 600 include a shelf 610 including a first shelf 611 and a second shelf 613, a bracket 620 that is coupled to both sides of the first shelf 611 and both sides of the second shelf 613 and supports the first shelf 611 and the second shelf 613, and a leveling portion 630 that is disposed at the bracket 620 and levels the first shelf 611 and the second shelf 613.

The shelf 610 includes the first shelf 611 disposed at the left side of the upper storage compartment 21 and the second shelf 613 disposed at the right side of the upper storage compartment 21. The first shelf 611 and the second shelf 613 are leveled with respect to each other and partition off the upper storage compartment 21.

A first protrusion portion 611a may be disposed at a front end of a right surface of the first shelf 611, and a second protrusion portion 613a may be disposed at a front end of a left surface of the second shelf 613 so as to be spaced apart from the first protrusion portion 611a by a predetermined distance.

The first protrusion portion 611a and the second protrusion portion 613a are maintained to be spaced apart from each other by a predetermined distance. When the first shelf 611 is twisted in a right direction or the second shelf 613 is twisted in a left direction, the first protrusion portion 611a and the second protrusion portion 613a contact each other.

When the first shelf 611 is twisted in the right direction, the first protrusion portion 611a contacts the second protrusion portion 613a so that the first shelf 611 is not twisted in the right direction any more. When the second shelf 613 is twisted in the left direction, the second protrusion portion 613a contacts the first protrusion portion 611a so that the second shelf 613 is not twisted in the left direction any more and the first shelf 611 and the second shelf 613 can be prevented from being twisted in a horizontal direction.

The bracket 620 includes a first bracket 621 that is coupled to the left surface of the first shelf 611 and supports the first shelf 611, a second bracket 623 that is coupled to the right surface of the first shelf 611 and supports the first shelf 611, a third bracket 625 that is coupled to the left surface of the second shelf 613 and supports the second shelf 613, and a fourth bracket (not shown) that is coupled to the right surface of the second shelf 613 and supports the second shelf 613.

The bracket 620 may be supported by a support portion 640 disposed between the first cold air duct 700 and the inner case 11 through a shelf unit fixing hole 713 formed in the first cold air duct 700.

Food is stacked on upper portions of the first shelf 611 and the second shelf 613 and is stored therein. Types of food stored in the upper portion of the first shelf 611 and the upper portion of the second shelf 613 may be different from each other.

If the type of food stored in the upper portion of the first shelf 611 and the type of food stored in the upper portion of the second shelf 613 are different from each other, weights of the food are different from each other. Thus, the first shelf 611 and the second shelf 613 may not be leveled, and one shelf 610 may sag in the downward direction.

As described above, the leveling portion 630 is disposed at the bracket 620 that supports the shelf 610 so that one shelf 610 of the first shelf 611 and the second shelf 613 may not sag in the downward direction and may be leveled.

The leveling portion 630 includes a first fixing portion 631 coupled to the second bracket 623 that supports the right surface of the first shelf 611, and a second fixing portion 633 coupled to the third bracket 625 that supports the left surface of the second shelf 613.

The first fixing portion 631 and the second fixing portion 633 may be coupled to the second bracket 623 and the third bracket 625 by using a fastening member B, and a fixing protrusion 631a may be disposed at the first fixing portion 631, and a fixing groove 633a may be disposed in the second fixing portion 633.

The first fixing portion 631 is disposed at the right surface of the second bracket 623, and the second fixing portion 633 is disposed at the left surface of the third bracket 625, and the fixing protrusion 631a and the fixing groove 633a are disposed to correspond to each other when the first shelf 611 and the second shelf 613 are leveled.

Since the fixing protrusion 631a and the fixing groove 633a are disposed to correspond to each other and the fixing protrusion 631a is disposed to be inserted into the fixing groove 633a and fixed thereto, when the fixing protrusion 631a is inserted into and fixed to the fixing groove 633a, the first shelf 611 and the second shelf 613 are leveled.

Also, since the fixing protrusion 631a is inserted into and fixed to the fixing groove 633a, even though the first shelf 611 and the second shelf 613 in a state in which different types of food are stored, are used for a long time, one of the first shelf 611 and the second shelf 613 may be prevented from sagging in the downward direction and thus, the first shelf 611 and the second shelf 613 may be leveled.

As illustrated in FIGS. 2 and 3 and 40 through 42, the first evaporator E1 and the first blower fan F1 that supply the cold air to the upper storage compartment 21 are disposed between the first cold air duct 700 and the inner case 11.

The first cold air duct 700 includes a front plate 710 in which a plurality of first cold air outlets 711 are disposed, a cold air flow path portion 720 that is disposed at a rear side of the front plate 710 and constitutes the first flow path 725 on which the cold air is moved, and a first blower fan mounting portion 730 disposed at a lower portion of the cold air flow path portion 720.

The front plate 710 is formed of an aluminum material so that the front plate 710 can be uniformly cooled by the cold air in the upper storage compartment 21 through thermal conduction and the inside of the upper storage compartment 21 can be maintained at a uniform temperature.

The plurality of first cold air outlets 711 through which the cold air guided through the first flow path 725 is discharged into the upper storage compartment 21, and the shelf unit fixing hole 713 for fixing the shelf unit 600 are disposed on the front plate 710.

A lower portion of the front plate 710 is disposed in a streamline form that is bent in a direction of the upper storage compartment 21 as the front plate 710 gets closer to the downward direction. This is to provide a space in which the first blower fan F1 may be installed, in an upper portion of the first evaporator E1 so as to be adjacent to the first evaporator E1.

Since the first blower fan F1 is disposed at the lower portion of the front plate 710, the remaining portions except for the lower portion of the front plate 710 may be provided in a flat plate form.

A barrier wall 740 that constitutes the space in which the first evaporator E1 and the first blower fan F1 are installed at a lower portion of the rear side of the upper storage compartment 21, is disposed at the lower portion of the front plate 710.

Since the barrier wall 740 constitutes the space in which the first evaporator E1 and the first blower fan F1 are installed, the barrier wall 740 is disposed to be further spaced apart from the inner case 11 than a spaced distance between the first cold air duct 700 and the inner case 11.

Thus, an upper portion of the barrier wall 740 may be in close contact with the lower portion of the front plate 710 disposed to be bent in the streamline form so that the space between the first cold air duct 700, the barrier wall 740, and the inner case 11 and the upper storage compartment 21 can be sealed.

The cold air flow path portion 720 includes a first cold air flow path portion 721 in which a plurality of discharge holes 721a corresponding to the plurality of first cold air outlets 711 are disposed and which is disposed at the rear side of the front plate 710, and a second cold air flow path portion 723 that is coupled to a rear side of the first cold air flow path portion 721 and causes the first flow path 725 to be formed between the second cold air flow path portion 723 and the first cold air flow path portion 721.

The first blower fan mounting portion 730 is disposed at a lower portion of the cold air flow path portion 720 and includes a housing 731 on which the first blower fan F1 is rotatably mounted, and a cover member 733 that covers an open front side of the housing 731.

A drainage portion 750 for draining condensed water generated in the first evaporator E1 is disposed at the lower portion of the first evaporator E1. The drainage portion 750 is disposed to have an inclined surface 751 that is inclined in the downward direction as it gets closer to a right side of the drainage portion 750 based on a central part of the drainage portion 750, and a drainage hole 753 is formed in a distal end of the inclined surface 751.

A drainage pipe 755 for draining the condensed water toward the outside of the body 10 is disposed in the drainage hole 753. The drainage pipe 755 may be disposed between the inner case 11 and the outer case 13 of the right surface of the body 10.

Since the drainage pipe 755 is disposed between the inner case 11 and the outer case 13 of the side of the body 10 (not between the inner case 11 and the outer case 13 of the rear side of the body 10), when the insulating material 15 is foamed in the space between the inner case 11 and the outer case 13 of the rear side of the body 10, the insulating material 15 may flow smoothly. A configuration in which the insulating material 15 is foamed in the space between the inner case 11 and the outer case 13 of the rear side of the body 10, will be described below.

Figure 43:
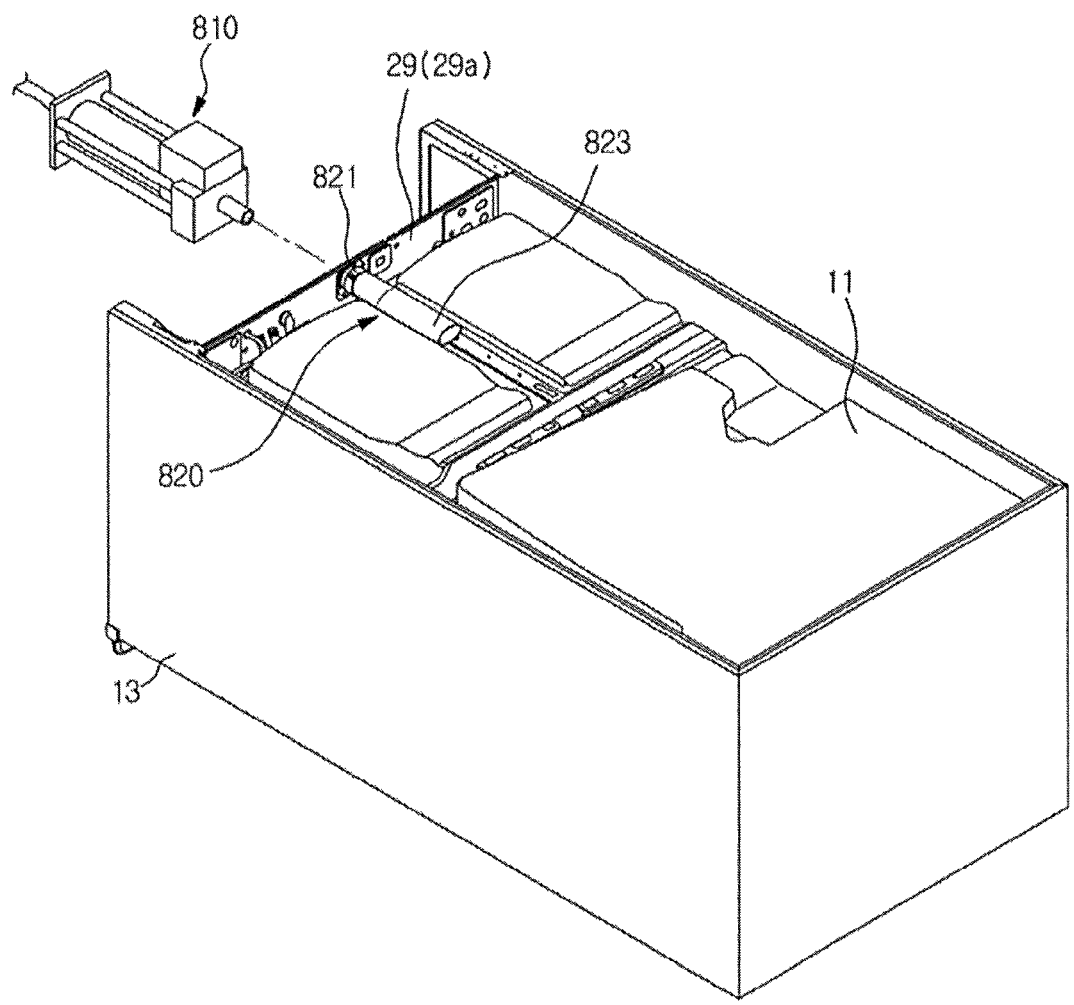
FIG. 43 is a view of a state in which a straight guide member is disposed at the refrigerator according to an embodiment.

As illustrated in FIGS. 2 and 43, the machine compartment 28 disposed at the lower side of the rear of the body 10 may be covered by the machine compartment cover 29.

The machine compartment cover 29 includes a machine compartment upper cover 29a that covers the front side and the upper portion of the machine compartment 28 and a machine compartment rear cover 29b that covers the rear side of the machine compartment 28.

In the drawings, an insulating material inlet 29c that will be described below is disposed at a position at which the insulating material 15 is foamed in the space between the inner case 11 and the outer case 13 of the body 10. A space in which the insulating material 15 is filled, will be described as the space between the inner case 11 and the outer case 13.

However, the insulating material inlet 29c may be disposed at a position at which the insulating material 15 may be foamed in the door 30.

The insulating material 15 is foamed and filled in the space between the inner case 11 and the outer case 13 by using a foaming head 810.

The insulating material inlet 29c is disposed at the machine compartment upper cover 29a of the machine compartment cover 29 that covers the machine compartment 28 so as to foam the insulating material 15 in the space between the inner case 11 and the outer case 13.

The insulating material inlet 29c is disposed at a position corresponding to a space of the rear side of the body 10 so as to foam the insulating material 15 into the space of the rear side of the body 10 of the space between the inner case 11 and the outer case 13.

The insulating material inlet 29c is disposed in the middle of the machine compartment cover 29 so that the insulating material 15 foamed through the insulating material inlet 29c can be uniformly filled in the space between the inner case 11 and the outer case 13.

In order to foam the insulating material 15 in the space between the inner case 11 and the outer case 13, the foaming head 810 connected to the insulating material inlet 29c disposed at the machine compartment upper cover 29a and a guide member 820 connected to the insulating material inlet 29c in the space between the inner case 11 and the outer case 13 are disposed.

The foaming head 810 foams the insulating material 15 into the insulating material inlet 29c so that the insulating material 15 can be filled in the space between the inner case 11 and the outer case 13.

In the drawings, only one insulating material inlet 29c is disposed, and one foaming head 810 is configured to correspond to the insulating material inlet 29c. However, embodiments are not limited thereto, and a plurality of insulating material inlets may be disposed, and a plurality of foaming heads may be configured to correspond to the plurality of insulating material inlets.

When the foaming head 810 is connected to the insulating material inlet 29c and foams the insulating material 15, the insulating material 15 is foamed into the space between the inner case 11 and the outer case 13 from the insulating material inlet 29c and is filled therein. In a large refrigerator and a refrigerator having a thin insulation thickness wall in which a distance between the inner case 11 and the outer case 13 is narrow, the flow of the insulating material 15 is disturbed by an obstacle, such as a wire (not shown) in the space between the inner case 11 and the outer case 13 so that a discharge distance of the insulating material 15 is reduced and the entire space between the inner case 11 and the outer case 13 cannot be uniformly filled.

Also, in order to uniformly fill the entire space between the inner case 11 and the outer case 13, a quantity of the insulating material 15 foamed in the space between the inner case 11 and the outer case 13 need to be excessively injected compared to the volume of the space between the inner case 11 and the outer case 13.

If the insulating material 15 is excessively injected, a hardening time of the insulating material 15 foamed into the space between the inner case 11 and the outer case 13 is delayed, and a part of the insulating material 15 is exposed to an outside of the space between the inner case 11 and the outer case 13 so that the exterior and quality of the refrigerator is lowered. Since the insulating material 15 exposed to the outside of the space between the inner case 11 and the outer case 13 need to be removed, this is inconvenient, and a working time when the insulating material 15 is filled in the space between the inner case 11 and the outer case 13 is delayed, and when the foaming head 810 is not properly managed, a void phenomenon that a pore having a crater shape is generated on the surface of the insulating material 15 hardened in the space between the inner case 11 and the outer case 13, may occur.

In order to prevent the above-described problem, the guide member 820 is disposed in such a way that the insulating material 15 foamed by the foaming head 810 can be guided to a portion that extends by a predetermined section into the space between the inner case 11 and the outer case 13 rather than the insulating material inlet 39*c* without an interference, such as an obstacle.

One end of the guide member 820 is connected to the insulating material inlet 29*c* in the space between the inner case 11 and the outer case 13, and the other and of the guide member 820 extends into the space between the inner case 11 and the outer case 13, and the guide member 820 guides the insulating material 15 foamed by the foaming head 810.

Figure 44:
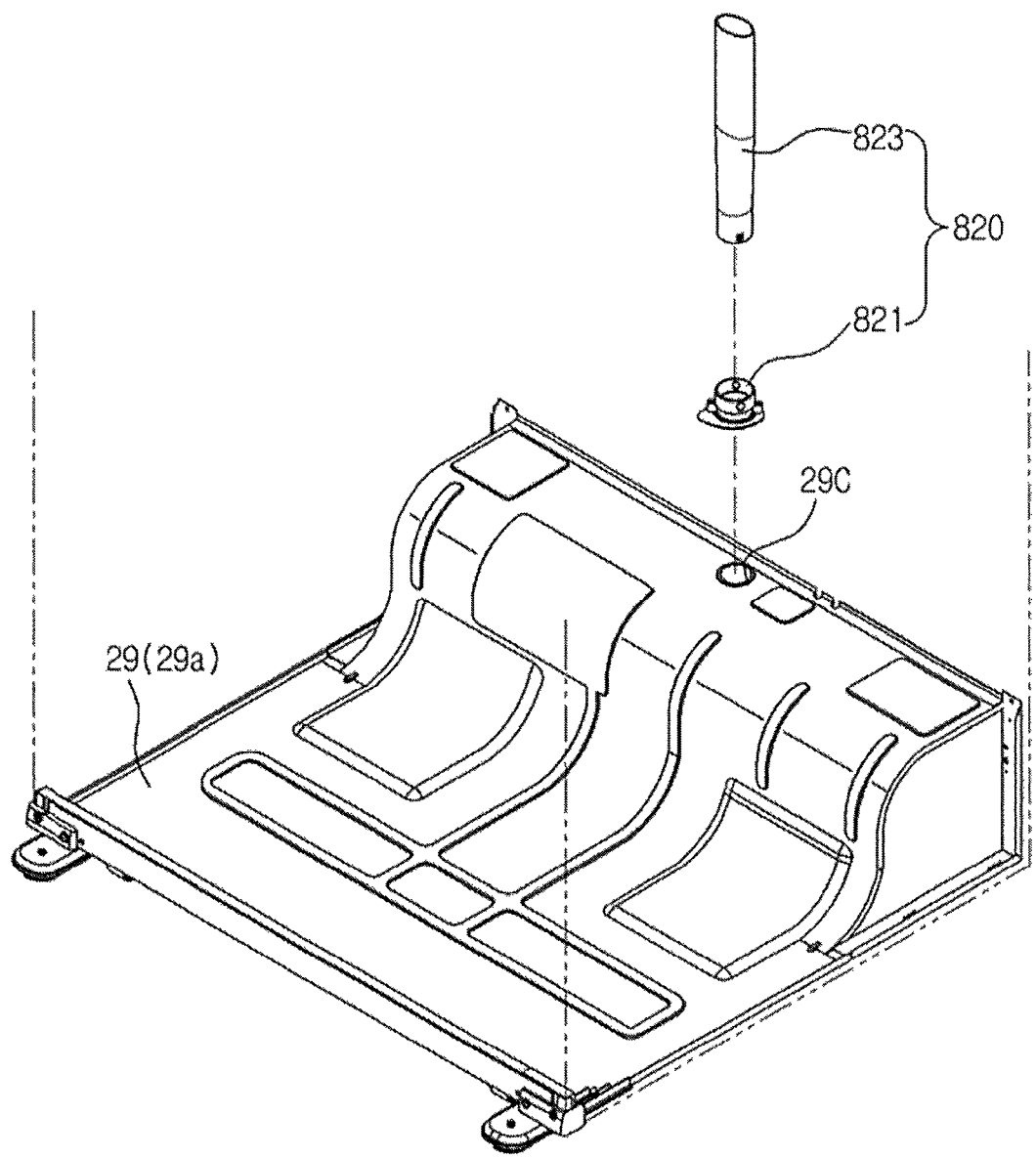
FIG. 44 is a view of a state in which the straight guide member of FIG. 43 is coupled to an insulating material inlet disposed in a machine compartment cover.

As illustrated in FIGS. 43 and 44, the guide member 820 includes a connector 821 coupled to the insulating material inlet 29*c* and a guide pipe 823 connected to the connector 821 so as to extend into the space between the inner case 11 and the outer case 13.

The guide pipe 823 is formed as a hollow, straight pipe and guides the insulating material 15 foamed by the foaming head 810 by a length of the guide pipe 823 in the space between the inner case 11 and the outer case 13 without an inference of an obstacle in the space between the inner case 11 and the outer case 13.

Since an initial discharge position of the insulating material 15 foamed by the foaming head 810 using the guide pipe 823 extends from the insulating material inlet 29*c* into the space between the inner case 11 and the outer case 13 by the length of the guide pipe 823 and the initial discharge position of the insulating material 15 extends from a bottom end of the rear side of the body 10 to a central part of the body 10, disturbance caused by the obstacle in the space between the inner case 11 and the outer case 13 is minimized. Since a high pressure of the insulating material 15 is maintained while the insulating material 15 passes through an inside of the guide pipe 823, the entire space between the inner case 11 and the outer case 13 can be uniformly filled with the insulating material 15, and a quantity of injection of the insulating material 15 can be minimized.

In addition, the void phenomenon that occurs in the surface of the insulating material 15 when the insulating material 15 is foamed and the insulating material 15 is hardened in the space between the inner case 11 and the outer case 13 due to surface friction can be prevented, and the quantity of injection of the insulating material 15 can be minimized so that the insulating material 15 is not exposed to the outside and the working time can also be reduced.

Figure 45:
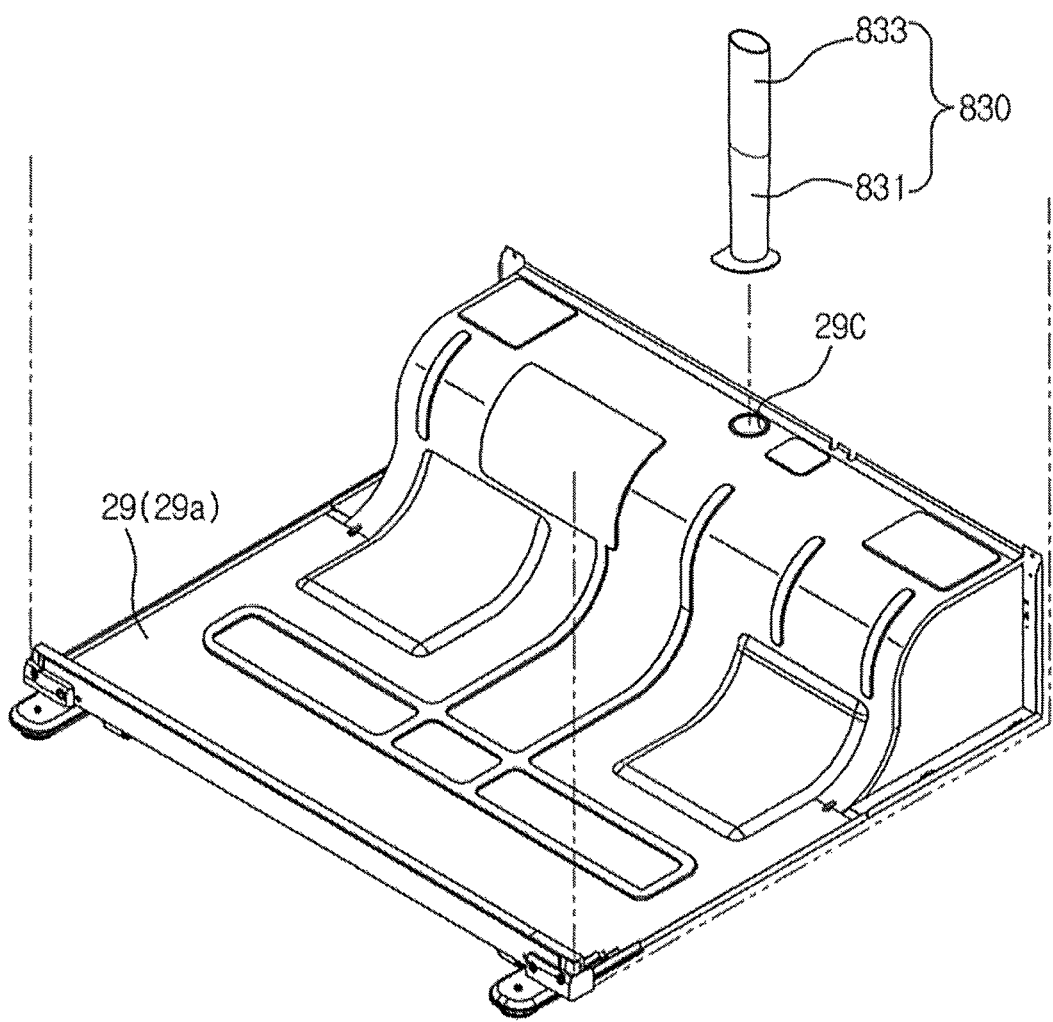
FIG. 45 is a view of a state in which a guide member according to another embodiment of FIG. 44 is coupled to the insulating material inlet disposed in the machine compartment cover.

As illustrated in FIG. 45, a guide member 830 may be provided by forming a connector 831 and a guide pipe 833 as an integral body and may be coupled to the insulating material inlet 29*c*.

Except the connector 831 and the guide pipe 833 are formed as an integral body, like the guide member 820 illustrated in FIG. 4, the guide pipe 833 is formed as a hollow, straight pipe and thus, a description thereof will be omitted.

Figure 46:
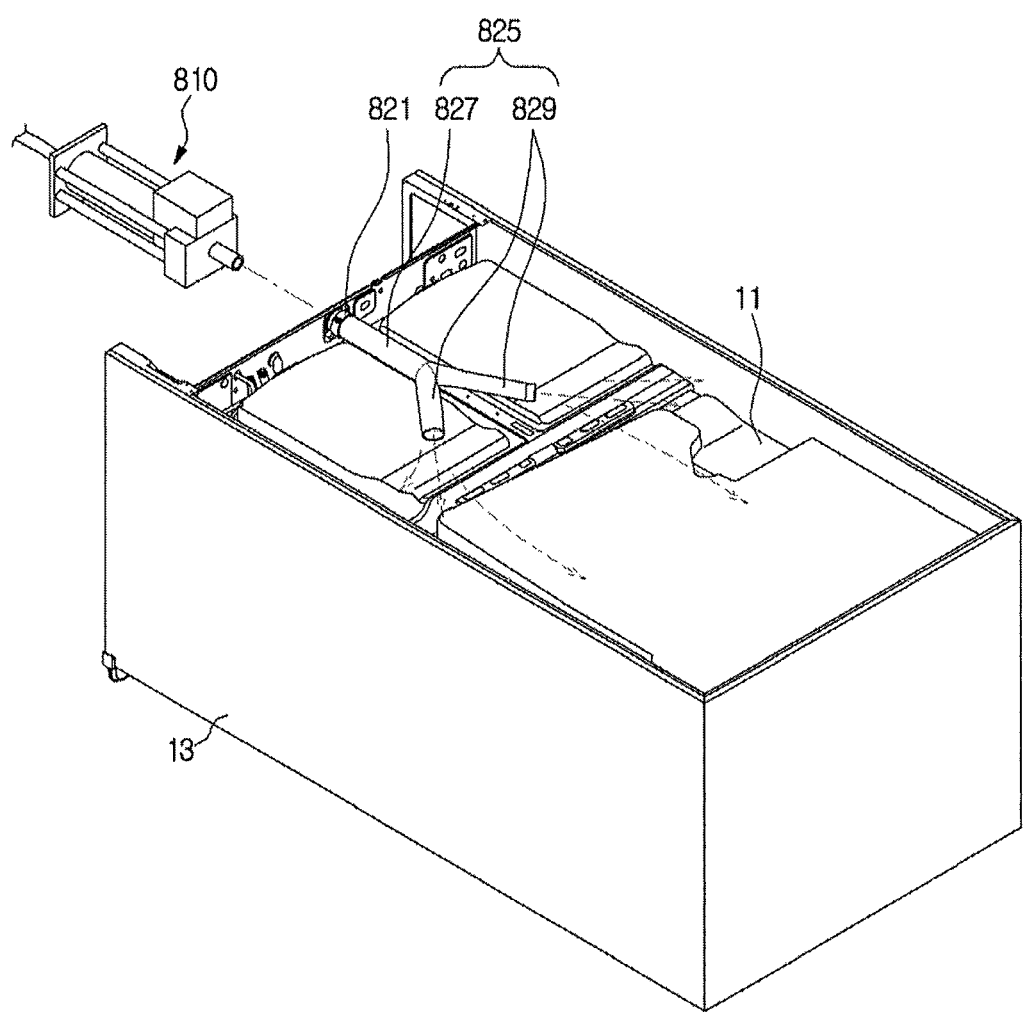
FIG. 46 is a view of a state in which a Y-shaped guide member is disposed at the refrigerator according to an embodiment.
Figure 47:
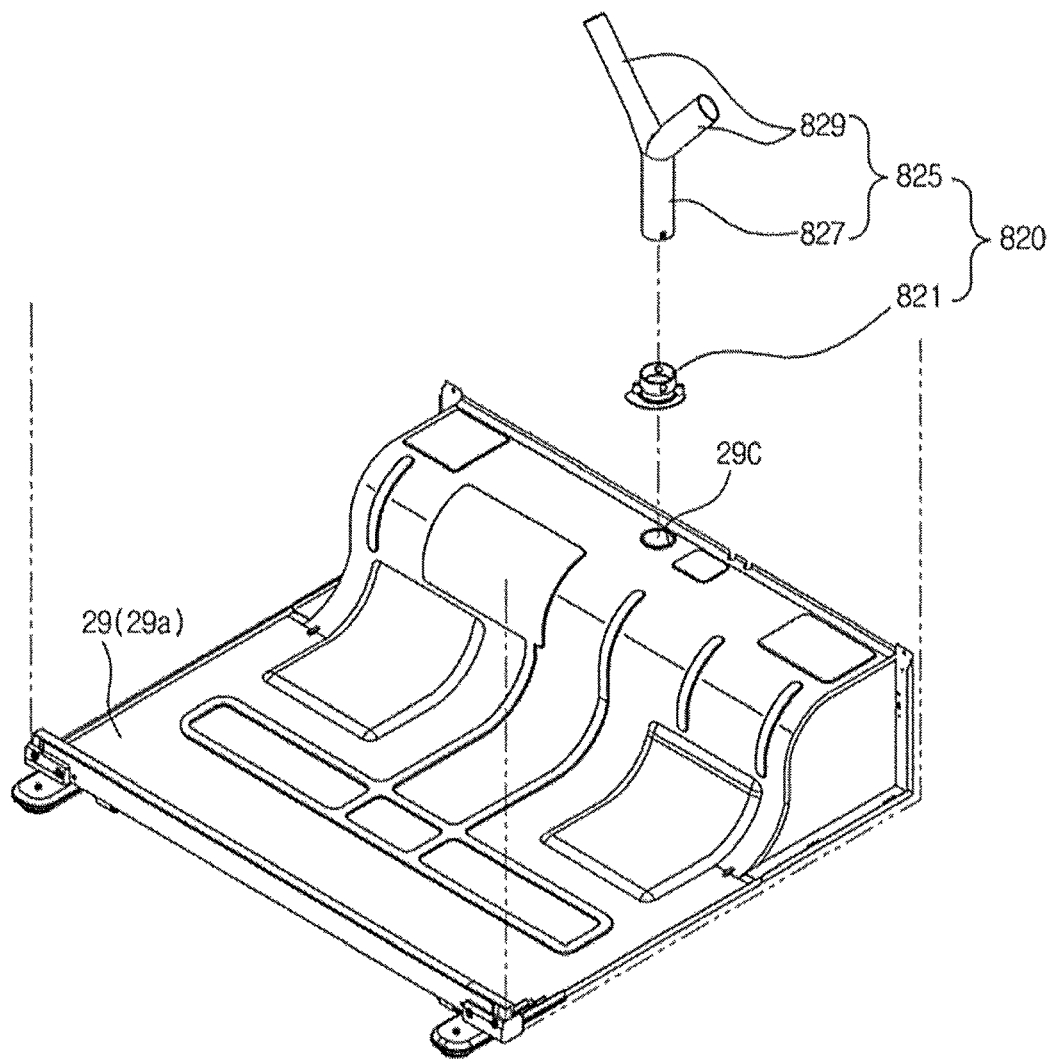
FIG. 47 is a view of a state in which the Y-shaped guide member of FIG. 46 is coupled to the insulating material inlet disposed in the machine compartment cover.

As illustrated in FIGS. 46 and 47, a guide pipe 825 may include a first guide pipe 827 that is formed as a hollow, straight pipe and is connected to the connector 821 and a second guide pipe 829 diverged from the first guide pipe 827.

The second guide pipe 829 causes the insulating material 15 that passes through the first guide pipe 827 to be diverged in two directions and dispersed so that the entire space between the inner case 11 and the outer case 13 can be effectively filled.

The guide pipe 825 including the first guide pipe 827 and the second guide pipe 829 has an overall hollow, Y shape.

Figure 48:
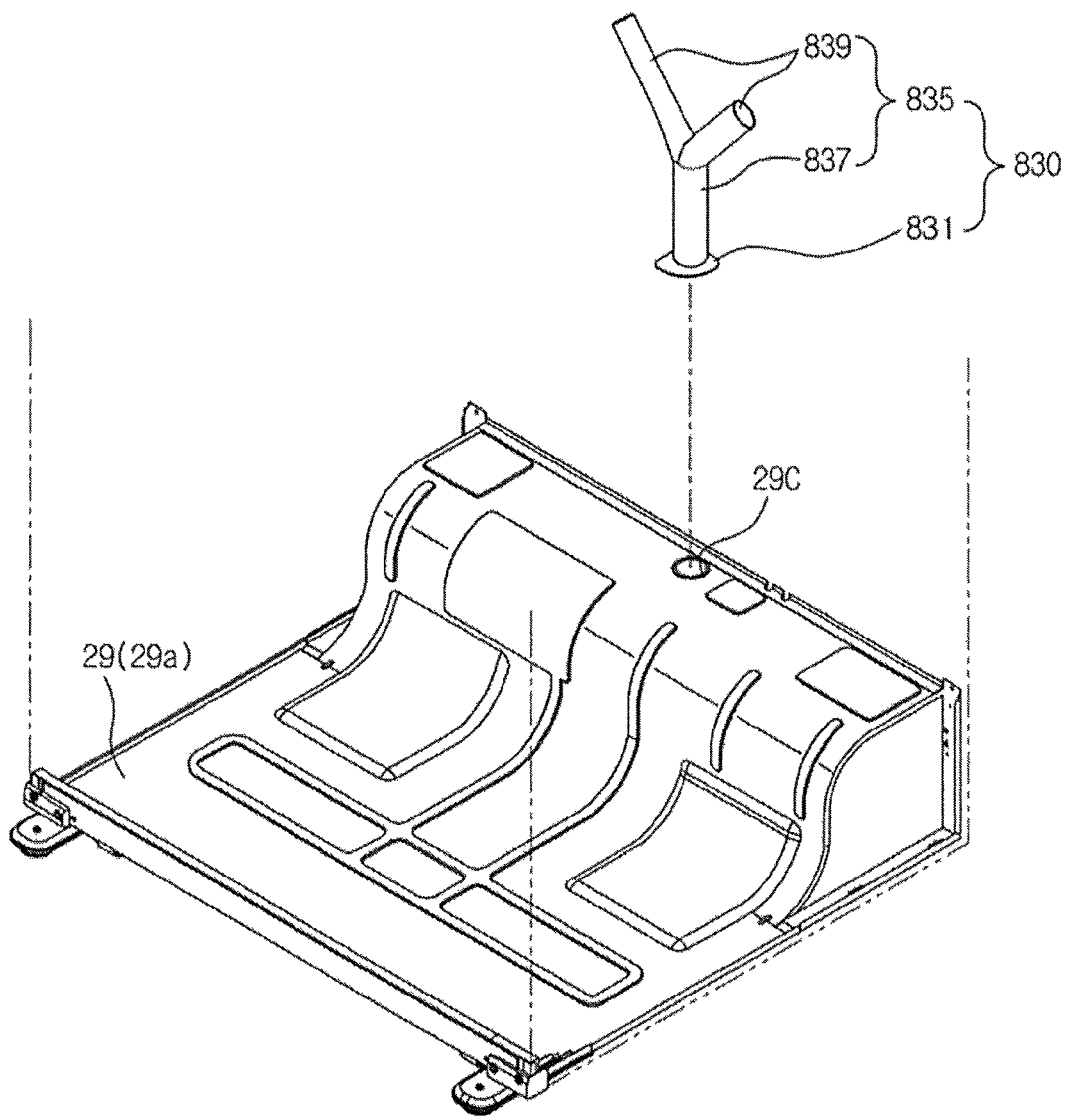
FIG. 48 is a view of a state in which a guide member according to another embodiment of FIG. 47 is coupled to the insulating material inlet disposed in the machine compartment cover.

As illustrated in FIG. 48, the guide member 830 may be disposed by forming the connector 831 and a guide pipe 835 as an integral body and may be coupled to the insulating material inlet 29*c* and the guide pipe 835 may be disposed to have a hollow, Y shape.

The guide pipe 835 may be formed as a hollow, straight pipe, like the guide pipe 825 illustrated in FIG. 46. The guide pipe 835 may include a first guide pipe 837 connected to the connector 831 and a second guide pipe 839 diverged from the first guide pipe 837.

Figure 49:
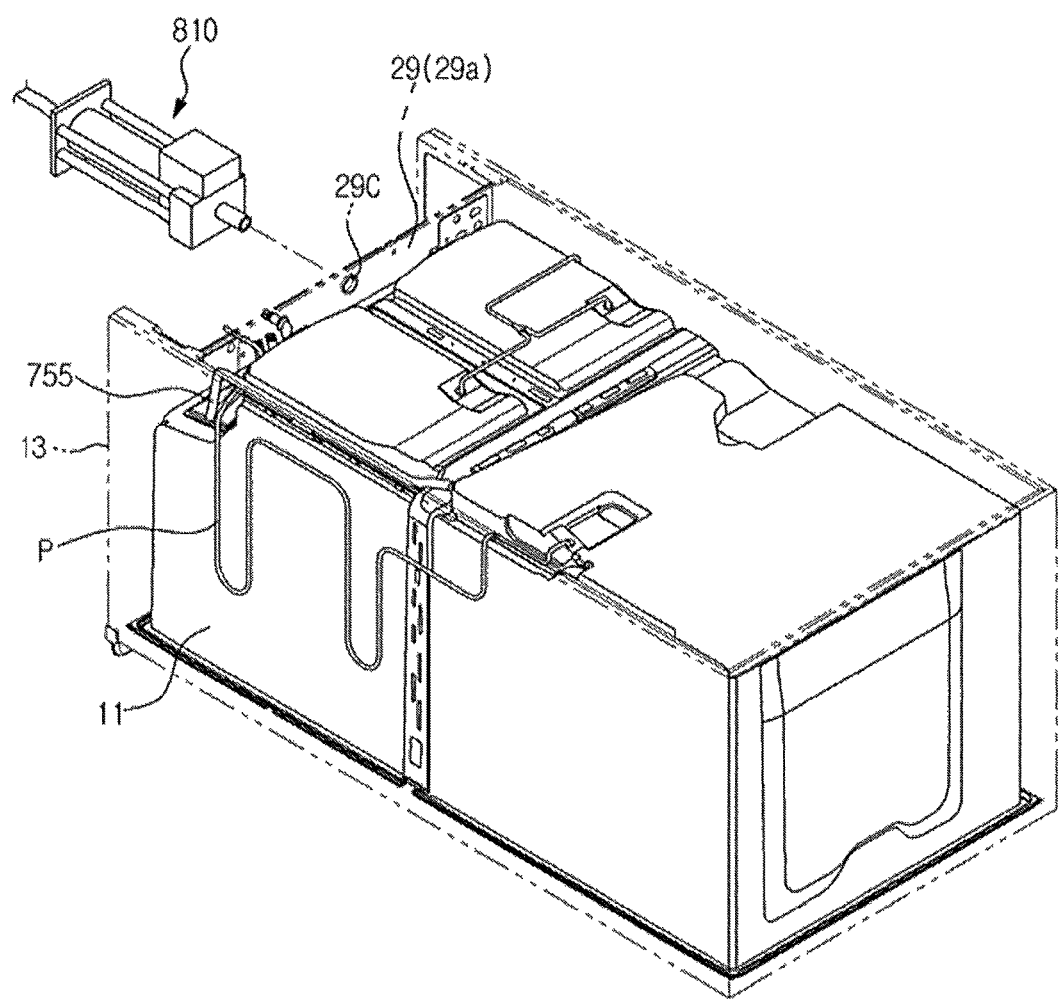
FIG. 49 is a view of a state in which a refrigerant pipe and a drainage pipe according to an embodiment are disposed at a side of the body.

As described above, when the insulating material 15 is foamed in the space between the inner case 11 and the outer case 13, the guide members 820 and 830 may be used so that the flow of the insulating material 15 is not disturbed. However, instead of using the guide members 820 and 830, as illustrated in FIG. 49, the drainage pipe 755 for draining the condensed water generated in the refrigerant pipe P through which the refrigerant flows or in the first evaporator E1 to the outside of the body 10 is disposed between the inner case 11 and the outer case 13 of the side of the body 10 so that the flow of the insulating material 15 cannot be disturbed when the insulating material 15 is foamed in the space between the inner case 11 and the outer case 13 of the rear side of the body 10.

As described above, according to one or more embodiments, even when a thickness of the insulating material is reduced, rigidity can be maintained using a reinforcement structure so that deformation of a body can be reduced.

In addition, an electric apparatus box is disposed in a hinge cover so that spatial utility can be improved. A fire that breaks out in the electric apparatus box can be prevented from being spread toward an outside of the electric apparatus box.

Furthermore, a heating pipe is disposed adjacent to an outer case so that dew condensation that occurs in an outer surface of the outer case can be prevented, and the heating pipe can be easily fixed to the inner case.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A refrigerator comprising:
   an inner case including a storage compartment;
   an outer case;
   an insulating material provided between the inner case and the outer case; and
   an electric apparatus box provided in the outer case and including:
      a base provided to cover the insulating material and connected to the outer case, the base including an accommodation groove recessed into the insulating material,
      a cover provided to form an exterior surface of the refrigerator and cover the base to form an accommodation space between the base and the cover,
      a printed circuit board (PCB) mounting portion coupled to the base,
      a PCB coupled to the PCB mounting portion and provided in the accommodation space between the base and the PCB mounting portion; and
      a reinforcement plate formed of a steel material between the cover and the PCB mounting portion,
   wherein an upper surface of the PCB is mounted on a lower surface of the PCB mounting portion, and
   the PCB is disposed in the accommodation space while being spaced apart from the storage compartment.

2. The refrigerator of claim 1, wherein the base includes a base portion coupled to the outer case and the accommodation groove is accommodated in an electric apparatus box installation hole provided in the outer case.

3. The refrigerator of claim 2, wherein the accommodation groove has a rectangular shape that is recessed downward from the base portion, and the base portion forms edges of the accommodation groove.

4. The refrigerator of claim 3, wherein the accommodation groove is recessed downward with respect to an upper surface of the outer case, so that a height of the accommodation space is greater than a distance between an upper surface of the cover and an upper surface of the outer case.

5. The refrigerator of claim 3, further comprising:
a plurality of fixing hooks provided at a front edge of the base portion and a rear edge of the base portion that form the edges of the accommodation groove, and
a wire through hole disposed in the base portion and through which wires connected to the PCB are connected to an inside of the outer case.

6. The refrigerator of claim 5, wherein the plurality of fixing hooks include a plurality of first fixing hooks disposed at the front edge of the base portion and a plurality of second fixing hooks disposed at the rear edge of the base portion.

7. The refrigerator of claim 6, wherein the plurality of first fixing hooks are inserted into and fixed to an upper reinforcement frame coupled to an upper portion of a front side of the inner case to reinforce the body, and the plurality of second fixing hooks are inserted into and fixed to a rear edge of the electric apparatus box installation hole.

8. The refrigerator of claim 7, wherein the plurality of first fixing hooks and the plurality of second fixing hooks are inserted into and fixed to the upper reinforcement frame and the rear edge of the electric apparatus box installation hole, respectively, thereby securing the base to the outer case.

9. The refrigerator of claim 8, wherein the cover includes a hinge cover portion covering an upper portion of an upper hinge coupled to the upper portion of the outer case such that a door is rotatably coupled to the body.

10. The refrigerator of claim 9, further comprising:
a connector coupling portion disposed at sides of the PCB mounting portion; and
a wire connector to which the wires are fixed, coupled to the connector coupling portion.

11. The refrigerator of claim 10, wherein the wires connected to the PCB are agglomerated and are fixed using the wire connector, and the wires passing through the wire through hole are connected to the inside of the outer case through a hinge hole of the upper hinge.

12. The refrigerator of claim 1, wherein the reinforcement plate reduces a shock transferred to the PCB when the shock is applied to the electric apparatus box.

13. The refrigerator of claim 12, wherein the reinforcement plate is provided to prevent fire from being spread toward an outside of the electric apparatus box when the fire breaks out in the electronic component inside the electric apparatus box.

* * * * *